(12) United States Patent
Nagai et al.

(10) Patent No.: US 7,598,557 B2
(45) Date of Patent: Oct. 6, 2009

(54) SEMICONDUCTOR DEVICE AND METHOD FOR FABRICATING A SEMICONDUTOR DEVICE INCLUDING FIRST AND SECOND HYDROGEN DIFFUSION PREVENTING FILMS

(75) Inventors: Kouichi Nagai, Kawasaki (JP); Hideaki Kikuchi, Kawasaki (JP); Naoya Sashida, Kawasaki (JP); Yasutaka Ozaki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 291 days.

(21) Appl. No.: 11/051,643

(22) Filed: Jan. 27, 2005

(65) Prior Publication Data

US 2005/0285173 A1    Dec. 29, 2005

(30) Foreign Application Priority Data

Jun. 28, 2004    (JP) .............................. 2004-189365
Nov. 15, 2004    (JP) .............................. 2004-330438

(51) Int. Cl.
*H01L 27/108*    (2006.01)

(52) U.S. Cl. .............................. 257/296; 257/E27.071; 438/210; 438/643

(58) Field of Classification Search ...................... 438/3, 438/197, 210, 240, 622–688, 393, 396; 257/369, 257/68, 69, 295, 300, 758, 760, E27.071, 257/E29.001, E29.342, E27.009, E27.046, 257/E27.048
See application file for complete search history.

(56) References Cited

U.S. PATENT DOCUMENTS 6,570,203 B2 *   5/2003   Hikosaka et al. ............. 257/295
6,740,531 B2 *   5/2004   Cho et al. ...................... 438/3
7,064,366 B2 *   6/2006   Kang et al. .................. 257/295
7,190,015 B2 *   3/2007   Natori et al. ................. 257/306

(Continued)

FOREIGN PATENT DOCUMENTS

JP         2000-164817         6/2000

(Continued)

OTHER PUBLICATIONS

Korean Official Communication dated Apr. 20, 2006.

*Primary Examiner*—Khiem D Nguyen
(74) *Attorney, Agent, or Firm*—Westerman, Hattori, Daniels & Adrian, LLP.

(57) ABSTRACT

The semiconductor device comprises a first insulation film 26 formed over a semiconductor substrate 10, first conductor plug 32 buried in a first contact hole 28a formed down to a source/drain diffused layer 22, a capacitor 44 formed over the first insulation film 26, a first hydrogen diffusion preventing film 48 formed over the first insulation film 26, covering the capacitor 44, a second insulation film 50 formed over the first hydrogen diffusion preventing film and having the surface planarized, a second hydrogen diffusion preventing film 52 formed over the first hydrogen diffusion preventing film 26 and having the surface planarized, a second hydrogen diffusion preventing film 52 formed over the second insulation film 50, second conductor plug 62 buried in a second contact hole 56 formed down to the lower electrode 38 or the upper electrode 42 of the capacitor 44, a third conductor plug 62 buried in a third contact hole 58 formed down to the first conductor plug 32, and an interconnection 64 connected to the second conductor plug 62 or the third conductor plug 62.

24 Claims, 39 Drawing Sheets

U.S. PATENT DOCUMENTS

2003/0089954 A1 * 5/2003 Sashida .................. 257/369

FOREIGN PATENT DOCUMENTS

| JP | 3114710 | 9/2000 |
|---|---|---|
| JP | 2002-176149 | 6/2002 |
| JP | 2003-100994 | 4/2003 |
| JP | 2003-152165 | 5/2003 |
| JP | 2003-197878 | 7/2003 |
| JP | 2003-229542 | 8/2003 |
| KR | 2003-0039991 | 5/2003 |

* cited by examiner

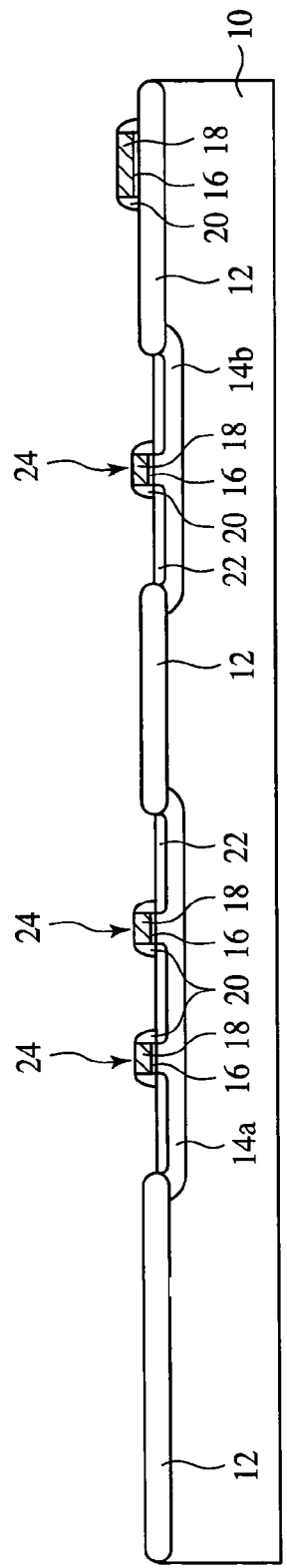
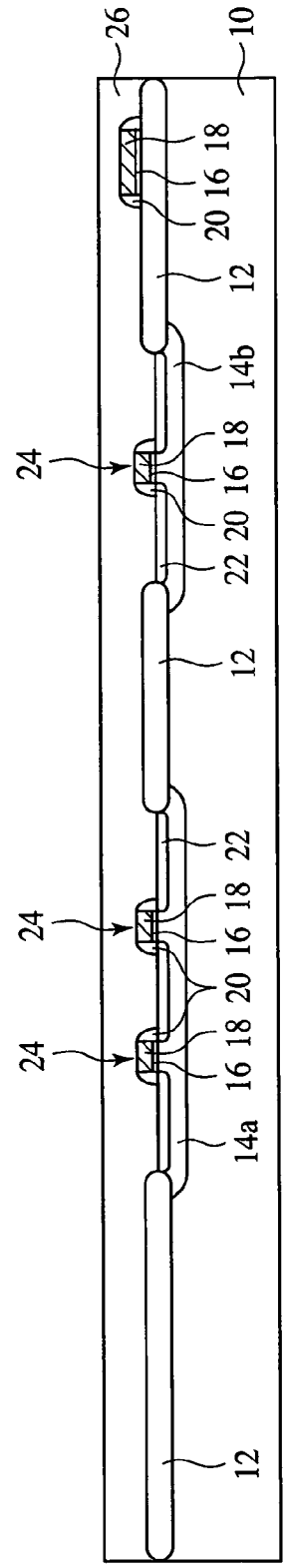
FIG. 6A
FIG. 6B

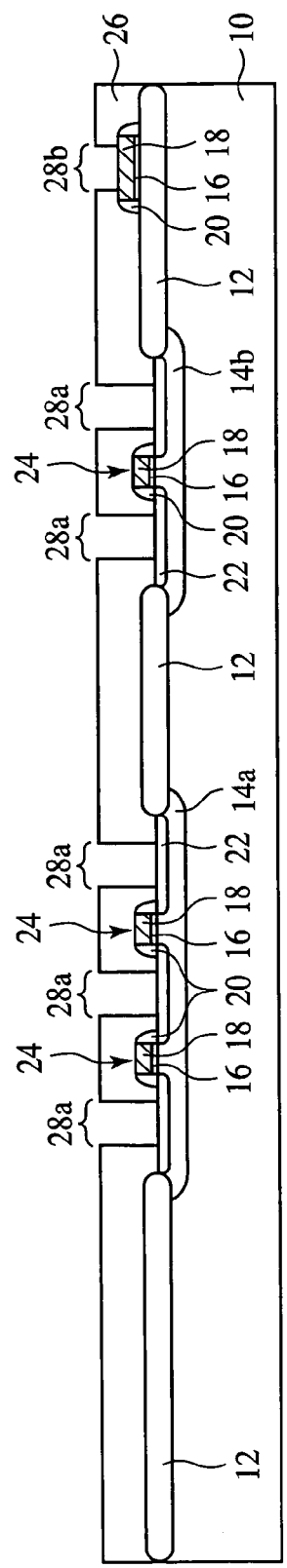
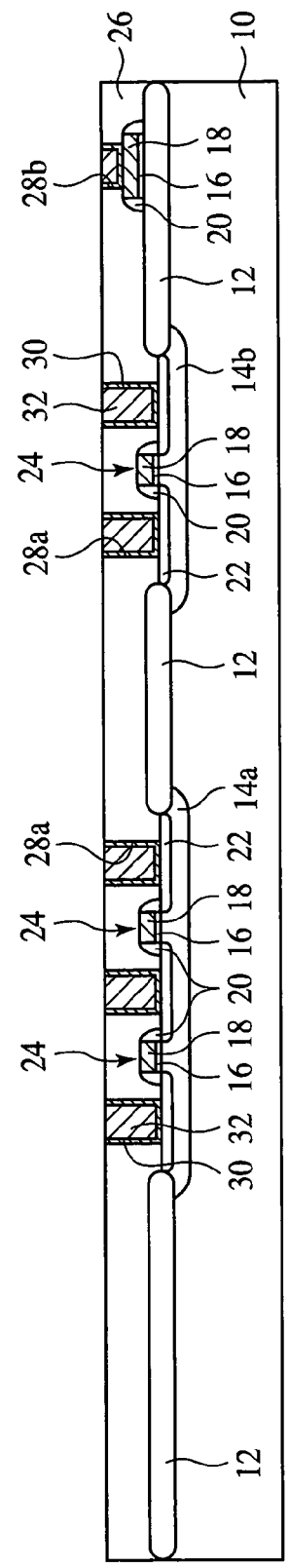
FIG. 7A
FIG. 7B

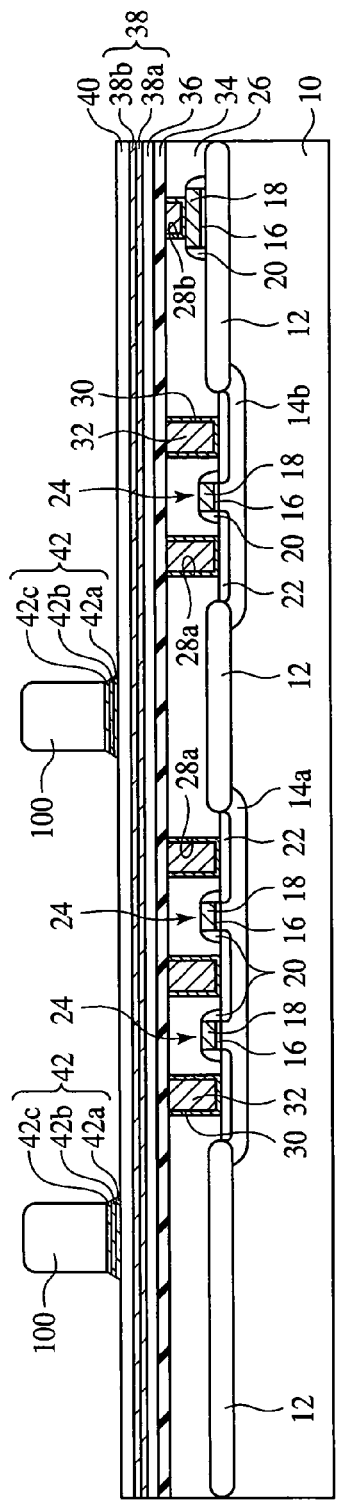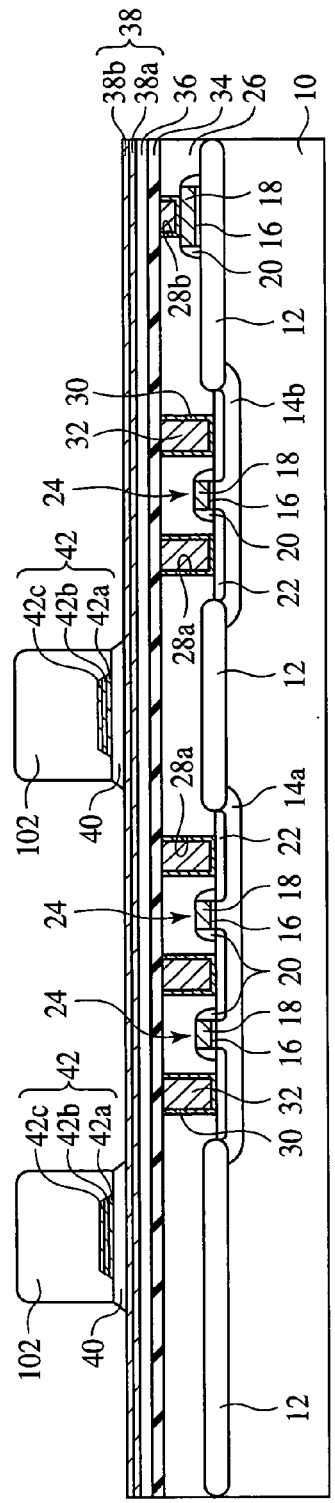

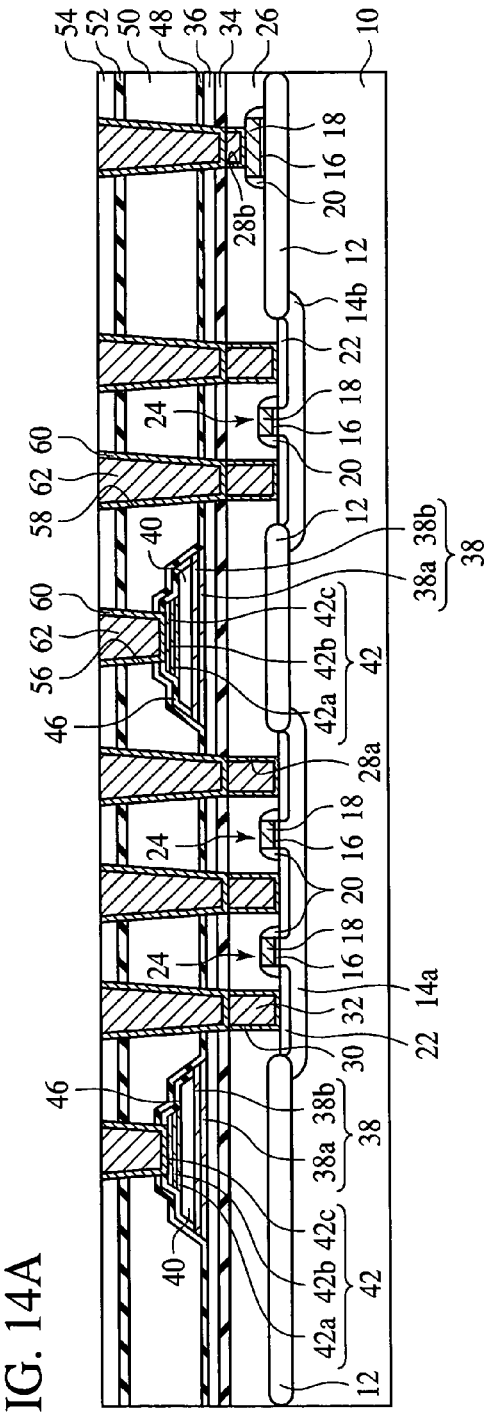
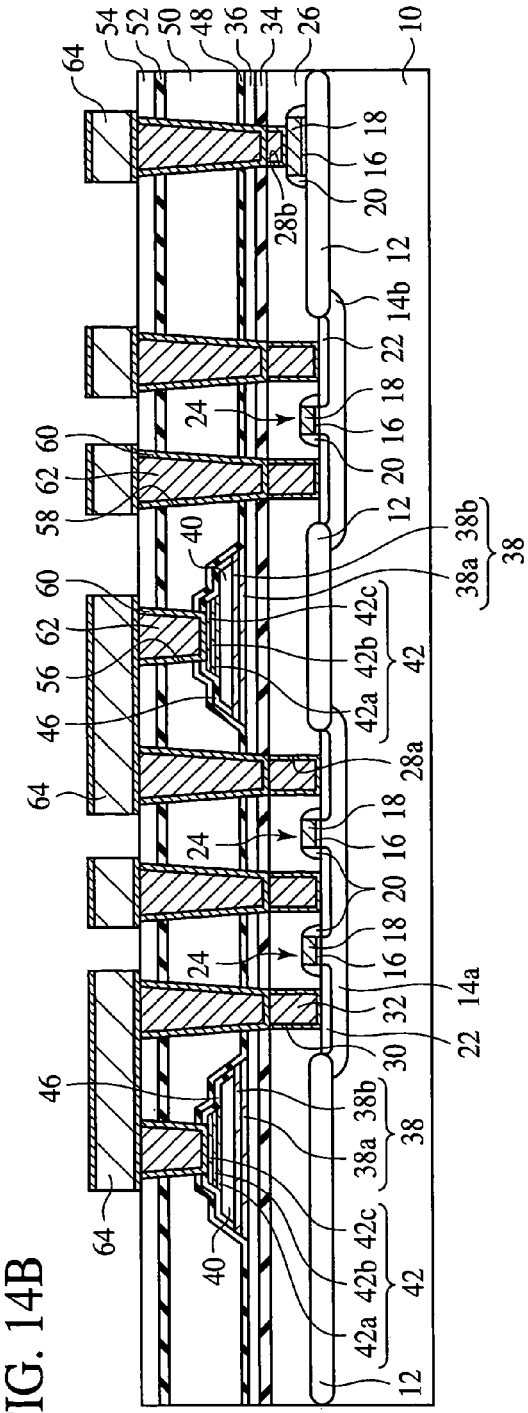
FIG. 14A
FIG. 14B

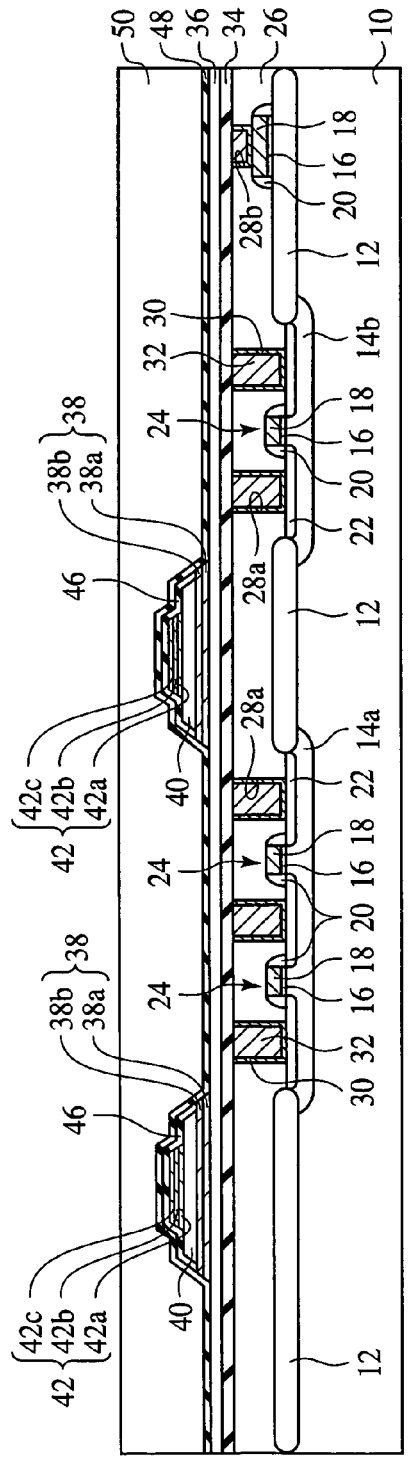
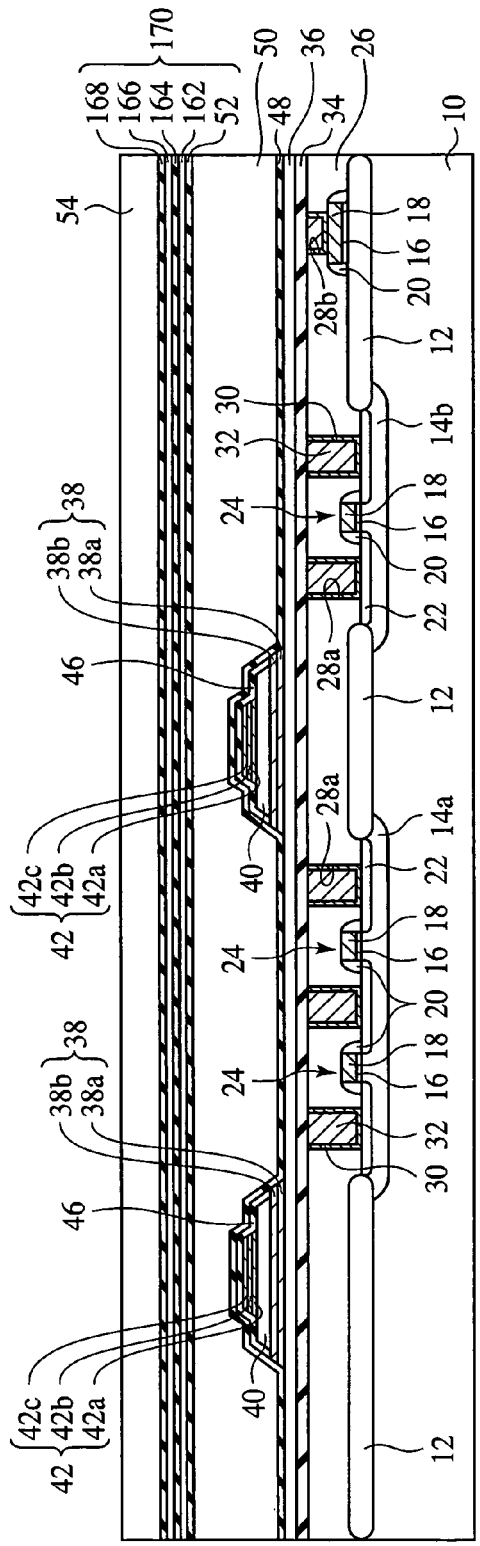
FIG. 36A
FIG. 36B

SEMICONDUCTOR DEVICE AND METHOD FOR FABRICATING A SEMICONDUTOR DEVICE INCLUDING FIRST AND SECOND HYDROGEN DIFFUSION PREVENTING FILMS

CROSS-REFERENCE TO RELATED APPLICATION

This application is based upon and claims priority of Japanese Patent Application No. 2004-189365, filed on Jun. 28, 2004, and Japanese Patent Application No. 2004-330438, filed on Nov. 15, 2004, the contents being incorporated herein by reference.

BACKGROUND OF THE INVENTION

The present invention relates to a semiconductor device and a method for fabricating the semiconductor device, more specifically, a semiconductor device including a capacitor using as the dielectric film, a high-dielectric constant substance or a ferroelectric substance, and a method for fabricating the semiconductor device.

Recently, as the dielectric films of capacitors, the use of high-dielectric constant substances or ferroelectric substances is noted.

However, in simply using high-dielectric constant substances and ferroelectric substances as the dielectric films of capacitors, the oxygen in the dielectric films is often reduced with hydrogen in later steps after the dielectric films have been formed, and the capacitors cannot have often good electric characteristics. The oxygen in the dielectric films is reduced with hydrogen when the water contained in the inter-layer insulation films, etc. arrives at the capacitors, and the capacitor cannot have good electric characteristics.

As technique of preventing the deterioration of the dielectric films with the hydrogen and the water, the technique of forming an aluminum oxide film, covering the capacitor, and the technique of forming an aluminum oxide film on the inter-layer insulation films formed on the capacitors are proposed. Aluminum oxide film has the function of preventing the diffusion of hydrogen and water. Accordingly, the proposed techniques can prohibit the hydrogen and water from arriving at the dielectric film, whereby the deterioration of the dielectric film with the hydrogen and the water can be prevented. These techniques are proposed in, e.g., Patent References 1 and 2.

Following references disclose the background art of the present invention.

[Patent Reference 1]

Specification of Japanese Patent Application Unexamined Publication No. 2002-176149

[Patent Reference 2]

Specification of Japanese Patent Application Unexamined Publication No. 2003-197878

[Patent Reference 3]

Specification of Japanese Patent Application Unexamined Publication No. 2003-100994

[Patent Reference 4]

Specification of Japanese Patent No. 3114710

[Patent Reference 5]

Specification of Japanese Patent Application Unexamined Publication No. 2003-229542

However, in simply forming an aluminum oxide film, it is difficult to securely prevent the deterioration of the dielectric film with the hydrogen and the water. The deterioration of the dielectric film with the hydrogen and the water lowers the fabrication yield.

SUMMARY OF THE INVENTION

An object of the present invention is to provide a semiconductor device including a capacitor and having high reliability, which can be fabricated with high yields, and a method for fabricating the semiconductor device.

According to one aspect of the present invention, there is provided a semiconductor device comprising: a transistor including a gate electrode formed over a semiconductor substrate with a gate insulation film formed therebetween, and a source/drain diffused layer formed in the semiconductor substrate on both sides of the gate electrode; a first insulation film formed over the semiconductor substrate and the transistor; a first conductor plug buried in first contact hole formed down to the source/drain diffused layer; a capacitor formed over the first insulation film and including a lower electrode, a dielectric film formed over the lower electrode and an upper electrode formed over the dielectric film; a first hydrogen diffusion preventing film formed over the first insulation film, covering the capacitor, for preventing the diffusion of hydrogen; a second insulation film formed over the fist hydrogen diffusion preventing film, a surface of the second insulation film being planarized; a second hydrogen diffusion preventing film formed over the second insulation film, for preventing the diffusion of hydrogen; a second conductor plug buried in a second contact hole formed down to the lower electrode or the upper electrode; a third conductor plug buried in a third contact hole formed down to the first conductor plug; and an interconnection formed over the second hydrogen diffusion preventing film and connected to the second conductor plug or the third conductor plug.

According to another aspect of the present invention, there is provided a method for fabricating a semiconductor device comprising the steps of: forming a gate electrode over a semiconductor device with a gate insulation film therebetween; forming a source/drain diffused layer in the semiconductor substrate on both sides of the gate electrode; forming a first insulation film over the semiconductor substrate, the gate electrode and the source/drain diffused layer; forming first contact hole in the first insulation film down to the source/drain diffused layer; burying first conductor plug in the first contact hole; forming over the first insulation film a capacitor including a lower electrode, a dielectric film formed over the lower electrode and an upper electrode formed over the dielectric film; forming a first hydrogen diffusion preventing film for preventing the diffusion of hydrogen over the first insulation film and the capacitor; forming a second insulation film over the first hydrogen diffusion preventing film; polishing a surface of the second insulation film to planarize the surface of the second insulation film; forming a second hydrogen diffusion preventing film for preventing the diffusion of hydrogen over the second insulation film; forming second contact hole in the first hydrogen diffusion preventing film, the second insulation film and the second hydrogen diffusion preventing film down to the lower electrode or the upper electrode; forming third contact hole in the first hydrogen diffusion preventing film, the second insulation film and the second hydrogen diffusion preventing film down to the first conductor plug; burying second conductor plug in the second contact hole and third conductor plug in the third contact hole; and forming an interconnection over the second hydrogen diffusion preventing film in contact with the second conductor plug or the third conductor plug.

According to further another aspect of the present invention, there is provided a semiconductor device comprising: a capacitor formed over a semiconductor substrate and including a lower electrode, a dielectric film formed over the lower electrode and an upper electrode formed over the dielectric film; an insulation film formed over the semiconductor substrate and the capacitor, a surface of the insulation film being planarized; a flat barrier film formed over the insulation film, for preventing the diffusion of hydrogen and water, the barrier film including a first film for preventing the diffusion of hydrogen and water and a second film for mitigating a stress due to the first film.

According to further another aspect of the present invention, there is provided a method for fabricating a semiconductor device comprising: a step of forming on a semiconductor substrate a capacitor including a lower electrode, dielectric film formed on the lower electrode and an upper electrode formed on the dielectric film; a step of forming an insulation film on the semiconductor substrate and the capacitor; the step of polishing a surface of the insulation film to planarize the surface of the insulation film; and a step of forming over the insulation film a barrier film for preventing the diffusion of hydrogen and water, the step of forming a barrier film including a step of forming a first film for preventing the diffusion of hydrogen and water and a step of forming a second film for mitigating a stress due to the first film.

According to further another aspect of the present invention, there is provided a semiconductor device comprising: a capacitor formed on a semiconductor substrate and including a lower electrode, a dielectric film formed over the lower electrode and an upper electrode formed over the dielectric film; an insulation film formed over the semiconductor substrate and the capacitor, a surface of the insulation film being planarized; and a flat barrier film formed over the insulation film, for preventing the diffusion of hydrogen and water, the barrier film being formed of a plurality of first films for preventing the diffusion of hydrogen and water, which are laid one on another with a second film of a dielectric substance.

According to further another aspect of the present invention, there is provided a method for fabricating a semiconductor device comprising: a step of forming over a semiconductor substrate a capacitor including a lower electrode, a dielectric film formed over the lower electrode and an upper electrode formed over the dielectric film; a step of forming an insulation film over the semiconductor substrate and the capacitor; the step of polishing a surface of the insulation film to planarize the surface of the insulation film; and a step of forming over the insulation film a flat barrier film for preventing the diffusion of hydrogen and water, in the step of forming a barrier film, a plurality of first films for preventing the diffusion of hydrogen and water are laid one on another with a second film of a dielectric substance formed therebetween.

According to the present invention, the second hydrogen diffusion preventing film is formed on the planarized second insulation film, and the second hydrogen diffusion preventing film is accordingly flat. The flat hydrogen diffusion preventing film has good coverage and can barrier the hydrogen, etc. without failure. Thus the present invention can prevent the arrival of the hydrogen, etc. at the dielectric film of the capacitors without failure, and the reduction of the metal oxide forming the dielectric film of the capacitors with the hydrogen can be prevented. Furthermore, according to the present invention, with the first conductor plugs connected to the source/drain diffused layer buried in the first insulation film, the third conductor plugs to be connected to the first conductor plugs are buried in the second insulation film, whereby even in forming the second hydrogen diffusion preventing film on the second insulation film and below the interconnection, the interconnection and the source/drain diffused layer can be electrically connected with each other without damaging the source/drain diffused layer. Thus, according to the present invention, the semiconductor device of high reliability including capacitors can be provided with high yields.

According to the present invention, the barrier film is formed of the first film for preventing the diffusion of the hydrogen and the water, and the second film for mitigating the stress due to the first film laid one on another, whereby the stress due to the barrier film can be made small, and the application of large stresses to the capacitor can be prevented. According to the present invention, the decrease of the switching charge quantity $Q_{SW}$ of the capacitor is surely prevented while the arrival of the hydrogen and the water at the capacitor can be prevented. Thus, according to the present invention, the semiconductor device including capacitors having good electric characteristics can be provided with high yields.

According to the present invention, the barrier film is formed of a plurality of the first films for preventing the diffusion of the hydrogen and the water which are laid one on another with the second film of a dielectric substance formed there between, whereby the diffusion of the hydrogen and the water can be surely prevented. Furthermore, according to the present invention, the first films, which are relatively thin, are laid one on another with the second film formed therebetween, whereby the stress due to the barrier film can be made relatively small with the total film thickness of the first films made thick. Thus, according to the present invention, the arrival of the hydrogen and the water at the capacitors can be surely prevented while the decrease of the switching charge quantity $Q_{SW}$ of the capacitors can be prevented.

BRIEF DESCRIPTION OF THE DRAWINGS

FIGS. 6A and 6B are sectional views of the semiconductor device according to the first embodiment of the present invention in the steps of the method for fabricating the semiconductor device, which illustrate the method (Part 2).

FIGS. 7A and 7B are sectional views of the semiconductor device according to the first embodiment of the present invention in the steps of the method for fabricating the semiconductor device, which illustrate the method (Part 3).

FIGS. 9A and 9B are sectional views of the semiconductor device according to the first embodiment of the present invention in the steps of the method for fabricating the semiconductor device, which illustrate the method (Part 5).

FIGS. 14A and 14B are sectional views of the semiconductor device according to the first embodiment of the present invention in the steps of the method for fabricating the semiconductor device, which illustrate the method (Part 10).

FIGS. 36A and 36B are sectional views of the semiconductor device according to the third embodiment of the present invention in the steps of the method for fabricating the semiconductor device, which illustrate the method (Part 1).

DETAILED DESCRIPTION OF THE INVENTION

A First Embodiment

The semiconductor device according to a first embodiment of the present invention and the method for fabricating the semiconductor device will be explained with reference to FIGS. 1 to 22.

(The Semiconductor Device)

Figure 1:
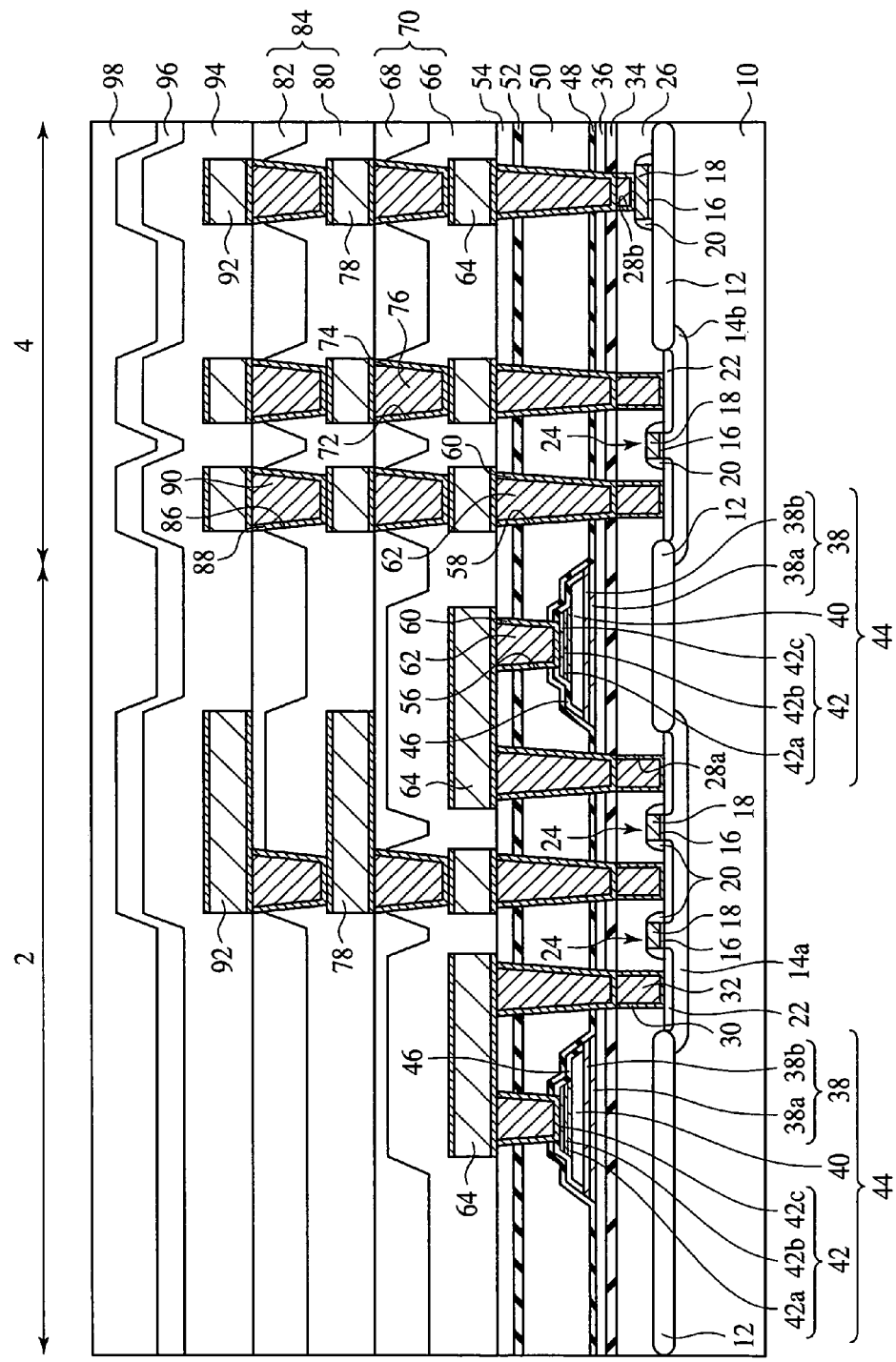
FIG. 1 is a sectional view of the semiconductor device according to a first embodiment of the present invention.

First, the semiconductor device according to the present embodiment will be explained with reference to FIGS. 1 to 4. FIG. 1 is a sectional view of the semiconductor device according to the present embodiment. In FIG. 1, the memory cell region 2 is illustrated on the left side of the drawing, and on the right side of the drawing, the peripheral circuit region 4 is illustrated.

As illustrated in FIG. 1, device isolation regions 12 defining device regions are formed on a semiconductor substrate 10 of, e.g., silicon. Wells 14a, 14b are formed in the semiconductor substrate 10 with the device isolation regions 12 formed on.

Gate electrodes (gate lines) 18 are formed on the semiconductor substrate 10 with the wells 14a, 14b formed in with a gate insulation film 16 formed therebetween. A sidewall insulation film 20 is formed on the side walls of the gate electrodes 18.

On both sides of each gate electrode 18 with the sidewall insulation film 20 formed on, a source/drain diffused layer 22 is formed. Thus, transistors 24 each including the gate electrode 18 and the source/drain diffused layer 22 are formed.

An inter-layer insulation film 26 is formed on the semiconductor substrate 10 with the transistors 24 formed on. The surface of the inter-layer insulation film 26 is planarized.

Contact holes 28a are formed in the inter-layer insulation film 26 down to the source/drain diffused layer 22. A contact hole 28b is formed in the inter-layer insulation film 26 down to the gate line (gate electrode) 18.

A Ti film of, e.g., a 20-60 nm-thickness is formed in the contact holes 28a, 28b. A TiN film of, e.g., a 30-50 nm-thickness is formed in the contact holes with the Ti film formed in. The Ti film and the TiN film form a barrier metal film 30.

Conductor plugs 32 of tungsten (W) are buried in the contact holes 28a, 28b with the barrier metal film 30 formed in.

On the inter-layer insulation film 26 with the conductor plugs 32 buried in, an SiON film 34 of, e.g., a 100 nm-thickness is formed. The SiON film 34 is for preventing the surfaces of the conductor plugs 32 which have been buried in from being oxidized.

As an oxidation preventing film 34, SiON, for example, SiON film is formed. However, the oxidation preventing film 34 is not essentially SiON film. For example, Silicon oxide film may be used as the oxidation preventing film 34.

A silicon oxide film 36 of, e.g., a 130 nm-thickness is formed on the oxidation preventing film 34.

On the silicon oxide film 36, lower electrodes 38 of the capacitors 44 are formed. The lower electrodes 38 are formed of the layer film including, e.g., an aluminum oxide film 38a of a 20-100 nm-thickness and Pt film 38b of a 100-300 nm-thickness laid sequentially the latter on the former. The film thickness of the Pt film 38b is set at 175 nm.

On the lower electrodes 38, a dielectric film 40 of the capacitors 44 are formed. The dielectric film 40 is formed of a ferroelectric film of, e.g., a 150 nm-thickness. As the ferroelectric film, $PbZr_{1-X}Ti_XO_3$ film (PZT film), for example, is used.

On the dielectric film 40, upper electrodes 42 of the capacitors 44 are formed. The upper electrodes 42 are formed of the layer film, e.g., of a 10-100 nm-thickness $IrO_X$ film 42a, a 100-300 nm-thickness $IrO_Y$ film 42b and a 20-100 nm-thickness Pt film 42c laid sequentially the latter on the former. The film thickness of the $IrO_Y$ film 42b is set at 50 nm. The film thickness of the Pt film 42c is set at 75 nm. The composition ratio Y of oxygen of the $IrO_Y$ film 42b is set higher than the composition ratio X of oxygen of the $IrO_X$ film 42a.

The Pt film 42c is for lowering the contact resistance between the conductor plugs and the upper electrodes 42. The Pt film 42c may not be formed when it is not necessary to make the contact resistance between the conductor plugs and the upper electrodes 42.

Thus, the capacitors 44 including the respective lower electrode 38, the dielectric film 40 and the upper electrode 42 are formed.

A hydrogen diffusion preventing film (barrier film) 46 is formed on the dielectric film 40 and the upper electrode 42, covering the upper surfaces and the side surfaces thereof. The hydrogen diffusion preventing film 46 is, e.g., aluminum oxide ($Al_2O_3$). The film thickness of the hydrogen diffusion preventing film 46 is set at, e.g., 20-150 nm. The hydrogen diffusion preventing film 46 has the function of preventing the diffusion of hydrogen. The hydrogen diffusion preventing film 46 has not only the function of preventing the diffusion of hydrogen, but also the function of preventing the diffusion of water. When hydrogen and water arrive at the dielectric film 40 of the capacitors 44, the metal oxide forming the dielectric film 40 is reduced with the hydrogen, and resultantly the electric characteristics of the capacitors 44 are degraded. The hydrogen diffusion preventing film 46 is formed, covering the upper surfaces and the side surfaces of the dielectric film 40 and the upper electrode 42, whereby the hydrogen and the water are kept from arriving at the dielectric film 40, and the degradation of the electric characteristics of the capacitors 44 can be suppressed.

A hydrogen diffusion preventing film 48 is formed on the capacitors 44 and the silicon oxide film 36 covered by the hydrogen diffusion preventing film 46. The hydrogen diffusion preventing film 48 is an aluminum oxide film of, e.g., a 20-50 nm-thickness.

The inter-layer insulation film 50 of a silicon oxide film of, e.g., a 1000 nm-thickness is formed on the hydrogen diffusion preventing film 48. The surface of the inter-layer insulation film 50 is planarized.

In the present embodiment, the inter-layer insulation film 50 is formed of silicon oxide film, but the material of the inter-layer insulation film 50 is not limited to silicon oxide film. For example, the inter-layer insulation film 50 may be suitably formed of a dielectric inorganic film.

On the silicon oxide film 50, a hydrogen diffusion preventing film (barrier film) 52 is formed. The hydrogen diffusion preventing film 52 is formed of, aluminum oxide film of, e.g., a 50-100 nm-thickness. The hydrogen diffusion preventing film 52 of aluminum oxide film has not only the function of preventing the diffusion of hydrogen, but also the function of preventing the diffusion of water. Since the hydrogen diffusion preventing film 52 is formed on the planarized silicon oxide film 50, the hydrogen diffusion preventing film 52 is accordingly flat.

The hydrogen diffusion preventing film 52 is formed in the form of a flat on the inter-layer insulation film 50 for the following reason.

That is, the hydrogen diffusion preventing film formed on the inter-layer insulation film having steps in the surface does not have good coverage, and cannot sufficiently prevent the diffusion of the hydrogen and the water. The hydrogen and the water arriving at the dielectric film reduce the metal oxide forming the dielectric film with hydrogen, resultantly deteriorating the electric characteristics of the capacitors.

In the present embodiment, however, since the hydrogen diffusion preventing film 52 is formed on the planarized inter-layer insulation film 50, the hydrogen diffusion preventing film 52 is formed in the form of the flat. The flat hydrogen diffusion preventing film 52 has very good coverage, and can barrier the hydrogen and the water without failure. Furthermore, in the present embodiment, the hydrogen diffusion preventing film 52 is formed below a first metal interconnection layer 64 which will be described later, and can prevent the hydrogen and the water from arriving at the capacitors 44 when an inter-layer insulation film 70 which will be described later is formed. Thus, according to the present embodiment, the hydrogen and the water can be prohibited from arriving at the dielectric film 40 of the capacitors 44, and the metal oxide forming the dielectric film 40 of the capacitors 44 is prevented from being reduced with the hydrogen. Thus, according to the present embodiment, the deterioration of the electric characteristics of the capacitors 44 can be prevented without failure.

For this reason, in the present embodiment, the flat hydrogen diffusion preventing film 52 is formed above the capacitors 44.

The film stress of the hydrogen diffusion preventing film 52 is set at, e.g., $5 \times 10^8$ $dyn/cm^2$ or below. For the following reason, in the present embodiment, the film stress of the hydrogen diffusion preventing film 52 is set so low.

That is, when the film stress of the hydrogen diffusion preventing film 52 is relatively high, stresses are applied to the capacitors 44, and the switching charge quantity Qsw of the capacitors 44 is often decreased. The switching charge quantity Qsw is a difference between a charge quantity of switching by polarization and a charge quantity of non-switching.

On the hydrogen diffusion preventing film 52, an insulation film 54 of, e.g., a silicon oxide film is formed. The film thickness of the insulation film 54 is set at, e.g., 200-300 nm.

In the present embodiment, the insulation film 54 is formed of a silicon oxide film but is not essentially formed of a silicon oxide film. For example, the insulation film 54 maybe formed of an SiON film, a silicon nitride film ($Si_3N_4$ film) or others.

In the present embodiment, the insulation film 54 is formed on the hydrogen diffusion preventing film 52 for the following reason.

That is, when the insulation film 54 is not formed on the hydrogen diffusion preventing film 52, the hydrogen diffusion preventing film 52 is often degraded in a step after the hydrogen diffusion preventing film 52 has been formed, and the hydrogen diffusion preventing film 52 often cannot have the sufficient hydrogen diffusion preventing function. When the insulation film 54 is not formed on the hydrogen diffusion preventing film 52, even the hydrogen diffusion preventing film 52 is etched in patterning interconnections. When interconnections are formed directly on the hydrogen diffusion preventing film 52, the reliability of the interconnections is often low. For the purpose of preventing such inconveniences, the insulation film 54 is formed on the hydrogen diffusion preventing film 52 in the present embodiment.

Contact holes 56 are formed in the insulation film 54, the hydrogen diffusion preventing film 52 and the inter-layer insulation film 50 down to the upper electrodes 42. In the insulation film 54, the hydrogen diffusion preventing film 52 and the inter-layer insulation film 50, contact holes (not illustrated) are formed down to the lower electrodes 38. Contact holes 58 down to the conductor plugs 32 is formed in the insulation film 54, the hydrogen diffusion preventing film 52 and the inter-layer insulation film 50.

In the contact holes 58, a barrier metal film 60 of, e.g., a 20-100 nm thickness TiN film is formed.

In the contact holes 56, 58 with the barrier metal film 60 formed in conductor plugs 62 of tungsten are buried in.

For the following reason, the TiN film 60 alone is formed in the contact holes 56, 58 without forming a Ti film, and the conductor plugs 62 of tungsten are buried in the contact holes 56, 58 with the TiN film 60 alone formed in.

That is, when the conductor plugs are formed of tungsten, generally, the layer film of a Ti film and a TiN film is formed in the contact holes, and the conductor plugs of tungsten are buried in the contact holes with the layer film of the Ti film and the TiN film formed in. However, when the Ti film contacts the upper electrodes of the capacitors, the oxygen atoms in the $IrO_X$ film forming the upper electrodes of the capacitors react with titanium atoms in the Ti film, and $TiO_X$ is generated, which increases the contact resistance between the upper electrodes and the conductor plugs.

The Ti film is for ensuring the adhesion of the conductor plugs to the lower layer. The Ti film is not essentially necessary when the adhesion of the conductor plugs to the lower layer can be ensured without the Ti film.

In the present embodiment, the layer lower of the conductor plugs 62 are the conductor plugs 32 of tungsten, and without the Ti film in the contact holes 56, 58, the adhesion of the conductor plugs 62 to the lower layer can be ensured. Accordingly, in the present embodiment, the Ti film is not formed in the contact holes 56, 58, but the TiN film 60 alone is formed in the contact holes 56, 58, and conductor plugs 62 of tungsten are formed in the contact holes 56, 58 with the TiN film 60 formed in. Thus, in the present embodiment, it does not take place that the oxygen atoms in the $IrO_X$ film 42a and in the $IrO_Y$ film 42b forming the upper electrodes 42 of the capacitors 44 react with the Ti atoms of the Ti film to produce $TiO_X$, and the contact resistance between the upper electrodes 42 and the conductor plugs 62 is accordingly increased. Thus, according to the present embodiment, the semiconductor device can have good electric characteristics.

On the insulation film 54, an interconnection (a first metal interconnection layer) 64 is formed on the conductor plugs 62. The interconnections 64 are formed of the layer film of, e.g., a 60 nm-thickness Ti film, a 30 nm-thickness TiN film, a 360 nm-thickness AlCu alloy film, a 5 nm-thickness Ti film and a 70 nm-thickness TiN film.

In the present embodiment, for the following reason, the interconnection 64 is not connected directly to the upper electrodes 42 and the lower electrodes 38 of the capacitor 44 but via the conductor plugs 62.

That is, when the interconnection is connected directly to the upper electrodes and the lower electrodes, there is a risk that the Al used as the material of the interconnection, and the Pt used as the material of the upper electrodes and the lower electrodes of the capacitors react with each other to form a reaction product. When the Al and the Pt react with each other, and a reaction product of large volumes are formed, cracks are often made in the inter-layer insulation films, etc., which is a factor for decreasing the reliability of the semiconductor device.

In the present embodiment, the interconnection 64 is connected to the upper electrodes 42 and the lower electrodes 38 of the capacitors 44 via the conductor plugs 62, whereby the Al used as the material of the interconnection 64 and the Pt used as the material of the upper electrodes 42 and the lower electrodes 38 of the capacitors 44 do not react with each other, and accordingly no reaction product is formed. Thus, according to the present embodiment, the Al and the Pt are prohibited from reacting with each other to thereby form the reaction product. The decrease of the reliability of the semiconductor device can be prevented.

On the insulation film 54 with the interconnection 64 formed on, a silicon oxide film 66 is formed. On the silicon oxide film 66, a silicon oxide film 68 is further formed. The surface of the silicon oxide film 68 is planarized. The silicon oxide film 66 and the silicon oxide film 68 form an inter-layer insulation film 70. The total film thickness of the inter-layer insulation film 70 is set at, e.g., 1275 nm.

Contact holes 72 are formed in the inter-layer insulation films 66, 68 down to the interconnection 64.

In the contact holes 72, a Ti film of, e.g., a 10 nm-thickness is formed. In the contact holes 72 with the Ti film formed in, a 3.5-7 nm-thickness TiN film is formed. The Ti film and the TiN film form a barrier metal film 74.

In the contact holes 72 with the barrier metal film 72, conductor plugs 76 of tungsten are buried.

On the inter-layer insulation films 66, 68 with the conductor plugs 76 buried in, an interconnection (a second metal interconnection layer) 78 are formed, connected to the conductor plugs 76. The interconnection 78 is formed of the layer film of, e.g., a 60 nm-thickness Ti film, a 30 nm-thickness TiN film, a 360 nm-thickness AlCu alloy film, a 5 nm-thickness Ti film and a 70 nm-thickness TiN film.

On the inter-layer insulation film 70 and the interconnection 78, a silicon oxide film 80 is formed. On the silicon oxide film 80, a silicon oxide film 82 is formed. The surface of the silicon oxide film 82 is planarized. The silicon oxide film 80 and the silicon oxide film 82 form an inter-layer insulation film 84.

In the inter-layer insulation film 84, contact holes 86 are formed down to the interconnection 78.

In the contact holes 86, a Ti film of, e.g., a 10 nm-thickness is formed. In the contact holes 86 with the Ti film formed in, a 3.5-7 nm-thickness TiN film is formed. The Ti film and the TiN film form a barrier metal film 88.

In the contact holes 86 with the barrier metal film formed in, conductor plugs 90 of tungsten are buried.

On the inter-layer insulation film 84 with the conductor plugs 90 buried in, an interconnection (a third metal interconnection layer) 92 is formed, connected to the conductor plugs 90. The interconnection 92 is formed of the layer film of, e.g., a 60 nm-thickness Ti film, a 30 nm-thickness TiN film, a 360 nm-thickness AlCu alloy film, a 5 nm-thickness Ti film and a 70 nm-thickness TiN film.

On the inter-layer insulation film 84 and the interconnection 94, a silicon oxide film 94 of, e.g., a 200-300 nm-thickness is formed.

On the silicon oxide film 94, a silicon nitride film 96 of, e.g., a 500 nm-thickness is formed.

On the silicon nitride film 96, a polyimide resin film 98 of, e.g., a 2-10 μm-thickness is formed.

In the polyimide resin film 98, the silicon nitride film 96 and the silicon oxide film 94, openings (not illustrated) are formed down to electrode pads (not illustrated).

Thus, the semiconductor device according to the present embodiment is constituted.

One characteristic of the semiconductor device according to the present embodiment is that the flat hydrogen diffusion preventing film 52 is formed between the capacitors 44 and the first metal interconnection layer 64.

With the hydrogen diffusion preventing film formed on the inter-layer insulation film with steps formed on the surface, the coverage of the hydrogen diffusion preventing film is not so good that the hydrogen diffusion preventing film cannot sufficiently prevent the diffusion of the hydrogen and the water. When the hydrogen and the water arrive at the dielectric film of the capacitors, the metal oxide forming the dielectric film is reduced with the hydrogen, and the electric characteristics of the capacitors are degraded.

On the other hand, in the present embodiment, since the hydrogen diffusion preventing film 52 is formed on the planarized inter-layer insulation film 50, the hydrogen diffusion preventing film 52 is flat. The flat hydrogen diffusion preventing film 52 has good coverage, and can barrier the hydrogen and the water without failure. Furthermore, in the present embodiment, the hydrogen diffusion preventing film 52 is formed below the first metal interconnection layer 64, and when the inter-layer insulation film 70 is formed, the hydrogen diffusion preventing film 52 can prohibit the hydrogen and the water from arriving at the capacitors 44. Thus, the present embodiment can prevent without failure the hydrogen and the water from arriving at the dielectric film 40 of the capacitors 44, whereby the reduction of the metal oxide film forming the dielectric film 40 of the capacitors 44 with the hydrogen can be prevented. Thus, according to the present embodiment, the deterioration of the electric characteristics of the capacitors 44 can be surely prevented.

On major characteristic of the semiconductor device according to the present embodiment is that the conductor plugs 62 are not connected directly to the source/drain diffused layer 22 but connected via the conductor plugs 32.

When the conductor plugs 62 are connected directly to the source/drain diffused layer 22, not only the inter-layer insulation films 50, 26, etc., but also the hydrogen diffusion preventing film 52 must be etched so as to from the contact holes down to the source/drain diffused layer 22. It is very difficult to form the contact holes down to the source/drain diffused layer 22 without damaging the source/drain diffused layer 22 because the etching characteristics of the hydrogen diffusion preventing film 52 are largely different from the etching characteristics of the inter-layer insulation films 52, 26, etc.

In the present embodiment, the conductor plugs 32 connected to the source/drain diffused layer 22 are buried in the inter-layer insulation film 26 in advance, and the conductor plugs 62 connected to the conductor plugs 32 are buried in the inter-layer insulation film 50, etc., whereby the interconnection 64 and the source/drain diffused layer 22 can be electrically connected to each other without damaging the source/drain diffused layer 22. Thus, the semiconductor device according to the present embodiment can have high reliability and high fabrication yields.

One major characteristic of the semiconductor device according to the present embodiment is that in the contact holes 56, 58, the Ti film is not formed but the TiN film 60 alone is formed, and the conductor plugs 62 of tungsten are buried in the contact holes 56, 58 with the TiN film 60 alone formed in.

When the conductor plugs are formed of tungsten, generally, the layer film of the Ti film and the TiN film is formed in the contact holes, and the conductor plugs of tungsten are buried in the contact holes with the layer film of the Ti film and the TiN film formed in. With the upper electrodes of the capacitors in contact with the Ti film, the oxygen atoms in the $IrO_X$ film used as the upper electrodes of the capacitors react with the titanium atoms in the Ti film to produce $TiO_X$, which makes the contact resistance between the upper electrodes and the conductor plugs high.

However, in the present embodiment, intentionally, the Ti film is not formed in the contact holes 56, 58, the TiN film 60 alone is formed in the contact holes 56, 58, and the conductor plugs 62 of tungsten are buried in the contact holes 56, 58 with the TiN film 60 formed in. Thus, according to the present embodiment, the oxygen atoms in the $IrO_X$ film 42a and the $IrO_Y$ film 42b forming the upper electrodes 42 of the capacitors 44 are prevented from reacting with the Ti atoms in the Ti film to thereby produce $TiO_X$. Thus, the present embodiment can prevent the increase of the contact resistance between the upper electrodes 42 and the conductor plugs 62, and the semiconductor device according to the present embodiment can have good electric characteristics.

The Ti film, which is for ensuring the adhesion of the conductor plugs 62 to the below layer, may not be essentially formed when the adhesion of the conductor plugs 62 to the lower layer can be ensured without the Ti film. In the present embodiment, in which the lower layer of the conductor plugs 62 are the conductor plugs 32 of tungsten, without the Ti film in the contact holes 56, 58, the adhesion of the conductor plugs 62 to the lower layer can be ensured. Thus, in the present embodiment, without the Ti film in the contact holes 56, 58, no special problem takes place.

One major characteristic of the semiconductor device according to the present embodiment is that the interconnection 64 is not connected directly to the upper electrodes 42 and the lower electrodes 38 of the capacitors 44 but electrically connected to the upper electrodes 42 or the lower electrodes 38 of the capacitors 44 via the conductor plugs 62.

When the interconnection is connected directly to the upper electrodes and the lower electrodes of the capacitors, there is a risk that the Al used as the material of the interconnection and the Pt used as the material of the upper electrodes and the lower electrodes of the capacitors may react with each other to thereby produce reaction products. When the Al and the Pt react with each other to thereby form reaction products of large volutes, often cracks are made in the inter-layer insulation film, etc., which is a factor for the decrease of the reliability of the semiconductor device.

In the present embodiment, in which the interconnection 64 is connected to the upper electrodes 42 or the lower electrode 38 of the capacitors 44 via the conductor plugs 62, the Al used as the material of the interconnection 64 and the Pt used as the material of the upper electrodes 42 and the lower electrodes 38 of the capacitors 44 never react with each other to thereby form reaction products. Thus, according to the present embodiment, the Al and the Pt are prohibited from reacting with each other to resultantly form reaction products, causing cracks in the inter-layer insulation film 50, etc., and the decrease of the reliability of the semiconductor device can be prevented.

One major characteristic of the semiconductor device according to the present embodiment is that the oxidation preventing film 34 for preventing the oxidation of the surface of the conductor plugs 32 is formed on the inter-layer insulation film 26 with the conductor plugs 32 buried in.

According to the present embodiment, because of the oxidation preventing film 34 formed on the inter-layer insulation film 26, the oxidation of the surfaces of the conductor plugs 32 can be prevented when the silicon oxide film 36, etc. are formed, whereby the contact resistance between the conductor plugs 62 and the conductor plugs 32 can be depressed low.

One major characteristic of the semiconductor device according to the present embodiment is that the insulation film 54 is formed on the hydrogen diffusion preventing film 52, and on the insulation film 54, the interconnection 64 is formed.

In the present embodiment, the insulation film 54 is formed on the hydrogen diffusion preventing film 52, whereby the deterioration of the hydrogen diffusion preventing film 52 can be prevented, and the hydrogen diffusion preventing film 52 can have sufficient hydrogen diffusion preventing function. In the present embodiment, the insulation film 54 is formed on the hydrogen diffusion preventing film 52, and in patterning the interconnection 64, the hydrogen diffusion preventing film 52 is prevented from being etched. In the present embodiment, the interconnection 64 is formed on the hydrogen diffusion preventing film 52 via the insulation film 54, whereby the reliability of the interconnection 64 can be improved.

Patent Reference 1 discloses the technique of forming an aluminum oxide film on an inter-layer insulation film with capacitor formed on. In Patent Reference 1, since the surface of the inter-layer insulation film is not planarized, the aluminum oxide film is not accordingly flat. The coverage of the aluminum oxide film in Patent Reference 1 is not so good. Accordingly, in Patent Reference 1, in forming an SiN film by plasma CVD after the aluminum oxide film has been formed, the hydrogen arrives at a dielectric film of the capacitors, and the dielectric film of the capacitors is reduced with the hydrogen. Thus, it is difficult to fabricating a semiconductor device of high reliability with high yields by the technique disclosed in Patent Reference 1.

Patent Reference 2 discloses the technique of forming an organic film, covering capacitors and forming an aluminum oxide film on the organic film. In Patent Reference 2, the organic film covering the capacitors contains a large quantity of water, and furthermore, the processing for removing the water from the organic film has not been made. Accordingly, the dielectric film of the capacitors is degraded with the hydrogen and the water. Furthermore, in Patent Reference 2, the interconnection of Al is connected directly to the upper electrodes or the lower electrodes of the capacitors, and the Al used as the material of the interconnection and the Pt used as the material of the upper electricity or the lower electrodes of the capacitors, and the Pt used as the material of the upper electrodes or the lower electrodes of the capacitors, and the Pt used as the material of the upper electrodes or the lower electrodes of the capacitors are reacted with each other to form reaction products. As described above, the technique disclosed in Patent Reference 2 is evidently different from the invention of the present application.

(Evaluation Result)

Next, the result of evaluating the semiconductor device according to the present embodiment will be explained.

Figure 2A:
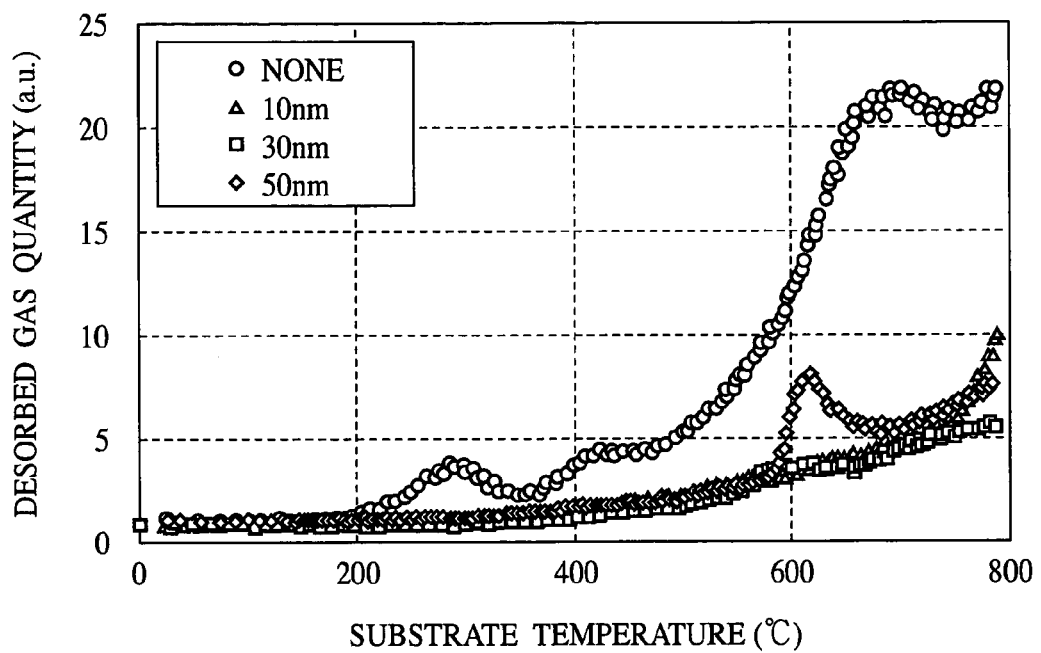
FIGS. 2A and 2B are graphs of the results of evaluating the hydrogen diffusion preventing film by thermal desorption spectroscopy.
Figure 2B:
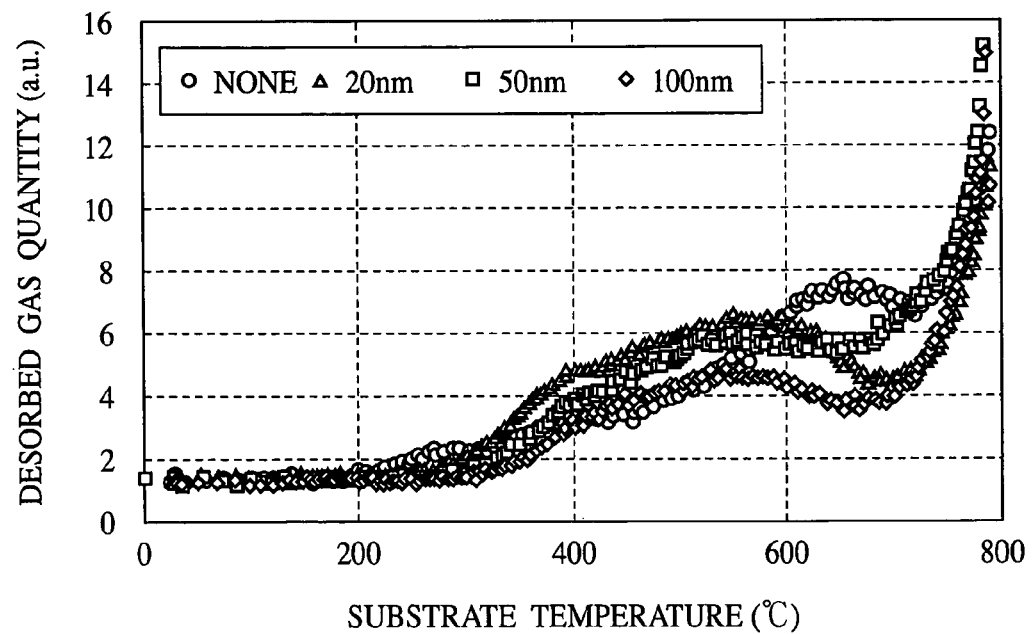

The result of the comparison in the evaluation between the semiconductor device with the hydrogen diffusion preventing film formed on the lower layer having a flat surface and the semiconductor device with the hydrogen diffusion preventing film formed on the lower layer having concavities and convexities in the surface is shown in FIGS. 2A and 2B. FIGS. 2A and 2B are graphs of the results of evaluating the hydrogen diffusion preventing film by thermal desorption spectroscopy (TDS). In FIGS. 2A and 2B, the substrate temperature is taken on the horizontal axis, and on the vertical axis the quantity of the gas desorbed from the samples is taken.

FIG. 2A shows the evaluation of the hydrogen diffusion preventing film formed on the lower layer having a flat surface. The samples were prepared by forming silicon oxide film much containing hydrogen ($H_2$) or water ($H_2O$) on silicon substrates by plasma TEOS CVD and then forming aluminum oxide film on the entire surfaces without making thermal processing. In FIG. 2A, the ○ marks indicate the sample without the aluminum oxide film formed on; the Δ marks indicate the sample with the aluminum oxide film formed in a 10 nm-thickness; the □ marks indicate the sample with the aluminum oxide film formed in a 30 nm-thickness; and the ◇ marks indicate the sample with the aluminum oxide film formed in a 50 nm-thickness.

FIG. 2B shows the evaluation of the hydrogen diffusion preventing film formed on the lower layer having concavities and convexities in the surface. The samples were prepared by forming silicon oxide film much containing hydrogen or water on silicon substrates by plasma TEOS CVD, patterning the silicon oxide film into the configuration approximate to the capacitors and then forming aluminum oxide film on the entire surfaces without making thermal processing. In FIG. 2B, the ○ marks indicate the sample without the aluminum oxide film formed; the Δ marks indicate the sample with the aluminum oxide film formed in a 20 nm-thickness; the □ marks indicate the sample with the aluminum oxide film formed in a 50 nm-thickness; and the ◇ marks indicate the sample with the aluminum oxide film formed in a 100 nm-thickness.

As seen in FIG. 2B, in the samples with the hydrogen diffusion preventing film formed on the lower layer having concavities and convexities in the surface, the quantities of the desorbed gas do not substantially differ between the samples with the hydrogen diffusion preventing film formed and the sample without the hydrogen diffusion preventing film formed. Based on this, when the hydrogen diffusion preventing film is formed on the lower layer having concavities and convexities in the surface, the hydrogen diffusion preventing film cannot substantially prevent the diffusion of the hydrogen and the water.

In contrast to this, as seen in FIG. 2A, in the samples with the hydrogen diffusion preventing film formed on the lower layer having a flat surface, the quantities of the desorbed gas in the samples with the hydrogen diffusion preventing film formed on the lower layer having the flat surface are much smaller than the quantities of the desorbed gas of the sample without the hydrogen diffusion preventing film formed. Based on this, in the present embodiment, i.e., the samples with the hydrogen diffusion preventing film formed on the lower layer having the flat surface, the hydrogen diffusion preventing film can more surely prevent the diffusion of the hydrogen and the water.

Furthermore, as seen in FIG. 2A, the quantities of the desorbed gas do not substantially differ between the samples with the hydrogen diffusion preventing film formed and the samples without the hydrogen diffusion preventing film formed. Based on this, in the present embodiment, i.e., with the hydrogen diffusion preventing film formed on the lower layer having the flat surface, the diffusion of the hydrogen and the water can be surely prevented even when the hydrogen diffusion preventing film is relatively thin.

Figure 3:
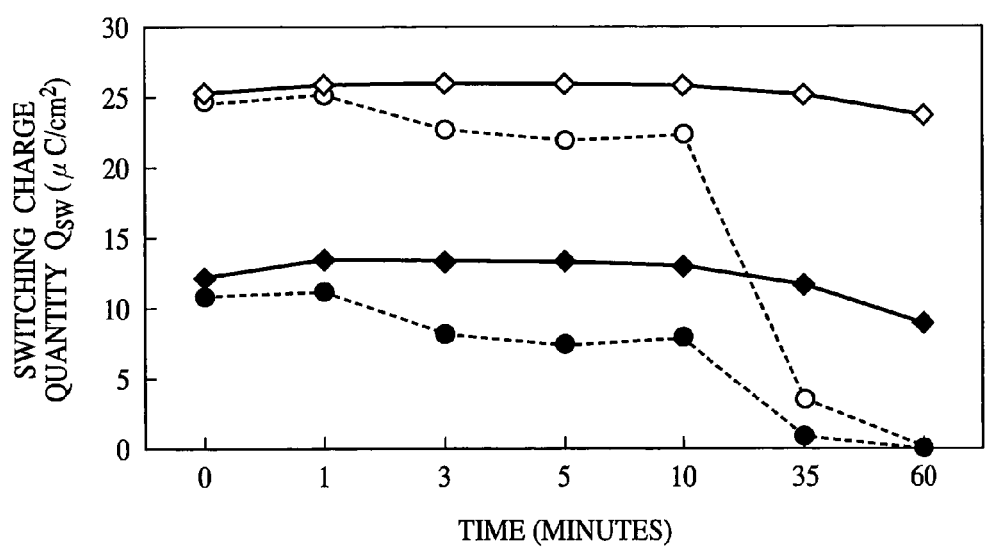
FIG. 3 is a graph of changes of the switching charge quantity $Q_{SW}$ of the capacitor.

Then, the result of evaluating the deterioration of the capacitors with hydrogen ions will be explained with reference to FIG. 3. FIG. 3 is a graph of the change of the switching charge $Q_{SW}$ of the capacitors.

In FIG. 3, the ◇ marks and the ◆ marks indicate the present embodiment, i.e., the sample with the flat hydrogen diffusion preventing film formed over the capacitors; and the ○ marks and the ● marks indicate the sample without the flat hydrogen diffusion preventing film formed over the capacitors. The resistance to hydrogen ions was evaluated by exposing the samples in the plasma atmosphere generated by using $NH_3$ gas and measuring changes of the switching charge quantity $Q_{SW}$ of the capacitors.

In FIG. 3, the period of time in which the samples were exposed to the plasma atmosphere containing hydrogen ions is taken on the horizontal axis, and the switching charge quantity $Q_{SW}$ of the capacitors is taken on the vertical axis. The ○ marks and the ◇ marks indicate the samples with a 3 V voltage applied to the capacitors. The ● marks and the ◆ marks indicate the samples with a 1.5 V voltage applied to the capacitors.

As indicated by the ○ marks and the ● marks, without the flat hydrogen diffusion preventing film formed over the capacitors, the switching charge quantity $Q_{SW}$ abruptly decreases when the capacitor is exposed to the plasma atmosphere containing hydrogen ions for 10 minutes or more.

In contrast to this, as indicated by the ◇ marks and the ◆ marks, in the present embodiment, i.e., with the flat hydrogen diffusion preventing film formed over the capacitors, the switching charge quantity $Q_{SW}$ does not substantially decrease even when the capacitor is exposed to the plasma atmosphere containing hydrogen ions for long periods of time.

Based on them, according to the present embodiment, it can be seen that the flat hydrogen diffusion preventing film is formed over the capacitors, whereby the deterioration of the capacitors by hydrogen ions can be surely prevented.

Figure 4A:
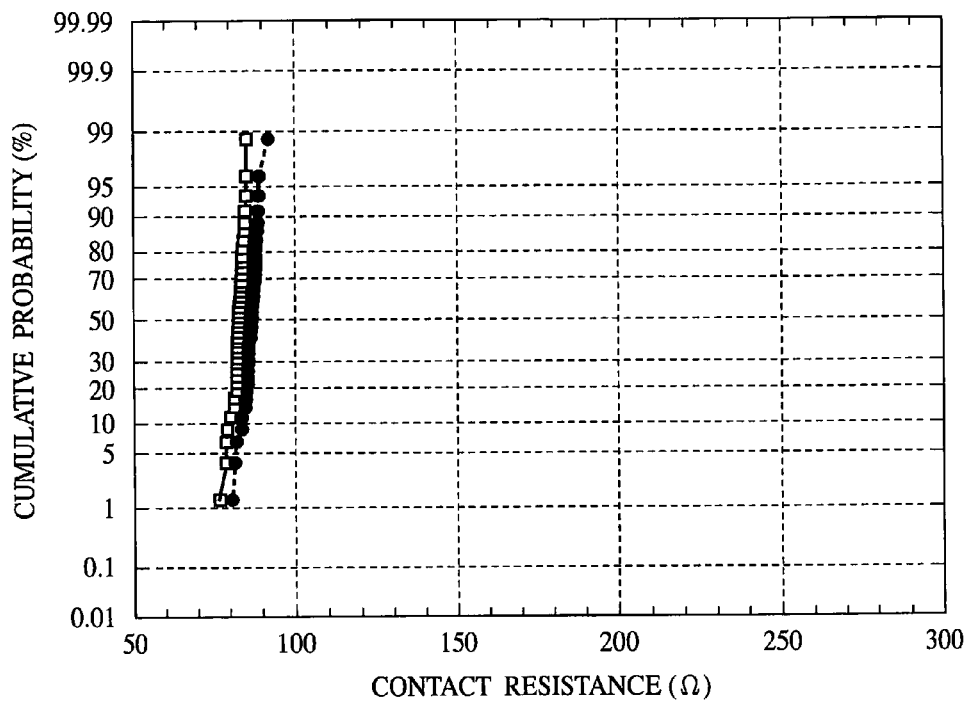
FIGS. 4A and 4B are graphs of dispersion of the contact resistance of the lower electrode.
Figure 4B:
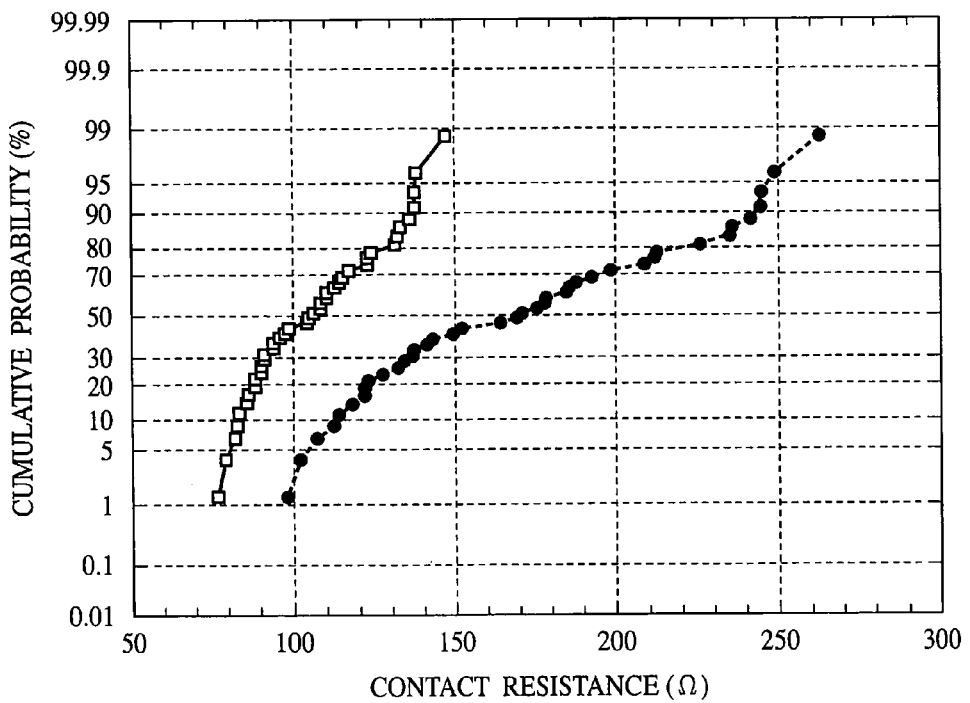

Next, the result of evaluating the contact resistance of the lower electrodes of the capacitors will be explained with reference to FIGS. 4A and 4B. FIGS. 4A and 4B are graphs of dispersion of the contact resistance of the lower electrodes FIG. 4A shows the result of the present embodiment, i.e., with the interconnection layer electrically connected to the lower electrodes via the conductor plugs of tungsten. FIG. 4B shows the results of the case with the interconnection layer of aluminum directly connected to the lower electrodes. In FIGS. 4A and 4B, on the horizontal axis, the contact resistance between the interconnection layer and the lower electrodes is taken, and the cumulative probability is taken on the vertical axis. The □ marks indicate the contact resistances before the thermal processing, and the ● marks indicate the contact resistances after the thermal processing. The thermal processing was made in an $N_2$ atmosphere at 420° C. for 30 minutes.

As seen in FIG. 4B, with the interconnection layer of aluminum directly connected to the lower electrodes, the dispersion of the contact resistance is large. Furthermore, the dispersion of the contact resistance becomes much larger before and after the thermal processing.

In contrast to this, as seen in FIG. 4A, in the present embodiment, i.e., with the interconnection layer electrically connected to the lower electrodes via the conductor plugs of tungsten, the dispersion of the contact resistance is very small. Furthermore, the dispersion of the contact resistance does not substantially change before and after the thermal processing.

Based on them, it can be seen that according to the present embodiment, the interconnection layer is connected to the lower electrodes or the upper electrodes of the capacitors via the conductor plugs, whereby the contact reliability can be sufficiently ensured.

Next, the result of evaluating the reliability of the contact to the source/drain diffused layer will be explained.

When the contact holes were formed in the inter-layer insulation film 26 down to the source/drain diffused layer 22 without burying in advance the conductor plugs 32 buried in the inter-layer insulation film 26, and the conductor plugs 62 were formed in the contact holes, the contact resistance between the conductor plugs 62 and the source/drain diffused layer 22 largely dispersed, and in this case, often the state that the conductor plugs 62 and the source/drain diffused layer 22 were not electrically contacted with each other, i.e., the open state took place.

In contrast to this, in the present embodiment, where the conductor plugs 32 are in advance buried in the inter-layer insulation film 26, in the inter-layer insulation film 26 the contact holes 58 are formed down to the conductor plugs 32, and the conductor plugs 62 are formed in the contact holes 58, the dispersion of the electric resistance between the conductor plugs 62 and the source/drain diffused layer 22 was very little.

Based on them, according to the present embodiment, the conductor plugs 32 connected to the source/drain diffused layer 22 are formed in advance, whereby the reliability of the contact to the source/drain diffused layer 22 can be ensured even when the contact holes 58 are formed through the aluminum oxide film 52.

Next, the result of evaluating the position where the hydrogen diffusion preventing film is formed will be explained.

When the planarized hydrogen diffusion preventing film was formed on the inter-layer insulation film 84 without forming the flat hydrogen diffusion preventing film 52 between the capacitors 44 and the first metal interconnection layer 64 and without the thermal processing for removing the water in the inter-layer insulation films 70, 84, the switching charge quantity $Q_{SW}$ per 1 cell of the capacitors was as small as about 100 fC/cell. The switching charge quantity $Q_{SW}$ will become so small for the following reason. This is firstly because the flat hydrogen diffusion preventing film 52, which is not formed between the capacitors 44 and the first metal interconnection layer 64, cannot prevent the arrival of the hydrogen and the water at the dielectric film 40 of the capacitors 44. This is secondly because the hydrogen diffusion preventing film, which was formed on the inter-layer insulation film 84 without the thermal processing for removing the water in the inter-layer insulation films 70, 80, large quantities of the hydrogen and the water confined by the hydrogen diffusion preventing film will arrives at the dielectric film 40 of the capacitors 44.

In contrast to this, in the present embodiment, in which the flat hydrogen diffusion preventing film 52 is formed below the first metal interconnection layer 64, the switching charge quantity $Q_{SW}$ per 1 cell of the capacitors was about 450 fC/cell, which was relatively large.

Based on them, it can been seen that according to the present embodiment, the flat hydrogen diffusion preventing film 52 is formed between the capacitors 44 and the first metal interconnection layer 52, whereby the arrival of the hydrogen and the water at the dielectric film 40 of the capacitor 44 can be prevented without failure. According to the present embodiment, the thermal processing for removing the hydrogen and the water in the inter-layer insulation films 70, 84 is suitably made, where the hydrogen and the water can be surely removed from the inter-layer insulation films 70, 84. Thus, according to the present embodiment, the arrival of the hydrogen and the water at the dielectric film 40 of the capacitors 44 can be prevented without failure, and the semiconductor device can have high reliability and high fabrication yields.

(The Method for Fabricating the Semiconductor Device)

Next, the method for fabricating the semiconductor device according to the present embodiment will be explained with reference to FIGS. 5A to 22. FIGS. 5A to 21 are sectional view of the semiconductor device according to the present embodiment in the steps of the method for fabricating the semiconductor device, which illustrate the method.

Figure 5A:
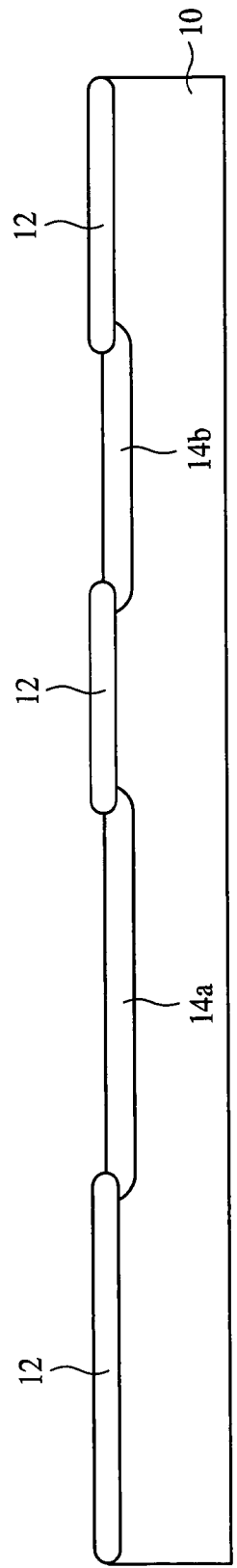
FIGS. 5A and 5B are sectional views of the semiconductor device according to the first embodiment of the present invention in the steps of the method for fabricating the semiconductor device, which illustrate the method (Part 1).

First, as illustrated in FIG. 5A, the device isolation regions 12 for defining the device regions are formed on the semiconductor substrate 10 of, e.g., silicon by LOCOS (LOCal Oxidation of Silicon).

Next, a dopant impurity is implanted by ion implantation to form the wells 14a, 14b.

Then, the gate insulation film 16 of a 9 nm-thickness is formed in the device regions by, e.g., thermal oxidation.

Then, a 120 nm-thickness polysilicon film 18 is formed by, e.g., CVD. The polysilicon film 18 is to be the gate electrodes, etc.

Figure 5B:
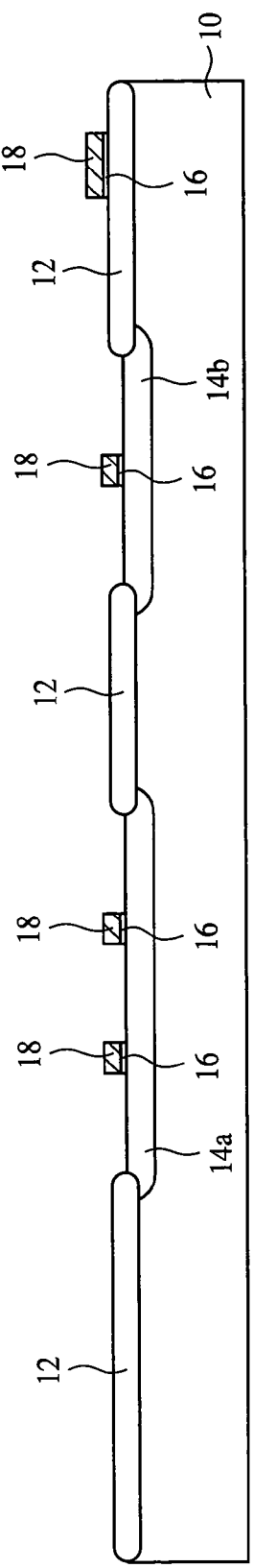

Next, the polysilicon film 18 is patterned by photolithography. Thus, as illustrated in FIG. 5B, the gate electrodes (gate lines) 18 of the polysilicon film are formed.

Next, with the gate electrodes 18 as the mask, a dopant impurity is implanted into the semiconductor substrate 10 on both sides of the gate electrodes 18. Thus, the extension regions (not illustrated) forming the shallow regions of the extension sources/drains are formed.

Then, a 150 nm-thickness silicon oxide film 20 is formed on the entire surface by, e.g., CVD.

Next, the silicon oxide film 20 is anisotropically etched. Thus, the sidewall insulation film 20 of the silicon oxide film is formed on the side walls of the gate electrodes 18.

Next, by using as the mask the gate electrodes 18 with the sidewall insulation film 20 formed on, a dopant impurity is implanted into the semiconductor substrate 10 on both sides of the gate electrodes 18. Thus, an impurity diffused layer (not illustrated) forming the deep regions of the extension sources/drains is formed. The extension regions and the deep impurity diffused layer form the source/drain diffused layer 22.

Thus, as illustrated in FIG. 6A, transistors 24 including the gate electrodes 18 and the source/drain diffused layer 22 are formed.

Next, an SiON film (silicon nitride oxide film) of, e.g., a 200 nm-thickness and a silicon oxide film of, e.g., a 1000 nm-thickness are sequentially formed the latter on the former on the entire surface. The SiON film and the silicon oxide film form the inter-layer insulation film 26.

Next, the surface of the inter-layer insulation film 26 is planarized by, e.g., CMP (see FIG. 6B).

Then, as illustrated in FIG. 7A, the contact holes 28a and the contact holes 28b are formed in the inter-layer insulation film 26 respectively down to the source/drain diffused layer 22 and down to the gate electrodes (gate lines) 18 by photolithography.

Next, a 20-60 nm-thickness Ti film is formed on the entire surface by, e.g., sputtering.

Then, a 30-50 nm-thickness TiN film is formed on the entire surface by, e.g., sputtering or CVD. The Ti film and the TiN film form the barrier metal film 30.

Next, a 500 nm-thickness tungsten film 32 is formed on the entire surface by, e.g., CVD.

Then, the tungsten film 32 and the barrier metal film 30 are polished by, e.g., CMP until the surface of the inter-layer insulation film 26 is exposed. Thus, the conductor plugs 32 of tungsten are buried in the contact holes 28a, 28b (see FIG. 7B).

Figure 8A:
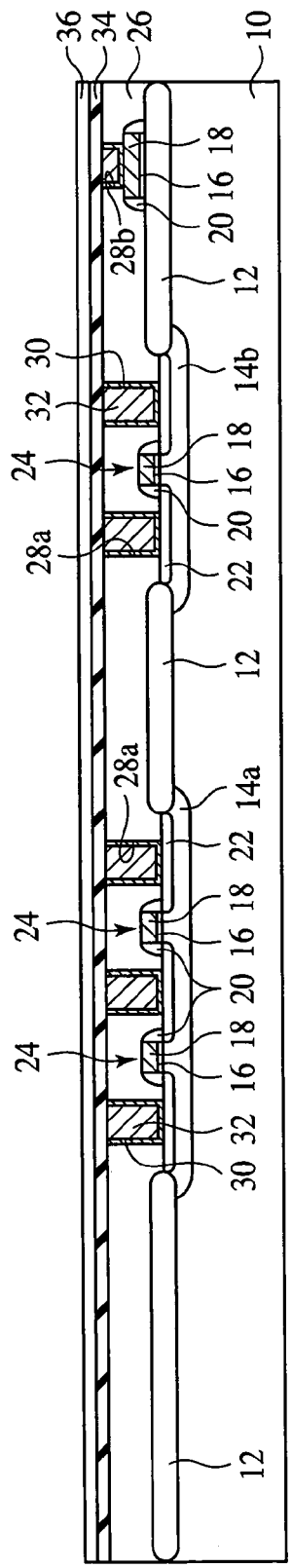
FIGS. 8A and 8B are sectional views of the semiconductor device according to the first embodiment of the present invention in the steps of the method for fabricating the semiconductor device, which illustrate the method (Part 4).

Then, as illustrated in FIG. 8A, a 100 nm-thickness oxidation preventing film 34 is formed on the entire surface by, e.g., plasma CVD. As the oxidation preventing film 34, an SiON film or a silicon nitride film, for example, is formed.

Then, a 130 nm-thickness silicon oxide film 36 is formed on the entire surface by, e.g., plasma TEOS CVD.

Then, thermal processing is made in a nitrogen ($N_2$) atmosphere. The thermal processing temperature is, e.g., 650° C., and the thermal processing period of time is, e.g., 30 minutes.

Figure 8B:
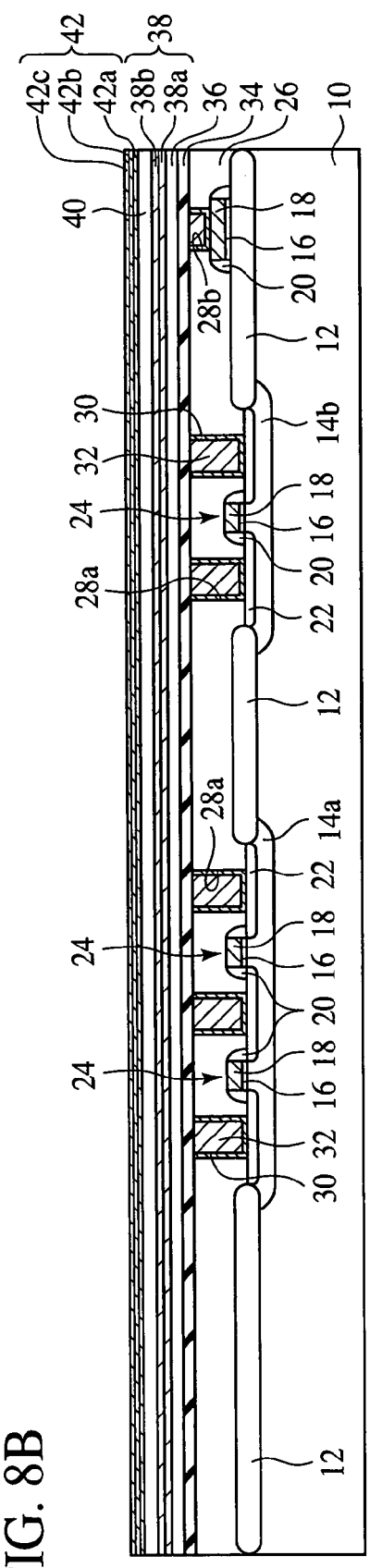

Next, as illustrated in FIG. 8B, a 20-100 nm-thickness aluminum oxide film 38a is formed on the entire surface by, e.g., sputtering or CVD.

Next, a 100-300 nm-thickness Pt film 38b is formed on the entire surface by, e.g., sputtering. The film thickness of the Pt film 38b is, e.g., 175 nm. The layer film 38 is thus formed of the aluminum oxide film 38a and the Pt film 38b. The layer film 38 is to be the lower electrodes of the capacitors 44.

Then, the dielectric film 40 is formed on the entire surface by, e.g., sputtering. As the dielectric film 40, a ferroelectric film, for example, is formed. More specifically, a 150 nm-thickness PZT film, for example, is formed.

The ferroelectric film forming the dielectric film 40 is formed here by sputtering but is not essentially formed by sputtering. For example, the ferroelectric film may be formed by sol-gel method, MOD (Metal Organic Deposition), MOCVD or others.

Then, thermal processing is made in an oxygen atmosphere by, e.g., RTA (Rapid Thermal Annealing). The thermal processing temperature is, e.g., 650-800° C., and the thermal processing period of time is, e.g., 30-120 seconds. The thermal processing temperature is 750° C., and the thermal processing period of time is 60 seconds here.

Then, a 10-100 nm-thickness $IrO_X$ film 42a is formed by, e.g., sputtering or MOCVD. The film thickness of the $IrO_X$ film 42a is 50 nm.

Then, a 100-300 nm-thickness $IrO_Y$ film 42b is formed by, e.g., sputtering or MOCVD. At this time, the $IrO_Y$ film 42b is so formed that the composition ratio Y of oxygen of the $IrO_Y$ film 42b is higher than the composition ratio X of oxygen of the $IrO_X$ film 42a.

Then, a 20-100 nm-thickness Pt film 42c is formed by, e.g., sputtering or MOCVD. The film thickness of the Pt film 42c is 75 nm here. The deposition temperature of the Pt film 42c is, e.g., 450° C. Thus, the layer film 42 of the $IrO_X$ film 42a, the IrO$_Y$ film 42b and the Pt film 42c is formed. The layer film 42 is to be the upper electrodes of the capacitors 44.

The Pt film 42c is for preventing the reduction of the surface of the upper electrodes 42 and decreasing the contact resistance between the conductor plugs 62 and the upper electrodes 42. When it is not necessary to much decrease the contact resistance between the conductor plugs 62 and the upper electrodes 42, the Pt film 42c is not necessary.

Next, a photoresist film 100 is formed on the entire surface by spin coating.

Then, the photoresist film 100 is patterned by photolithography into the plane shape of the upper electrodes 42.

Then, with the photoresist film 100 as the mask, the layer film 42 is etched. The etching gas is Ar gas and Cl$_2$ gas. Thus, the upper electrodes 42 of the layer film are formed (see FIG. 9A). Then, the photoresist film 100 is released.

Next, thermal processing is made in an oxygen atmosphere at, e.g., 650° C. or above for 1-3 minutes. This thermal processing is for preventing abnormalities in the surfaces of the upper electrodes 42.

Next, thermal processing is made in an oxygen atmosphere at 650° C. for 60 minutes, for example. This thermal processing is for improving the film quality of the dielectric film 40.

Then, a photoresist film 102 is formed on the entire surface by spin coating.

Next, by photolithography the photoresist film 102 is patterned into the plane shape of the dielectric film 40 of the capacitors 44.

Next, with the photoresist film 102 as the mask, the dielectric film 40 is etched (see FIG. 9B). Then, the photoresist film 102 is released.

Next, thermal processing is made in an oxygen atmosphere at, e.g., 350° C. for 60 minutes.

Figure 10A:
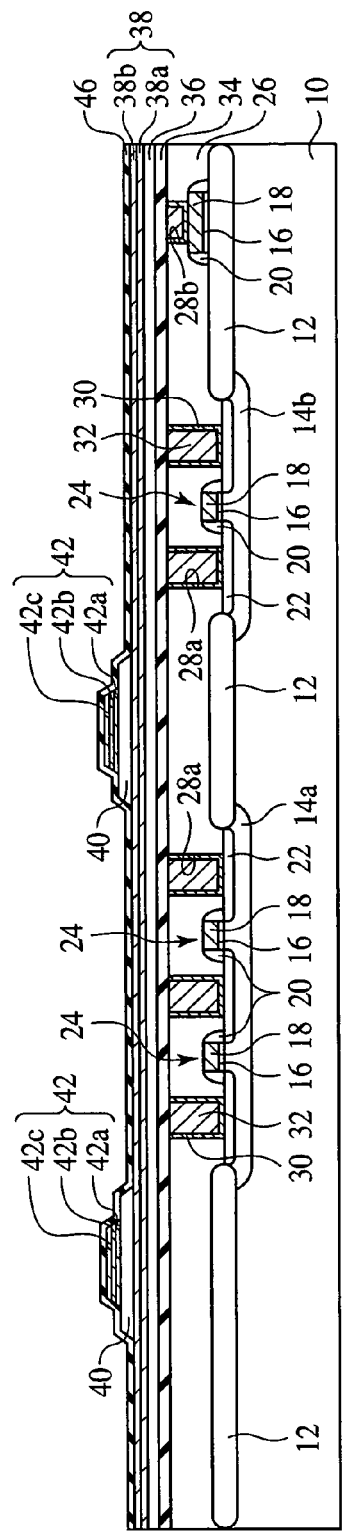
FIGS. 10A and 10B are sectional views of the semiconductor device according to the first embodiment of the present invention in the steps of the method for fabricating the semiconductor device, which illustrate the method (Part 6).

Next, as illustrated in FIG. 10A, the hydrogen diffusion preventing film 46 is formed by, e.g., sputtering or CVD. The hydrogen diffusion preventing film 46 is a 20-250 nm-thickness aluminum oxide film. When the hydrogen diffusion preventing film 46 is formed, it is preferable to form the hydrogen diffusion preventing film 46 under conditions which make the film stress of the hydrogen diffusion preventing film 46 is $5 \times 10^8$ dyn/cm$^2$ or below. The hydrogen diffusion preventing film 46 is formed under conditions which make the film stress of the hydrogen diffusion preventing film 46 so small for the purpose of, as described above, preventing the decrease of the switching charge quantity Q$_{SW}$ of the capacitors 44.

Figure 22:
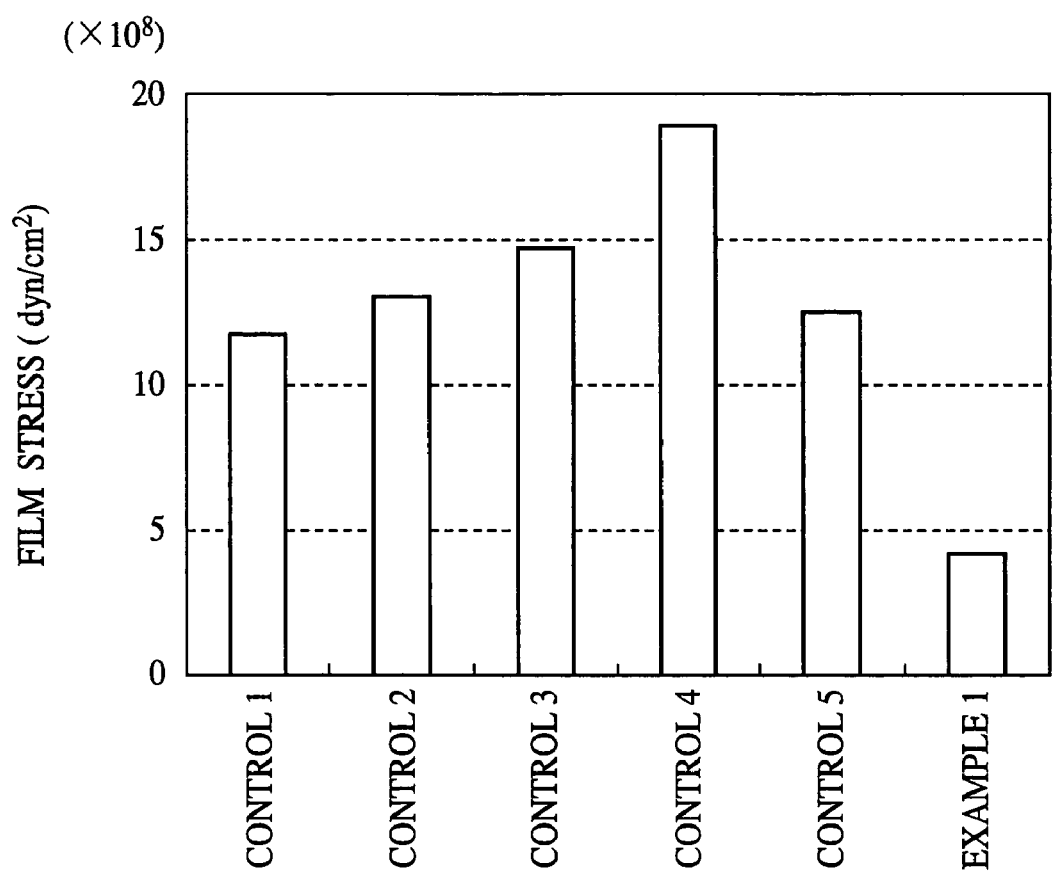
FIG. 22 is a graph of the film stress of hydrogen diffusion preventing films.

FIG. 22 is a graph of the film stress of the hydrogen diffusion preventing film. In Control 1, the film forming temperature was the room temperature, and the flow rate of the Ar gas was 12 sccm. In Control 2, the film forming temperature was the room temperature, and the flow rate of the Ar gas was 20 sccm. In Control 3, the film forming temperature was the room temperature, and the flow rate of the Ar gas was 30 sccm. In Control 4, the film forming temperature was 350° C., and the flow rate of the Ar gas was 30 sccm. In Control 5, the film forming temperature was 350° C., and the flow rate of the Ar gas was 50 sccm. In Example 1, the film forming temperature was 350° C., and the flow rate of the Ar gas was 70 sccm.

As seen in FIG. 22, there is a tendency that when the film forming temperature for forming the hydrogen diffusion preventing film is set relatively high, and the flow rate of the Ar gas is set relatively high, the film stress of the hydrogen diffusion preventing film becomes relatively small. For example, with the film forming temperature set at 350° C. or above, and the flow rate of the Ar gas is set at 70 sccm, the stress generated in the hydrogen diffusion preventing film can be $5 \times 10^8$ dyn/cm$^2$ or below. The film forming temperature is, e.g., 400° C., the Ar flow rate is, e.g., 100 sccm, and the film forming period of time is, e.g., 40-50 seconds here.

The hydrogen diffusion preventing film 46 having good step coverage can be formed by using MOCVD, but when the hydrogen diffusion preventing film 46 is formed by MOCVD, the dielectric film 40 is damaged by the hydrogen. Accordingly, it is not preferable to use MOCVD to form the hydrogen diffusion film 46.

Next, a photoresist film 104 is formed on the entire surface by spin coating.

Then, by photolithography, the photoresist film 104 is patterned into the plane shape of the lower electrodes 38 of the capacitors 44.

Figure 10B:
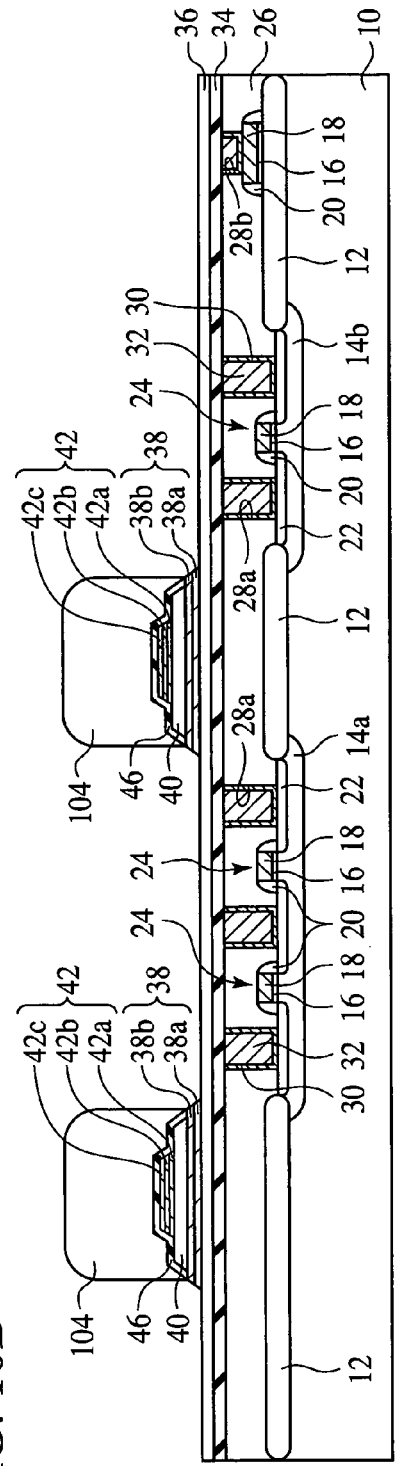

Then, with the photoresist film 104 as the mask, the hydrogen diffusion preventing film 46 and the layer film 38 are etched (see FIG. 10B). The lower electrodes 38 of the layer film are thus formed. The hydrogen diffusion preventing film 46 is left, covering the upper electrodes 42 and the dielectric film 40. Then, the photoresist film 104 is released.

Next, thermal processing is made in an oxygen atmosphere at, e.g., 350° C. for 30-60 minutes.

Figure 11A:
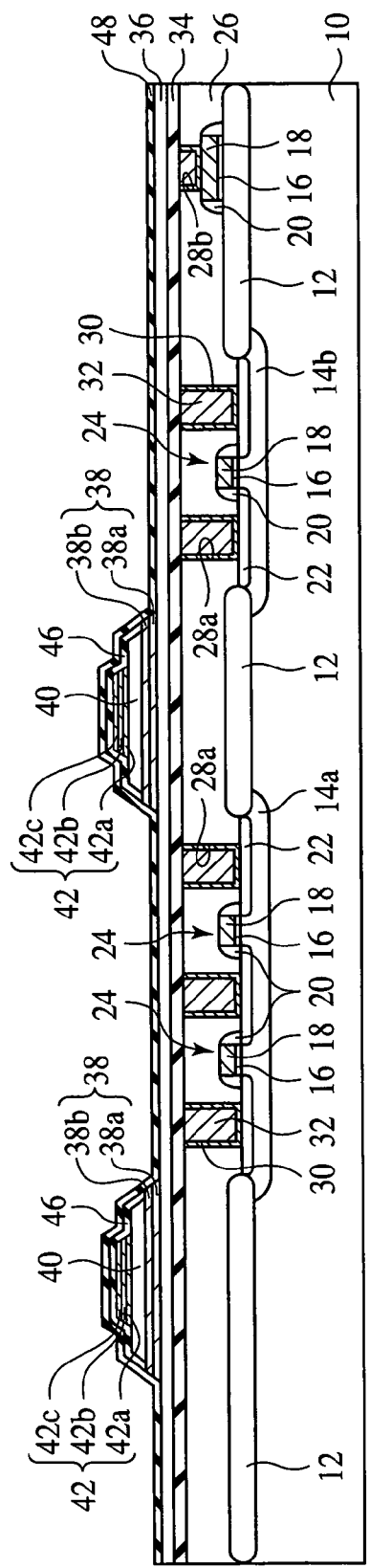
FIGS. 11A and 11B are sectional views of the semiconductor device according to the first embodiment of the present invention in the steps of the method for fabricating the semiconductor device, which illustrate the method (Part 7).

Then, as illustrated I FIG. 11A, the hydrogen diffusion preventing film 48 is formed on the entire surface by, e.g., sputtering or CVD. The hydrogen diffusion preventing film 48 is a 20-50nm-thickness aluminum oxide film. When the hydrogen diffusion preventing film 48 is formed, it is preferable that the hydrogen diffusion preventing film 48 is formed under conditions which make the stress generated in the hydrogen diffusion preventing film 48 is $5 \times 10^8$ dyn/cm$^2$ or below. The hydrogen diffusion preventing film 48 is formed under conditions which make the film stress of the hydrogen diffusion preventing film 48 so small for the purpose of, as described above, preventing the decrease of the switching charge quantity Q$_{SW}$ of the capacitors 44.

Thus, the hydrogen diffusion preventing film 48 is thus formed, further covering the capacitors 44 covered by the hydrogen diffusion preventing film 46.

Figure 11B:
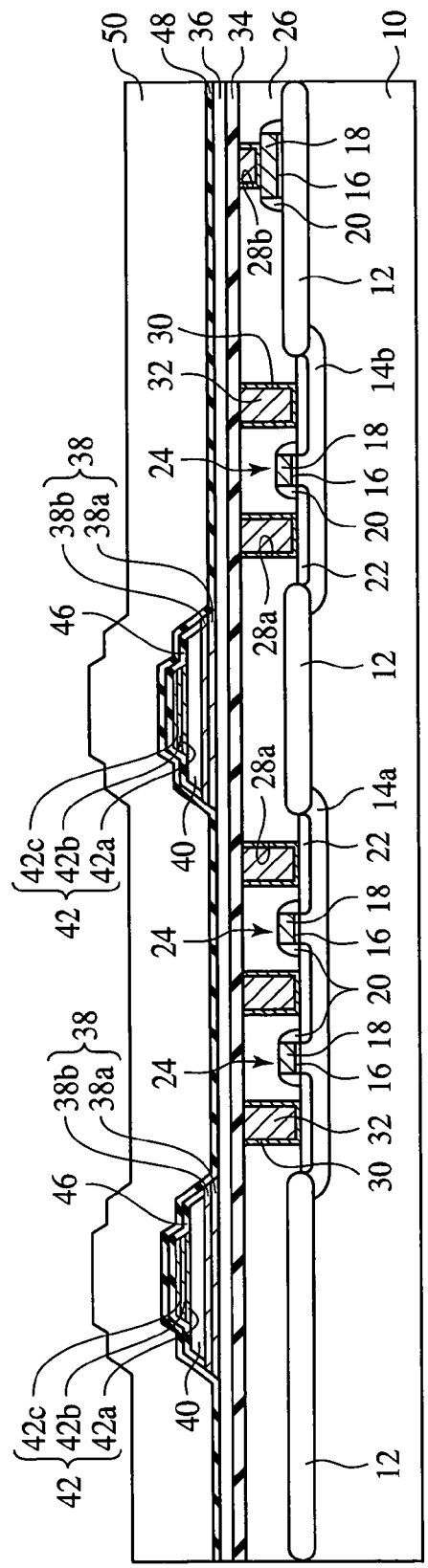

Then, as illustrated in FIG. 11B, the inter-layer insulation film 50 of a silicon oxide film of the, e.g., a 1500 nm-thickness is formed on the entire surface by plasma TEOS CVD. When a silicon oxide film is formed as the inter-layer insulation film 50, a mixed gas of TEOS gas, oxygen gas and helium gas is used as the raw material gas.

A silicon oxide film is formed here as the inter-layer insulation film 50. However, the inter-layer insulation film 50 is not essentially silicon oxide film, and a dielectric inorganic film, for example, may be used as the inter-layer insulation film 50.

Figure 12A:
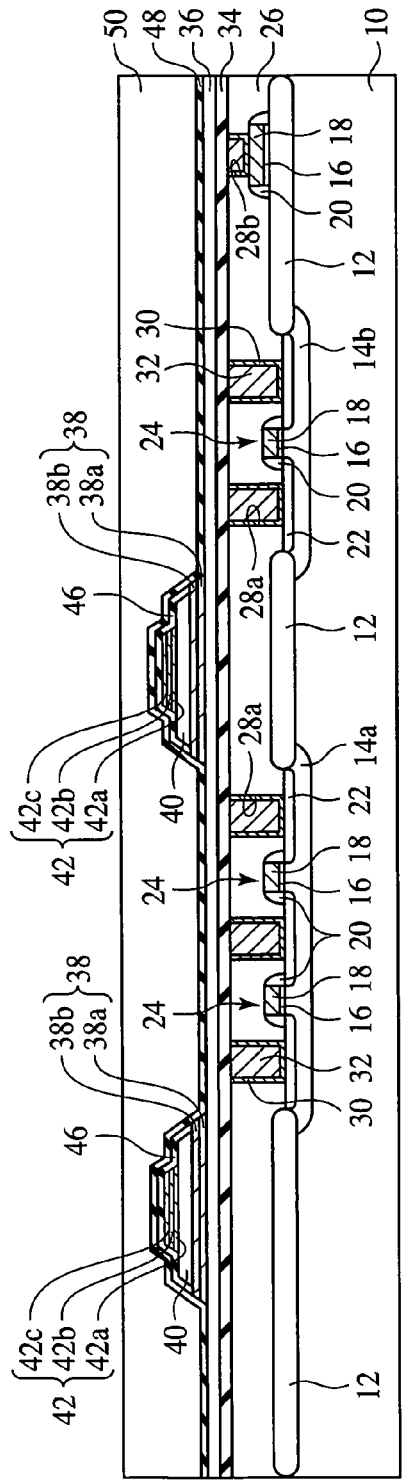
FIGS. 12A and 12B are sectional views of the semiconductor device according to the first embodiment of the present invention in the steps of the method for fabricating the semiconductor device, which illustrate the method (Part 8).

Then, as illustrated in FIG. 12A, the surface of the inter-layer insulation film 50 is planarized by, e.g., CMP.

Then, thermal processing is made in a plasma atmosphere generated by using N$_2$O gas or others. This thermal processing is for removing water in the inter-layer insulation film 50 while modifying the film quality of the inter-layer insulation film 50 to make it difficult for water to intrude into the inter-layer insulation film 50. The substrate temperature for the thermal processing is, e.g., 350° C. The flow rate of the N$_2$O gas is, e.g., 1000 sccm. The flow rate of the N$_2$ gas is, e.g., 285 sccm. The gap between the opposed electrodes is, e.g., 30 mils. The radio-frequency electric power to be applied is, e.g., 525 W. The air pressure in the chamber is, e.g., 3 Torr.

The thermal processing is made in a plasma atmosphere generated by using N$_2$O gas, etc. here. However, the inter-layer insulation film 50 maybe exposed to a plasma atmosphere generated by using N$_2$O gas, etc. after the thermal processing. In the thermal processing, water in the inter-layer insulation film 50 is removed. When the inter-layer insulation film 50 is exposed to a plasma atmosphere generated by using N$_2$O gas, etc., the film quality of the inter-layer insulation film 50 is changed to make it difficult for the water to intrude into the inter-layer insulation film 50.

Figure 12B:
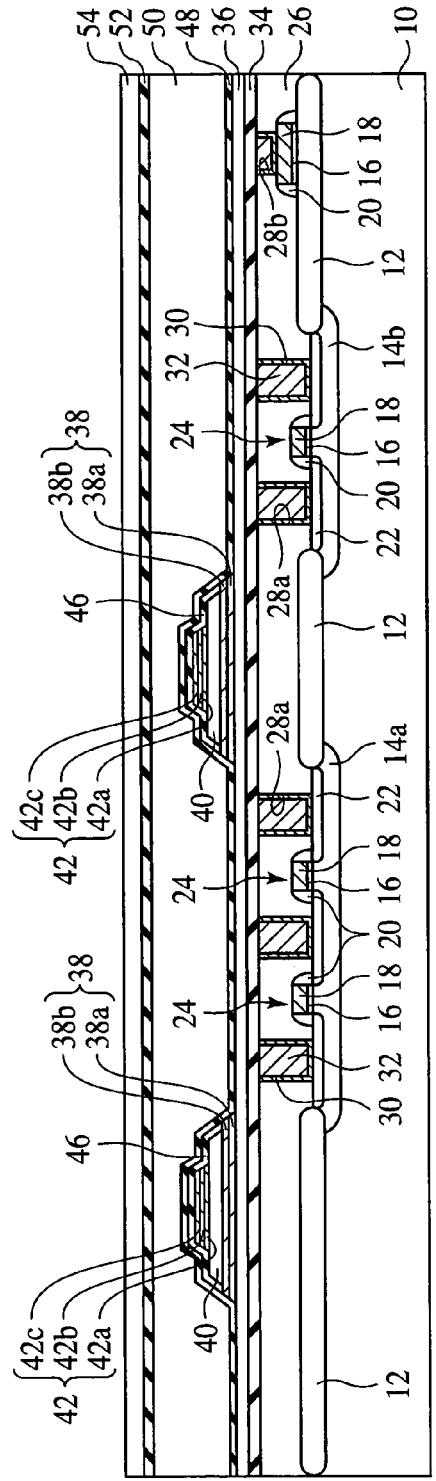

Then, as illustrated in FIG. 12B, the hydrogen diffusion preventing film 52 is formed by, e.g., sputtering or CVD. The hydrogen diffusion preventing film 52 is a 50-100 nm-thickness aluminum oxide film. When the hydrogen diffusion preventing film 52 is formed, it is preferable to form the hydrogen diffusion film 52 under conditions which make the film stress of the hydrogen diffusion preventing film 52 is 5×10$^8$ dyn/cm$^2$ or below. The hydrogen diffusion preventing film 52 is formed under conditions which make the film stress becomes so relatively small for the purpose of, as described above, preventing the decrease of the switching charge quantity Q$_{SW}$ of the capacitors 44. Since the hydrogen diffusion preventing film 52 is formed on the planarized inter-layer insulation film 50, the hydrogen diffusion preventing film 52 is flat.

Then, the insulation film 54 is formed by plasma TEOS CVD. The insulation film 54 is, e.g., a 200-300 nm-thickness silicon oxide film.

The insulation film 54 is formed of silicon oxide film here. However, the insulation film 54 is not essentially formed of silicon oxide film. The insulation film 54 may be formed of, e.g., SiON film or silicon nitride film.

Figure 13A:
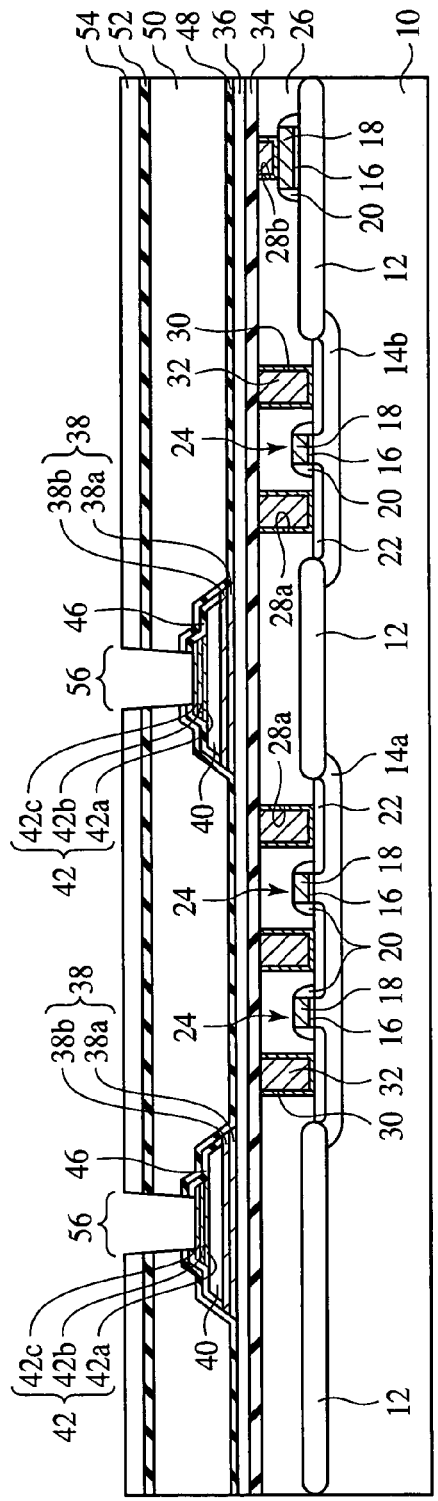
FIGS. 13A and 13B are sectional views of the semiconductor device according to the first embodiment of the present invention in the steps of the method for fabricating the semiconductor device, which illustrate the method (Part 9).

Next, as illustrated in FIG. 13A, the contact holes 56 and contact holes (not illustrated) are formed by photolithography in the insulation film 54, the hydrogen diffusion preventing film 52 and the inter-layer insulation film 50 respectively down to the upper electrodes 42 of the capacitors 44 and down to the lower electrodes 38 of the capacitors 44.

Then, thermal processing is made in an oxygen atmosphere. This thermal processing is for supplying oxygen to the dielectric film 40 of the capacitors 44 to recover the electric characteristics of the capacitors 44. The substrate temperature for the thermal processing is, e.g., 500-600° C. The thermal processing period of time is, e.g., 60 minutes.

The thermal processing is made in an oxygen atmosphere here but may be made in an ozone atmosphere. In the thermal processing in an ozone atmosphere, oxygen can be supplied to the dielectric film 40 of the capacitors 44, and the electric characteristics of the capacitors 44 can be recovered.

Figure 13B:
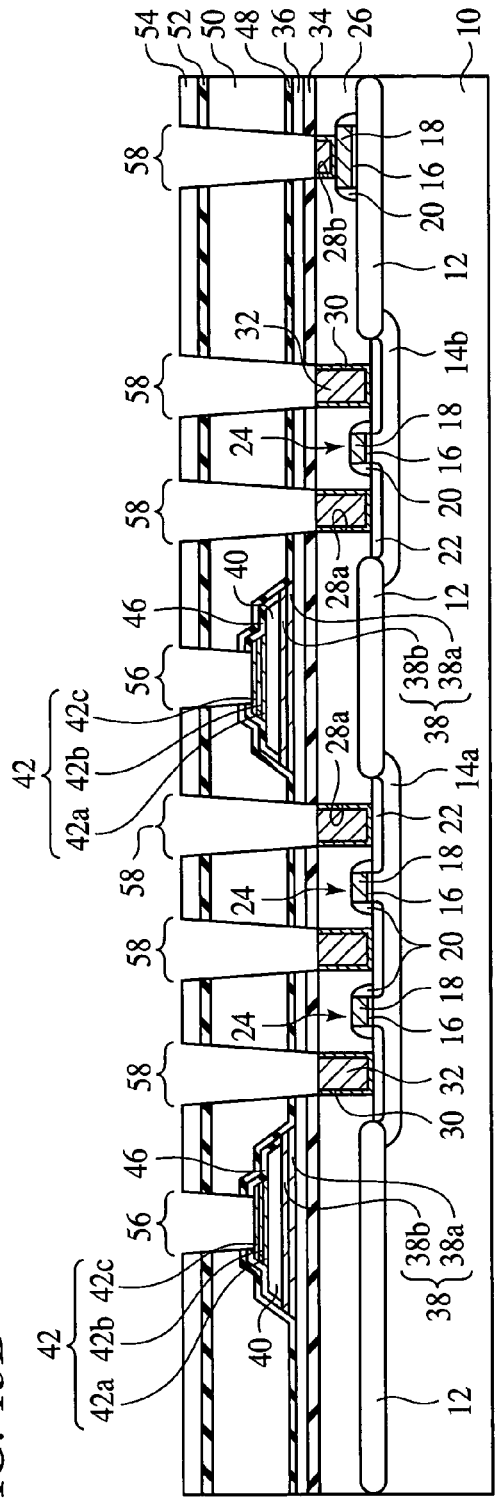

Then, as illustrated in FIG. 13B, by photolithography the contact holes 58 are formed in the insulation film 54, the hydrogen diffusion preventing film 52, the inter-layer insulation film 50 and the hydrogen diffusion preventing film 48, the silicon oxide film 36 and the oxidation preventing film 34 down to the conductor plugs 32.

Next, plasma cleaning using argon gas is performed. This removes the natural oxide film, etc. present on the surfaces of the conductor plugs 32. Conditions for the plasma cleaning are those which remove the thermal oxide film by, e.g., 10 nm.

Then, as illustrated in FIG. 14A, a 20-100 nm-thickness TiN film is formed on the entire surface by, e.g., sputtering. Thus, the barrier metal 60 of the TiN film is formed.

Next, a 300-600 nm-thickness tungsten film 62 is formed on the entire surface by, e.g., CVD.

Then, the tungsten film 62 and the barrier metal film 60 are polished by, e.g., CMP until the surface of the insulation film 54 is exposed. Thus, the conductor plugs 62 of the tungsten are buried in the contact holes 56, 58.

Then, thermal processing is made in a plasma atmosphere generated by using N$_2$O gas or others. This thermal processing removes water which has intruded into the inter-layer insulation films 54, 50 in polishing the tungsten film 62, etc. by CMP while changing the film quality of the inter-layer insulation film 54 to thereby make the interlayer insulation film 54 difficult for water to intrude into. The substrate temperature for the thermal processing is, e.g., 350° C. The flow rate of the N$_2$O gas is, e.g., 1000 sccm. The flow rate of the N$_2$ gas is, e.g., 285 sccm. The gap between the opposed electrodes is, e.g., 300 mils. The radio-frequency electric power is, e.g., 525 W. The air pressure in the chamber is, e.g., 3 Torr.

The thermal processing is made in a plasma atmosphere generated by using N$_2$O gas or others here. However, the inter-layer insulation film 54 may be exposed to a plasma atmosphere generated by using N$_2$O gas or others.

Next, plasma cleaning using argon gas is performed. This removes the natural oxide film, etc. present on the surfaces of the conductor plugs 62. Conditions for the plasma cleaning are those which remove the thermal oxide film by, e.g., 10 nm.

Then, a 60 nm-thickness Ti film, a 30 nm-thickness TiN film, a 360 nm-thickness AlCu alloy film, a 5 nm-thickness Ti film and a 70 nm-thickness TiN film are sequentially formed by, e.g., sputtering. Thus, the layer film 64 of the Ti film, the TiN film, AlCu alloy film, the Ti film and the TiN film is formed.

Next, the layer film 64 is patterned by photolithography. The interconnection (the first metal interconnection layer) 64 of the layer film is thus formed (see FIG. 14B).

Figure 15:
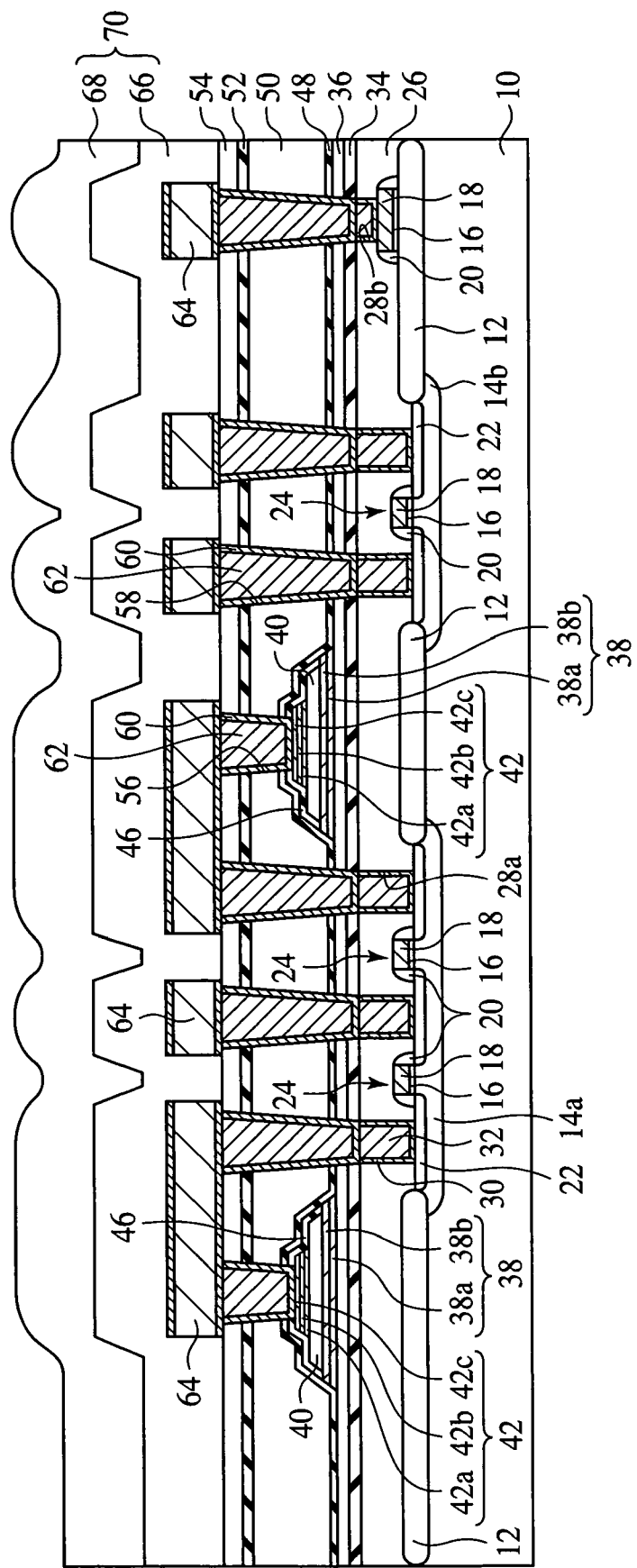
FIG. 15 is a sectional view of the semiconductor device according to the first embodiment of the present invention in the step of the method for fabricating the semiconductor device, which illustrates the method (Part 11).

Next, as illustrated in FIG. 15, a 750 nm-thickness silicon oxide film 66 is formed by, e.g., high density plasma enhanced CVD.

Next, the silicon oxide film 68 of, e.g., a 1100 nm-thickness is formed by plasma TEOS CVD. The raw material gas is, e.g., a mixed gas of TEOS gas, oxygen gas and helium gas. The silicon oxide film 66 and the silicon oxide film 68 form the inter-layer insulation film 70.

The silicon oxide film 66 is formed by high density plasma enhanced CVD, and then the silicon oxide film 68 is formed by plasma TEOS CVD here. The processes for forming the silicon oxide film 66 and the silicon oxide film 68 are not limited to the above. For example, the silicon oxide film 66 and the silicon oxide film 68 may be both formed by plasma TEOS CVD.

Figure 16:
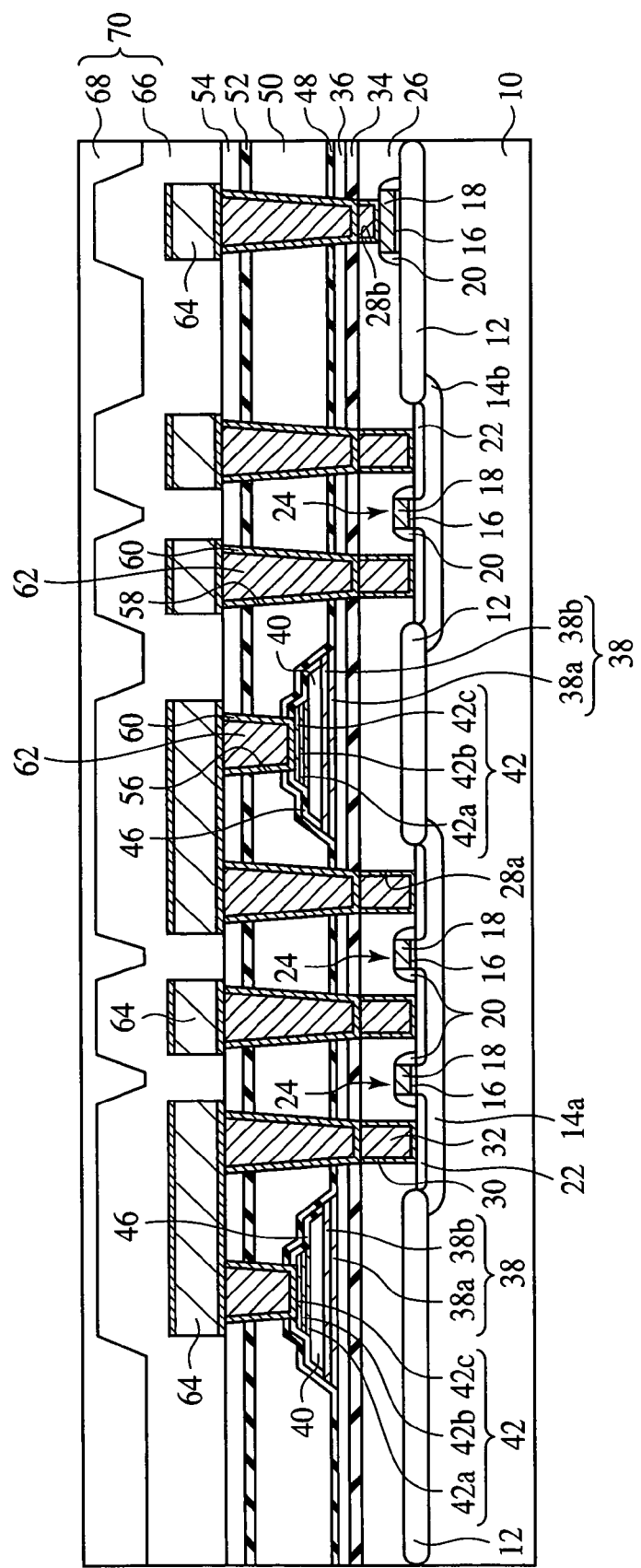
FIG. 16 is a sectional view of the semiconductor device according to the first embodiment of the present invention in the step of the method for fabricating the semiconductor device, which illustrates the method (Part 12).
Figure 17:
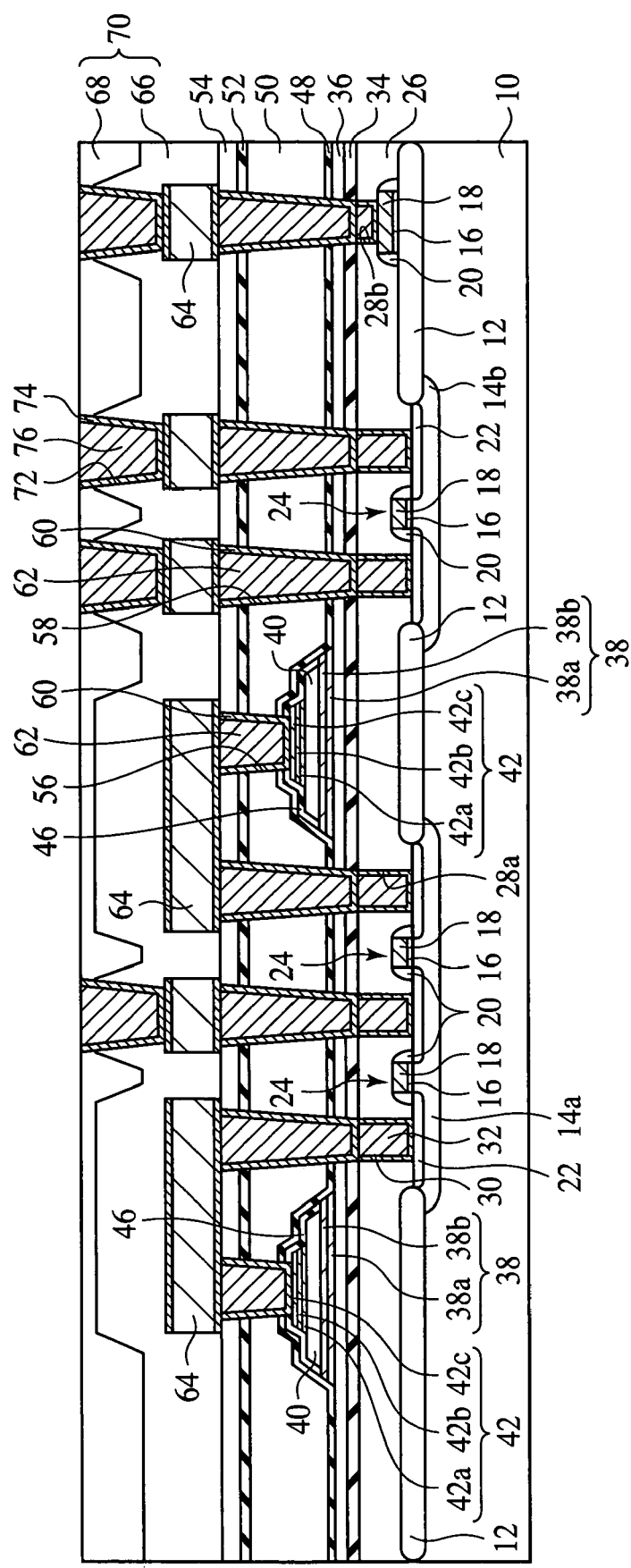
FIG. 17 is a sectional view of the semiconductor device according to the first embodiment of the present invention in the step of the method for fabricating the semiconductor device, which illustrates the method (Part 13).
Figure 18:
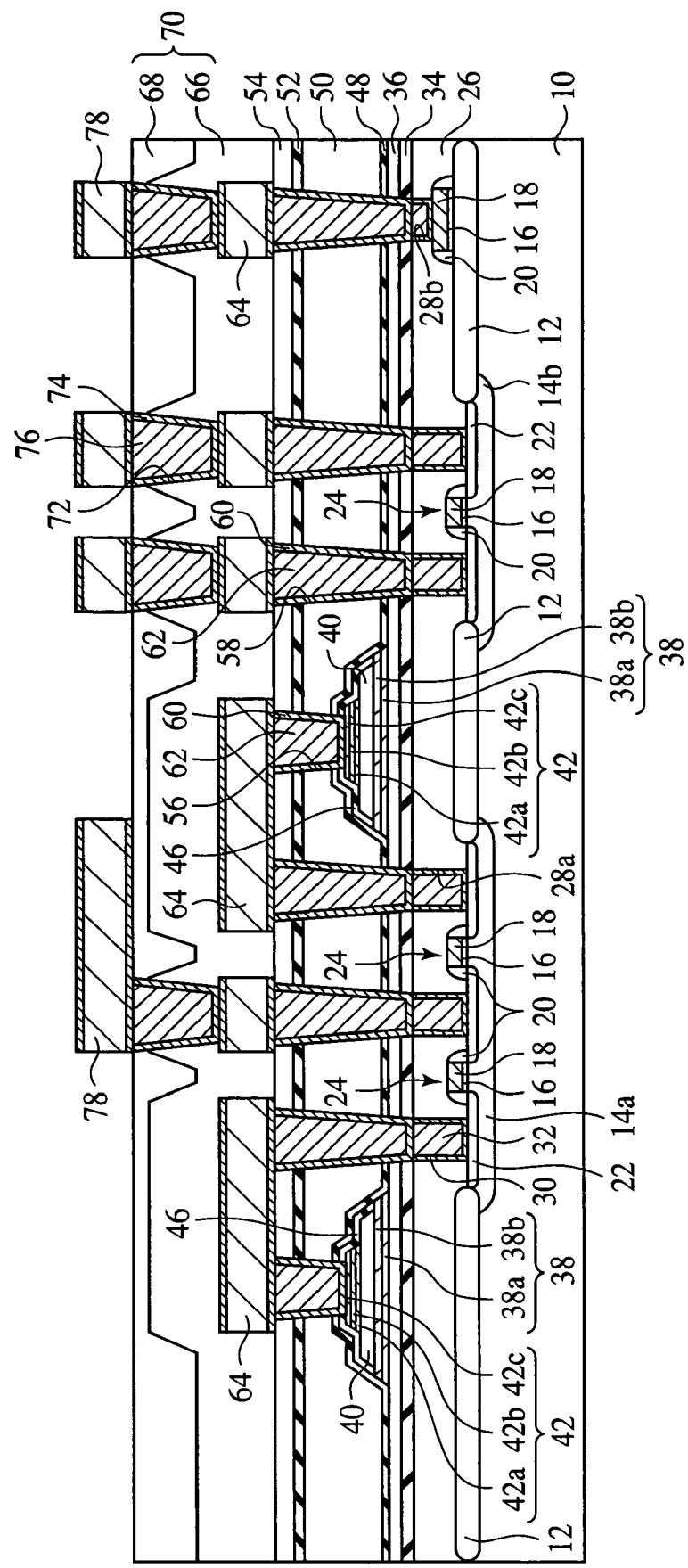
FIG. 18 is a sectional view of the semiconductor device according to the first embodiment of the present invention in the step of the method for fabricating the semiconductor device, which illustrates the method (Part 14).

Next, as illustrated in FIG. 16, the surface of the silicon oxide film 68 is planarized by, e.g., CMP.

Then, thermal processing is made in a plasma atmosphere generated by using N$_2$O gas or others. This thermal processing removes water in the inter-layer insulation film 70 while changing the film quality of the inter-layer insulation film 70 to thereby make the inter-layer insulation film 70 difficult for water to intrude into. The substrate temperature in the thermal processing is, e.g., 350° C. The flow rate of the N$_2$O gas is, e.g., 1000 sccm. The flow rate of the N$_2$ gas is, e.g., 285 sccm. The gap between the opposed electrodes is, e.g., 300 mils. The radio-frequency electric power to be applied is, e.g., 525 W. The air pressure in the chamber is, e.g., 3 Torr.

The thermal processing is made here in a plasma atmosphere generated by using N$_2$O gas or others. However, after the thermal processing, the inter-layer insulation film 70 may be exposed to a plasma atmosphere generated by using N$_2$O gas or others.

Next, the contact holes 74 are formed in the inter-layer insulation film 70 down to the interconnection 64 by photolithography.

Next, plasma cleaning using argon gas is performed. Natural oxide film, etc. present on the surface of the interconnection 64 are removed by the cleaning. Conditions for the plasma cleaning is made under conditions which remove the thermal oxide film 25 by, e.g., 25 nm.

Next, a 10 nm-thickness Ti film is formed by sputtering.

Then, a 3.5-7 nm-thickness TiN film is formed by, e.g., MOCVD. The Ti film and the TiN film form the barrier metal film 74.

Next, the tungsten film of a 300-600 nm-thickness is formed by, e.g., CVD.

Next, the tungsten film 76 and the barrier metal film 74 are polished by, e.g., CMP until the surface of the inter-layer insulation film 70 is exposed. The conductor plugs 76 of the tungsten are thus buried in the contact holes 72 (see FIG. 17).

Then, thermal processing is made in a plasma atmosphere generated by using $N_2O$ gas or others. This thermal processing removes water which has intruded into the inter-layer insulation film 70 in polishing the tungsten film 76, etc. by CMP while changing the film quality of the inter-layer insulation film 70 to thereby make the inter-layer insulation film 70 difficult for water to intrude into. The substrate temperature in the thermal processing is, e.g., 350° C. The flow rate of the $N_2O$ gas is, e.g., 1000 sccm. The flow rate of the $N_2$ gas is, e.g., 285 sccm. The gap between the opposed electrodes is, e.g., 300 mils. The radio-frequency electric power to be applied is, e.g., 525 W. The air pressure in the chamber is, e.g., 3 Torr.

The thermal processing is made in a plasma atmosphere generated by using $N_2O$ gas or others. However, after the thermal processing has been made, the inter-layer insulation film 70 may be exposed to a plasma atmosphere generated by using $N_2O$ gas or others.

Next, a 60 nm-thickness Ti film, a 30 nm-thickness TiN film, a 360 nm-thickness AlCu alloy film, a 5 nm-thickness Ti film and a 70 nm-thickness TiN film are sequentially formed by, e.g., sputtering. Thus, the layer film 78 is formed of the Ti film, the TiN film, the AlCu alloy film, the Ti film and the TiN film.

Next, the layer film 78 is patterned by photolithography. Thus, the interconnection (the second metal interconnection) 78 of the layer film is formed (see FIG. 18).

Next, the silicon oxide film 80 of a 750 nm-thickness is formed by, e.g., high density plasma enhanced CVD.

Next, the silicon oxide film 82 of, a 1100 nm-thickness is formed by plasma TEOS CVD. The silicon oxide film 80 and the silicon oxide film 82 form the inter-layer insulation film 84.

The silicon oxide film 80 is formed by high density plasma enhanced CVD, and then the silicon oxide film 82 is formed by plasma TEOS CVD here. However, the processes for forming the silicon oxide film 80 and the silicon oxide film 82 are not essentially limited to them. For example, the silicon oxide film 80 and the silicon oxide film 82 maybe both formed by plasma TEOS CVD.

Figure 19:
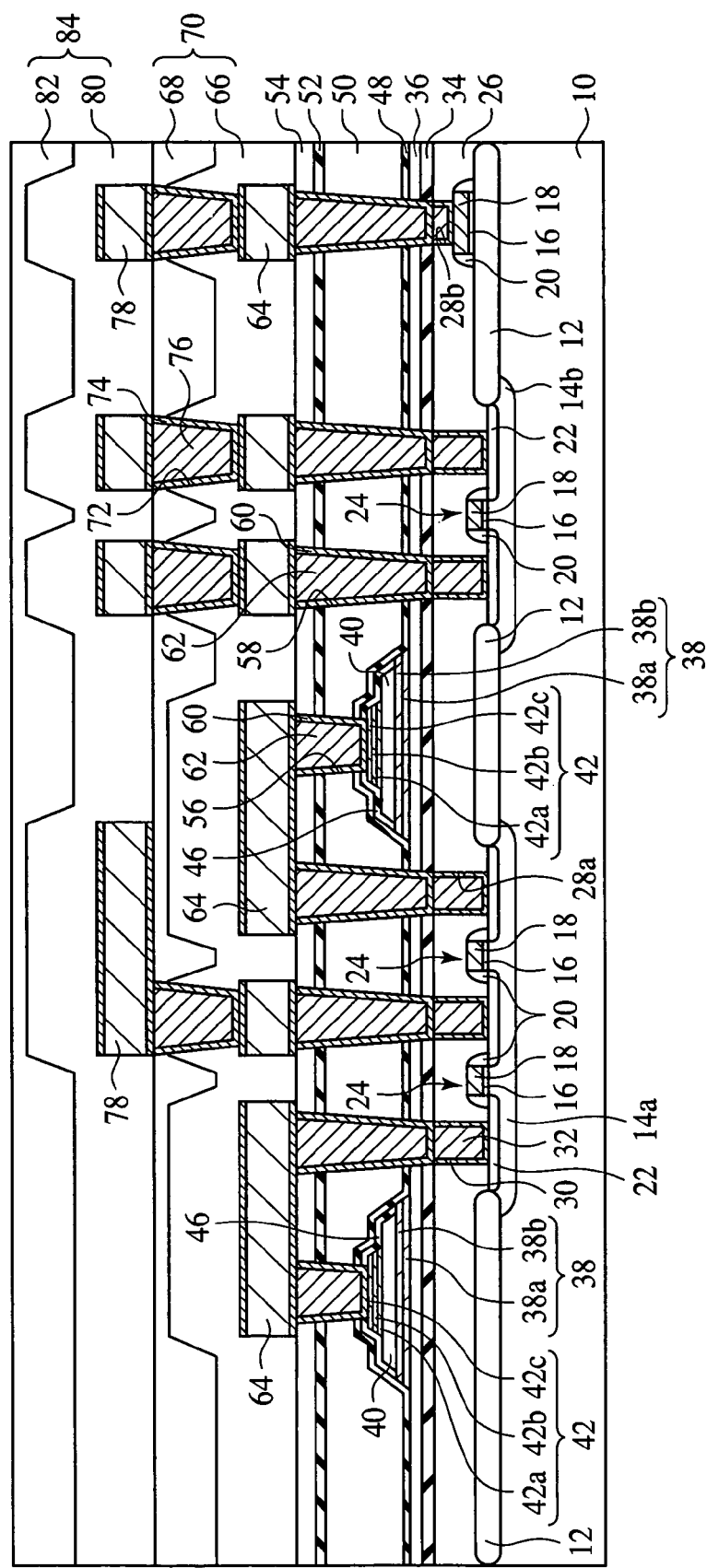
FIG. 19 is a sectional view of the semiconductor device according to the first embodiment of the present invention in the step of the method for fabricating the semiconductor device, which illustrates the method (Part 15).
Figure 20:
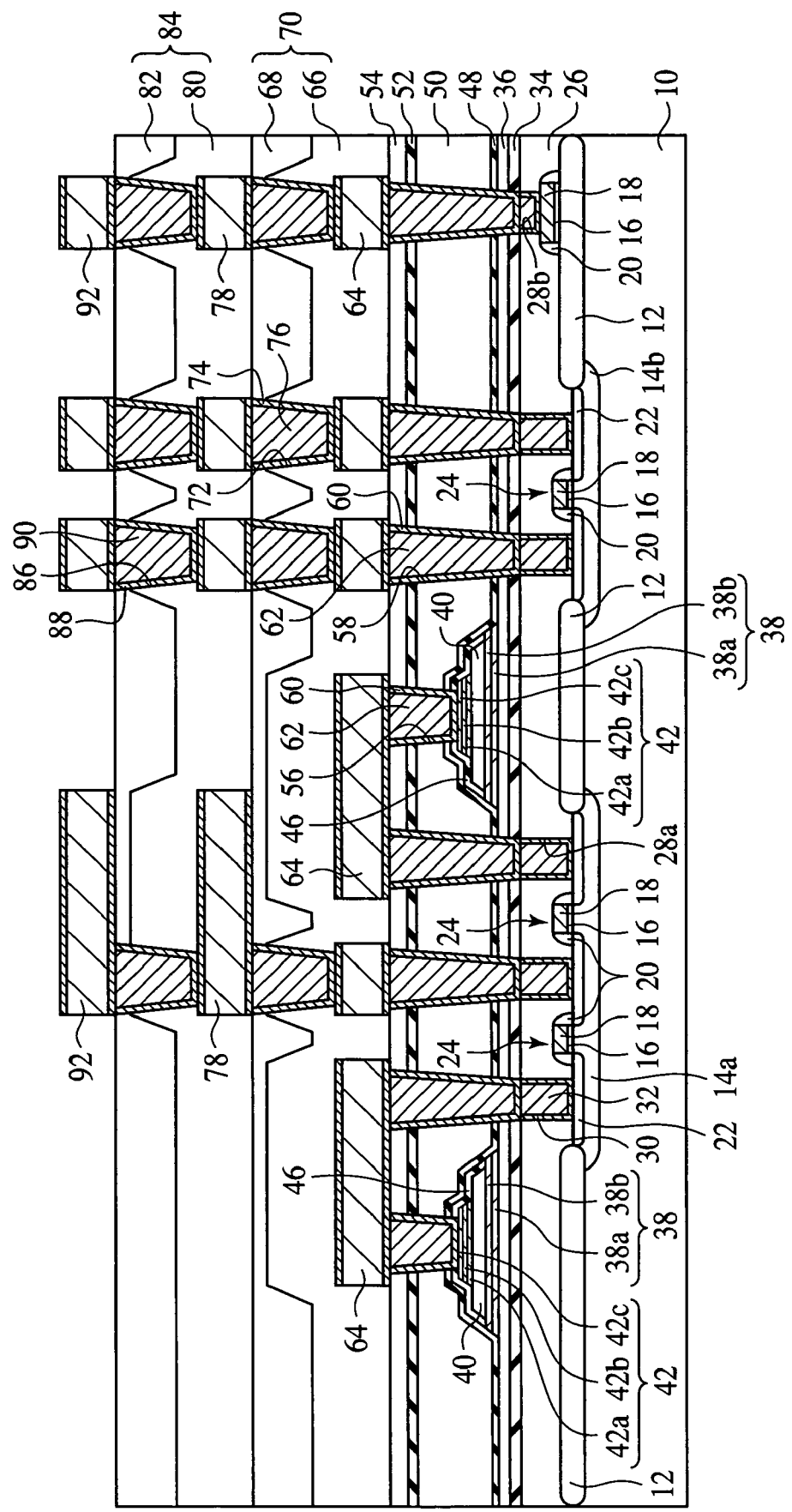
FIG. 20 is a sectional view of the semiconductor device according to the first embodiment of the present invention in the step of the method for fabricating the semiconductor device, which illustrates the method (Part 16).
Figure 21:
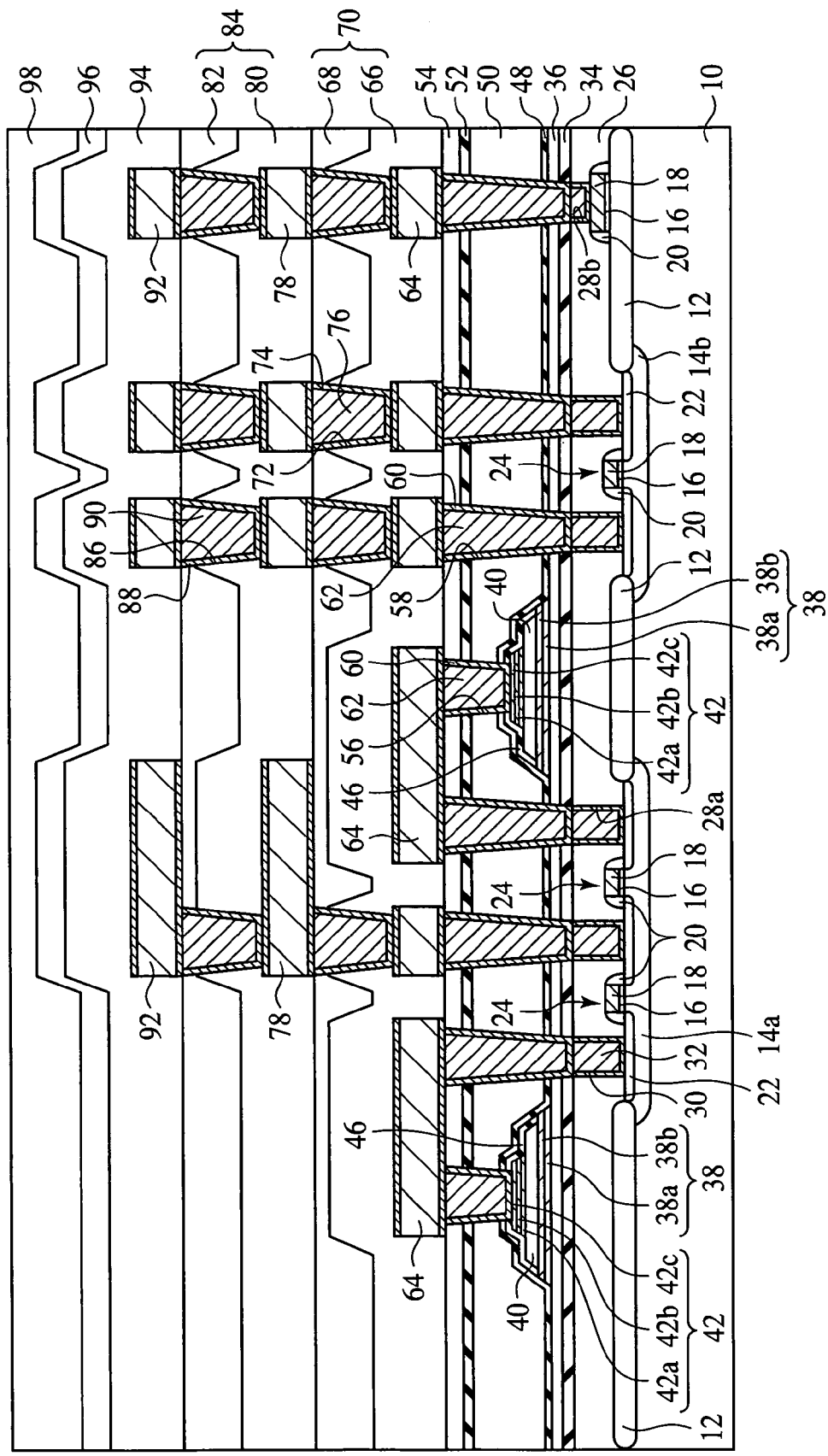
FIG. 21 is a sectional view of the semiconductor device according to the first embodiment of the present invention in the step of the method for fabricating the semiconductor device, which illustrates the method (Part 17).

Next, the surface of the silicon oxide film 82 is planarized by, e.g., CMP (see FIG. 19).

Then, thermal processing is made in a plasma atmosphere generated by using $N_2O$ gas or others. This thermal processing is for removing water in the inter-layer insulation film 84 while changing the film quality of the inter-layer insulation film 84 to thereby make the inter-layer insulation film 84 difficult for water to introduce into. The substrate temperature in the thermal processing is, e.g., 350° C. The flow rate of $N_2O$ gas is, e.g., 1000 sccm. The flow rate of $N_2$ gas is, e.g., 285 sccm. The gap between the opposed electrodes is, e.g., 300 mils. The radio-frequency electric power to be applied is, e.g., 525 W. The air pressure in the chamber is, e.g., 3 Torr.

The thermal processing is made in a plasma atmosphere generated by using $N_2O$ gas or others. However, after the thermal processing has been made, the inter-layer insulation film 84 may be exposed to a plasma atmosphere generated by using $N_2O$ gas or others.

Next, the contact holes 86 are formed in the inter-layer insulation film 84 down to the interconnection 78 by photolithography.

Next, plasma cleaning with argon gas is performed. This cleaning removes natural oxide film, etc. present on the surface of the interconnection 78. Conditions for the plasma cleaning are those which remove the thermal oxide film by, e.g., 25 nm.

Next, a 10 nm-thickness Ti film is formed by, e.g., sputtering.

Next, a 3.5-7 nm-thickness TiN film is formed by, e.g., MOCVD. The Ti film and the TiN film form the barrier metal film 88.

Next, the tungsten film 90 of, e.g., a 300-600 nm-thickness is formed by, e.g., CVD.

Next, the tungsten film 90 and the barrier metal film 88 are polished by, e.g., CMP until the surface of the inter-layer insulation film 84 is exposed. The conductor plugs 90 of the tungsten are thus buried in the contact holes 86.

Next, thermal processing is made in a plasma atmosphere generated by using $N_2O$ gas or others. This thermal processing is for removing water which has introduced into the inter-layer insulation film 84 in polishing the tungsten film 90, etc. by CMP while changing the film quality of the inter-layer insulation film 84 to thereby make the inter-layer insulation film 84 difficult for water to intrude into. The substrate temperature in the thermal processing is, e.g., 350° C. The flow rate of the $N_2O$ gas is, e.g., 1000 sccm. The flow rate of the $N_2$ gas is, e.g., 285 sccm. The gap between the opposed electrodes is, e.g., 300 mils. The radio-frequency electric power to be applied is, e.g., 525 W. The air pressure in the chamber is, e.g., 3 Torr.

The thermal processing is made in a plasma atmosphere generated by using $N_2O$ gas or others. However, after the thermal processing has been made, the inter-layer insulation film 84 may be exposed to a plasma atmosphere generated by using $N_2O$ gas or others.

Then, a 60 nm-thickness Ti film, a 30 nm-thickness TiN film, a 360 nm-thickness AlCu alloy film, a 5 nm-thickness Ti film, a 70 nm-thickness TiN film are sequentially formed by, e.g., sputtering. Thus, the layer film 92 of the Ti film, the TiN film, the AlCu alloy film, the Ti film and the TiN film is formed.

Next, the layer film 92 is patterned by photolithography. The interconnection (the third metal interconnection) 92 of the layer film is formed (see FIG. 20).

Next, the silicon oxide film 94 of a 700 nm-thickness is formed by, e.g., high density plasma enhanced CVD.

The silicon oxide film 94 is formed here by high density plasma enhanced CVD. However, the process for forming the silicon oxide film 94 is not essentially limited to the high density plasma enhanced CVD. The silicon oxide film 94 may be formed by plasma TEOS CVD.

Next, thermal processing is made in a plasma atmosphere generated by using $N_2O$ gas or others. This thermal processing is for removing water, etc. from the insulation film 94 while changing the film quality of the insulation film 94 to thereby make the insulation film 94 difficult for water to intrude into. The substrate temperature in the thermal processing is, e.g., 350° C. The flow rate of the $N_2O$ gas is, e.g., 1000 sccm. The flow rate of the $N_2$ gas is, e.g., 285 sccm. The gap between the opposed electrodes is, e.g., 300 mils. The radio-frequency electric power to be applied is, e.g., 525 W. The air pressure in the chamber is, e.g., 3 Torr.

The thermal processing is made in a plasma atmosphere generated by using $N_2O$ gas or others. However, after the thermal processing is made, the insulation film 94 may be exposed to a plasma atmosphere generated by using $N_2O$ gas or others.

Then, the silicon nitride film 96 of a 500 nm-thickness is formed by, e.g., CVD. The silicon nitride film 96 is for shutting off water to thereby prevent the corrosion of the interconnections 64, 78, 96, etc. with water.

Then, openings (not illustrated) are formed in the silicon nitride film 96 and the silicon oxide film 94 down to the electrode pads (not illustrated) by photolithography.

Next, the polyimide film 98 of, e.g., a 2-10 μm-thickness is formed by spin coating.

Then, openings (not illustrated) are formed in the polyimide film 79 down to the electrode pads (not illustrated) by photolithography.

Thus, the semiconductor device according to the present embodiment is fabricated.

(Modification 1)

Figure 23:
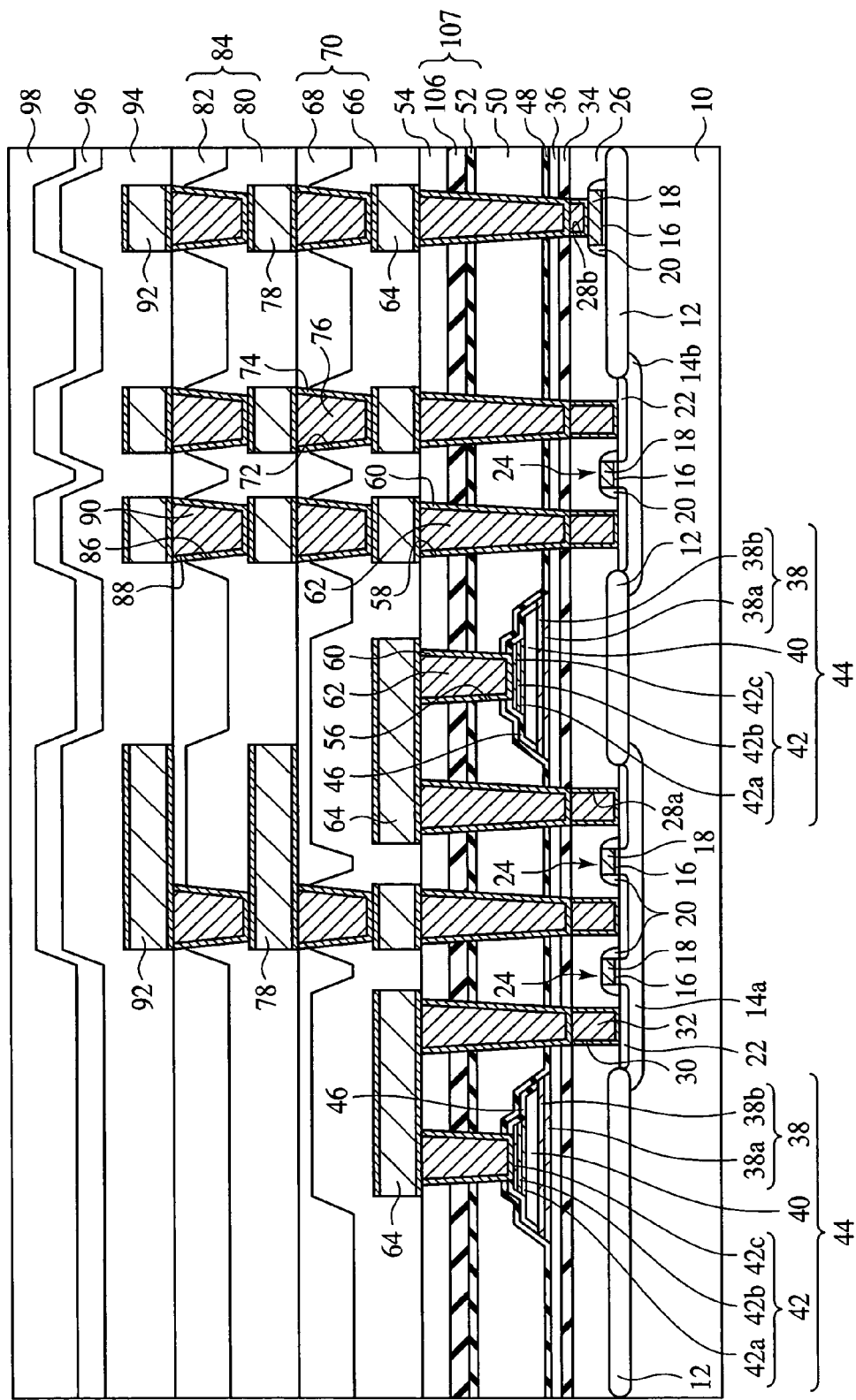
FIG. 23 is a sectional view of the semiconductor device according to Modification 1 of the first embodiment of the present invention.

Then, the semiconductor device according to one modification (Modification 1) of the present embodiment will be explained with reference to FIG. 23. FIG. 23 is a sectional view of the semiconductor device according to the present modification.

The semiconductor device according to the present modification is characterized mainly in that the semiconductor device includes a hydrogen diffusion preventing film 107 formed of a layer film.

As illustrated in FIG. 23, the hydrogen diffusion preventing film 52 is formed on the inter-layer insulation film 50. The hydrogen diffusion preventing film 52 is formed of, e.g., a 50 nm-thickness aluminum oxide film.

Another hydrogen diffusion preventing film 106 is formed on the hydrogen diffusion preventing film 52. The hydrogen diffusion preventing film 106 is formed of a silicon nitride film of, e.g., a 50-100 nm-thickness. Thus, the hydrogen diffusion preventing film 107 is formed of layer film of the hydrogen diffusion preventing film 52 and the hydrogen diffusion preventing film 106.

The insulation film 54 is formed on the hydrogen diffusion preventing film 106.

As described above, the hydrogen diffusion preventing film 107 may be formed of the layer film. According to the present modification, the hydrogen diffusion preventing film is formed of the layer film 107, whereby the arrival of the hydrogen and the water at the dielectric film 40 of the capacitors 44 can be prevented without failure. Thus, According to the present modification, the semiconductor device including the capacitors 44 can have higher yields.

Said another hydrogen diffusion preventing film 106 is laid on the hydrogen diffusion preventing film 52 here, but the hydrogen diffusion preventing film 106 may be formed below the hydrogen diffusion preventing film 52. Even with the hydrogen diffusion preventing film 107 formed of the layer film structure of the hydrogen diffusion preventing film 106 formed below the hydrogen diffusion preventing film 52, the arrival of the hydrogen and the water at the dielectric film 40 of the capacitors 44 can be prevented without failure, as in the semiconductor device illustrated in FIG. 23.

(Modification 2)

Figure 24:
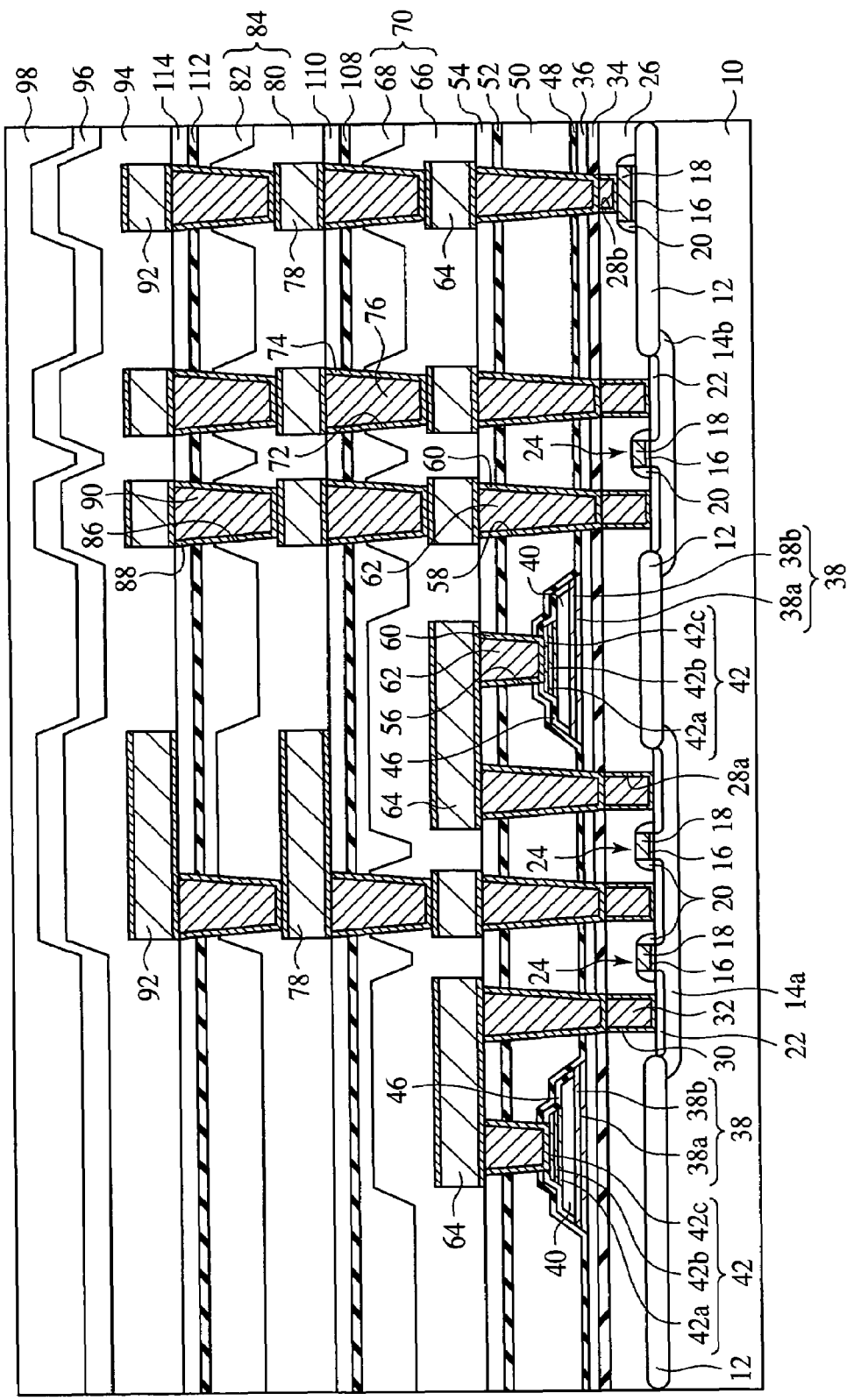
FIG. 24 is a sectional view of the semiconductor device according to Modification 2 of the first embodiment of the present invention.

Next, the semiconductor device according to a modification (Modification 2) of the present embodiment will be explained with reference to FIG. 24. FIG. 24 is a sectional view of the semiconductor device according to the present modification.

The semiconductor device according to the present modification is characterized mainly in that a hydrogen diffusion preventing film 108 is further formed between the inter-layer insulation film 70 and the second metal interconnection layer 78, and a hydrogen diffusion preventing film 112 is further formed between the inter-layer insulation film 84 and the third metal interconnection layer 92.

As illustrated in FIG. 24, the hydrogen diffusion preventing film 108 is formed on the planarized inter-layer insulation film 70. The hydrogen diffusion preventing film 108 is an aluminum oxide film of, e.g., a 50 nm-thickness. Since the hydrogen diffusion preventing film 108 is formed on the inter-layer insulation film 70 having the surface planarized, the hydrogen diffusion preventing film 108 is flat.

An insulation film 110 is formed on the hydrogen diffusion preventing film 108. The insulation film 110 is a silicon oxide film of, e.g., a 100 nm-thickness.

The interconnection 78 is formed on the insulation film 110.

The hydrogen diffusion preventing film 112 is formed on the planarized inter-layer insulation film 84. The hydrogen diffusion preventing film 112 is an aluminum oxide film of, e.g., a 50 nm-thickness. The hydrogen diffusion preventing film 112 is formed on the inter-layer insulation film 84 having the surface planarized, and the hydrogen diffusion preventing film 112 is planarized.

An insulation film 114 is formed on the hydrogen diffusion preventing film 112. The insulation film 114 is a silicon oxide film of, e.g., a 100 nm-thickness.

The interconnection 92 is formed on the insulation film 114.

Thus, the semiconductor device according to the present modification is constituted.

According to the present modification, the hydrogen diffusion preventing film 52 is formed between the inter-layer insulation film 50 and the first metal interconnection layer 64, and the hydrogen diffusion preventing films 108, 112 are formed respectively between the inter-layer insulation film 70 and the second metal interconnection layer 78 and between the inter-layer insulation film 84 and the third metal interconnection layer 92, whereby the arrival of the hydrogen and the water at the dielectric film 40 of the capacitors 44 can be prevented without failure. Thus, according to the present modification, the semiconductor device including the capacitors 44 can have high yields.

(Modification 3)

Figure 25:
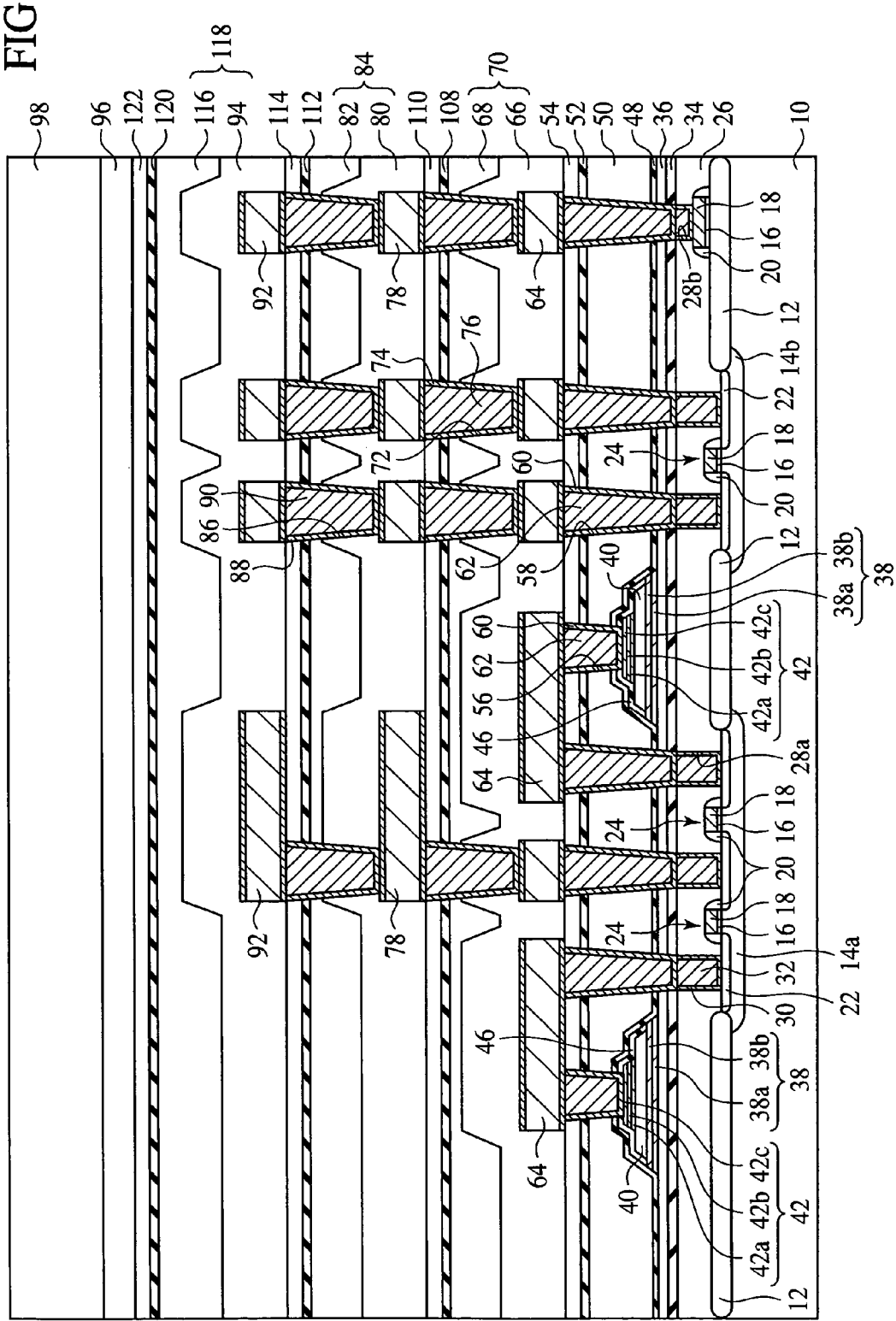
FIG. 25 is a sectional view of the semiconductor device according to Modification 3 of the first embodiment of the present invention.

Next, the semiconductor device according to one modification (Modification 3) of the present embodiment will be explained with reference to FIG. 25. FIG. 25 is a sectional view of the semiconductor device according to the present modification.

The semiconductor device according to the present modification is characterized mainly in that even the surface of an inter-layer insulation film 118 covering the interconnection layer 92, which is the uppermost interconnection layer, is planarized, and a hydrogen diffusion preventing film 120 is formed further on the planarized inter-layer insulation film 118.

As illustrated in FIG. 25, a silicon oxide film 116 is formed on the silicon oxide film 94 formed, covering the uppermost interconnection 92. The silicon oxide film 94 and the silicon oxide film 116 form the inter-layer insulation film 118. The surface of the inter-layer insulation film 118 is planarized.

A hydrogen diffusion preventing film 120 is formed on the planarized inter-layer insulation film 118. The hydrogen diffusion preventing film 120 is an aluminum oxide film of, e.g., a 50 nm-thickness. Since the hydrogen diffusion preventing film 120 is formed on the planarized inter-layer insulation film 118, the hydrogen diffusion preventing film 120 is flat.

An insulation film 122 is formed on the hydrogen diffusion preventing film 120. The insulation film 122 is a silicon oxide film of, e.g., a 100 nm-thickness.

The silicon nitride film 96 is formed on the insulation film 122.

The polyimide film 98 is formed on the silicon nitride film 96.

Thus, the semiconductor device according to the present modification is constituted.

According to the present modification, the flat hydrogen diffusion preventing film 120 is formed also on the inter-layer insulation film 118 covering the upper most interconnection 92, whereby the arrival of the hydrogen and the water at the dielectric film 40 of the capacitors 44 can be prevented without failure. Thus, according to the present modification, semiconductor device including the capacitors 44 can be provided with further high yields.

A Second Embodiment

As described above, the flat barrier film (the hydrogen diffusion preventing film) 52 for preventing the diffusion of the hydrogen and the water is formed over the capacitors, whereby the arrival of the hydrogen and the water at the capacitors 44 can be prevented without failure.

However, when such barrier film 52 is simply formed, often the switching charge quantity $Q_{SW}$ of the capacitors 44 is decreased. Such decrease of the switching charge quantity $Q_{SW}$ of the capacitors 44 will be due to large stresses generated by forming the barrier film 52, which are exerted to the capacitors 44, blocking the polarization of the ferroelectric film 40 of the capacitors 44.

The inventors of the present application made earnest studies and have got the idea that a hydrogen/water diffusion preventing film having the function of preventing the diffusion of the hydrogen and the water and a stress mitigating layer for mitigating the stress of the hydrogen/water diffusion preventing film are laid one on another to form a barrier film. The hydrogen/water diffusion preventing film for preventing the diffusion of the hydrogen and the water, and the stress mitigating film for mitigating the stress due to the hydrogen/water diffusion preventing film are laid one on another to thereby make the stress due to the barrier film small, and the application of large stresses to the capacitors can be prevented. Then, the polarization in the dielectric film of the capacitors is not easily blocked, and the decrease of the switching charge quantity $Q_{SW}$ can be prevented. According to the present invention, the semiconductor device can prevent the decrease of the switching charge $Q_{SW}$ of the capacitor and can have high reliability.

Figure 26:
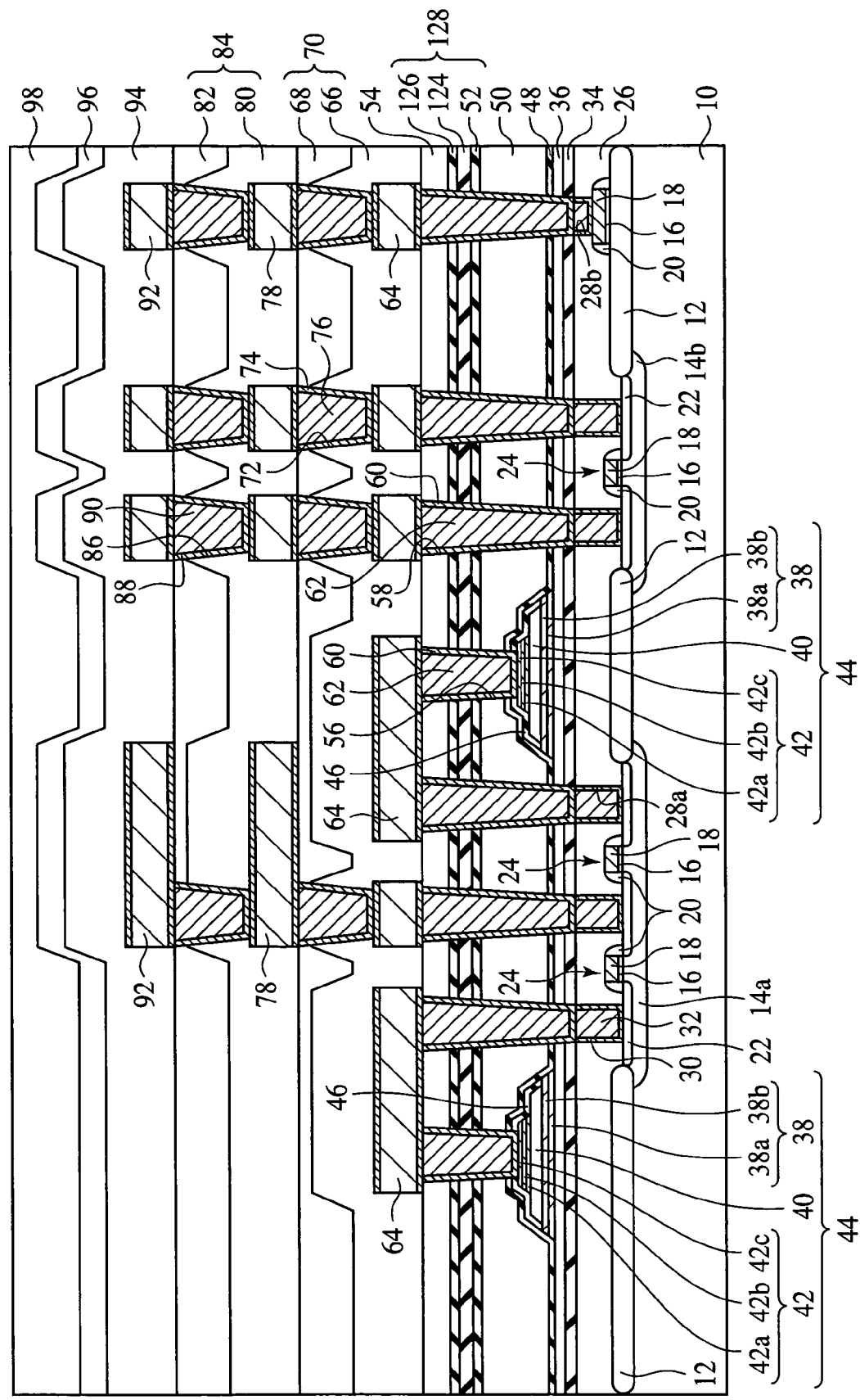
FIG. 26 is a sectional view of the semiconductor device according to a second embodiment of the present invention.

The semiconductor device according to the second embodiment of the present invention and the method for fabricating the semiconductor device will be explained with reference to FIGS. 26 to 28. FIG. 26 is a sectional view of the semiconductor device according to the present embodiment. The same members of the present embodiment as those of the semiconductor device according to the first embodiment and the method for fabricating the semiconductor device illustrated in FIGS. 1 to 25 are represented by the same reference numbers not to repeat or to simplify their explanation.

(The Semiconductor Device)

First, the semiconductor device according to the present embodiment will be explained with reference to FIG. 26.

As illustrated in FIG. 26, on the planarized inter-layer insulation film 50, the hydrogen/water diffusion preventing film 52 for preventing the diffusion of the water and the hydrogen is formed. The hydrogen/water diffusion preventing film 52 is, e.g., a hydrogen/water diffusion preventing film of, e.g., a metal oxide film. The metal oxide film forming the hydrogen/water diffusion preventing film 52 is, e.g., aluminum oxide film. The film thickness of the hydrogen/water diffusion preventing film 52 is, e.g., about 20-30 nm. The film thickness of the hydrogen/water diffusion preventing film is set so relatively small so as to make the stress due to the hydrogen/water diffusion preventing film 52 small.

The hydrogen/water diffusion preventing film 52 is aluminum oxide film here but is not essentially aluminum oxide film. For example, the hydrogen/water diffusion preventing film 52 maybe another metal oxide. For example, titanium oxide film or others may be used as the hydrogen/water diffusion preventing film.

A stress mitigating film 124 is formed on the hydrogen/water diffusion preventing film 52. The stress mitigating film 124 is for mitigating the stresses of the hydrogen/water diffusion preventing films 52, 126. For example, when the thermal expansion coefficients of the hydrogen/water diffusion preventing films 52, 126 are larger than those of the inter-layer insulation film 50, etc., a material whose thermal expansion coefficient is smaller than that of the inter-layer insulation film 50 is used as the stress mitigating film 124. When the thermal expansion coefficients of the hydrogen diffusion preventing films 52, 126 are smaller than the thermal expansion coefficient of the inter-layer insulation film 50, a material whose thermal expansion coefficient is larger than the thermal expansion coefficients of the inter-layer insulation film 50, etc. is used as the stress mitigating film 124. The hydrogen diffusion preventing films 52, 126 and the stress mitigating film 124 are suitably combined, whereby the difference in the thermal expansion coefficient between the inter-layer insulation film 50, etc. and the barrier film 128 can be small, and the stress due to the barrier film 128 can be small.

When the hydrogen/water diffusion preventing films 52, 126 are aluminum oxide film, the stress mitigating film 124 can be, e.g., silicon nitride oxide film. The silicon nitride oxide film can function not only as the stress mitigating film but also as the water diffusion preventing film for preventing the diffusion of the water. The film thickness of the stress mitigating film 124 is, e.g., about 50-100 nm.

The stress mitigating film 124 is silicon nitride oxide film here but is not essentially silicon nitride oxide film. For example, the stress mitigating film 124 maybe silicon nitride film. Silicon nitride film can function as the water diffusion preventing film for preventing the diffusion of the water, as does silicon nitride oxide film.

A hydrogen/water diffusion preventing film 126 for preventing the diffusion of the hydrogen and the water is formed on the stress mitigating film 124. The hydrogen/water diffusion preventing film 126 is metal oxide film, as is the hydrogen/water diffusion preventing film 52. The metal oxide film is, e.g., an aluminum oxide film, as described above. The film thickness of the hydrogen/water diffusion preventing film 126 is, e.g., about 20-30 nm. The film thickness of the hydrogen/water diffusion preventing film 126 is set so relatively small for the purpose of making the stress due to the hydrogen/water diffusion preventing film 126 small. The hydrogen/water diffusion preventing film 126 is formed over the hydrogen/water diffusion preventing film 52 for the purpose of sufficiently ensuring the total film thickness of the hydrogen/water diffusion preventing films for preventing the diffusion of the hydrogen and the water.

The hydrogen/water diffusion preventing film 126 is aluminum oxide film but is not essentially aluminum oxide film. For example, the hydrogen/water diffusion preventing film 126 may be another metal oxide. For example, the hydrogen/water diffusion preventing film 126 may be titanium oxide film.

The hydrogen/water diffusion preventing film 52, the stress mitigating film 124 and the hydrogen/water diffusion preventing film 126 form the barrier film 128. Since the barrier film 128 is formed on the inter-layer insulation film 50 having the surface planarized, the barrier film 128 is flat.

A silicon oxide film 54 is formed on the barrier film 128. The film thickness of the silicon oxide film 54 is, e.g., about 50-100 nm.

Thus, the semiconductor device according to the present embodiment is constituted.

(Evaluation Result)

The result of evaluating the semiconductor device according to the present embodiment will be explained.

The switching charge quantity $Q_{SW}$ per 1 cell of the capacitor was measured. The configuration of the capacitor was 2 µm×2 µm.

The switching charge quantity $Q_{SW}$ was measured on the semiconductor device without the flat barrier film formed over the capacitor. The switching charge quantity $Q_{SW}$ per 1 cell was about 480 fC.

The switching charge quantity $Q_{SW}$ per 1 cell measured on the semiconductor device with the flat barrier film formed in a 50 nm-thickness over the capacitors was about 430 fC. Based on this, it can be seen that with the relatively thick barrier film formed over the capacitors, the switching charge quantity $Q_{SW}$ per 1 cell is smaller than that without the barrier film formed over the capacitors.

In contrast to this, in the present embodiment, wherein the flat barrier film 128 is formed, over the capacitors 44, of the layer film of the 20 nm-thickness hydrogen/water diffusion preventing film 52, the 50 nm-thickness stress mitigating film 124, the 20 nm-thickness hydrogen/water diffusion preventing film 126, the switching charge quantity $Q_{SW}$ per 1 cell was about 480 fC. Based on this, it can be seen that the present embodiment can prevent sufficiently the decrease of the switching charge quantity $Q_{SW}$ of the capacitors 44.

The switching charge quantity $Q_{SW}$ of test capacitors was measured. The electrode area of the test capacitors was 50 µm sq.

In the semiconductor device without the flat barrier film formed over the capacitors, the switching charge quantity $Q_{SW}$ of the test capacitor was about 24 µC.

With the 50 nm-thickness flat barrier film formed above the capacitors, the switching charge quantity $Q_{SW}$ of the test capacitor was about 8.0 µC. Based on this, it can be seen that with the flat barrier film formed over the capacitors, the switching charge quantity $Q_{SW}$ of the test capacitor is smaller by about 66% than that of the test capacitor without the flat barrier film formed over the capacitors.

In contrast to this, in the present embodiment, wherein the planarized barrier film 128 of the 20 nm-thickness hydrogen/water diffusion preventing film 52, the 50 nm-thickness stress mitigating film 124 and the 20 nm-thickness hydrogen/water diffusion preventing film 126 formed over the capacitors 44, the switching charge quantity $Q_{SW}$ of the test capacitor was 22 µC. Based on this, according to the present embodiment, the decrease of the switching charge $Q_{SW}$ of the test capacitor can be prevented without failure.

The semiconductor device according to the present embodiment is characterized mainly in that, as described above, the flat barrier metal 128 of the hydrogen/water diffusion preventing film 52, the stress mitigating film 124 and the hydrogen/water diffusion preventing film 126 laid one on another is formed on the planarized inter-layer insulation film 50.

As described above, with the flat barrier film simply formed above the capacitors 44, large stresses due to the barrier film are exerted to the capacitors 44, and the switching charge quantity $Q_{SW}$ of the capacitors 44 is often decreased.

In contrast to this, according to the present embodiment, the hydrogen/water diffusion preventing films 52, 126 and the stress mitigating film 124 are laid one on another, whereby the stresses due to the barrier film 128 can be made small. Furthermore, the hydrogen/water diffusion preventing films 52, 126, which are relatively thin, are laid one on another, whereby the total thickness of the hydrogen/water diffusion preventing films 52, 126 can be relatively thick.

Thus, according to the present embodiment, the decrease of the switching charge quantity $Q_{SW}$ of the capacitors 44 is surely prevented while the arrival of the hydrogen and the water at the capacitors 44 can be prevented. According to the present embodiment, it is possible to provide the semiconductor device including capacitors having good electric characteristics with high fabrication yields.

Patent reference 3 discloses a semiconductor device including a water diffusion preventing film of a silicon nitride film, etc. formed over capacitors, and a hydrogen diffusion preventing film of an aluminum oxide film, etc. formed on the water-diffusion preventing film. In Patent Reference 3, the water diffusion preventing film is formed, covering a metal interconnection, which makes it technically difficult to form the surface of the water diffusion preventing film being flat. Patent Reference 3 neither discloses nor suggests a technique of planarizing the surface of the hydrogen diffusion preventing film. Patent Reference 3 cannot planarize the hydrogen diffusion preventing film formed on the water diffusion preventing film and accordingly cannot planarize the hydrogen diffusion preventing film formed on the water diffusion preventing film. Patent Reference 3 cannot prevent the diffusion of the hydrogen and the water by the hydrogen diffusion preventing film and the water diffusion preventing film without failure. When a silicon nitride film is formed on the metal interconnection of aluminum as in Patent Reference 3, the life of the metal interconnection of aluminum is very short. Patent Reference 3 neither discloses nor suggests a technique of the invention of the present application that stresses to be exerted to the capacitors are mitigated, whereby the decrease of the switching charge quantity $Q_{SW}$ of the capacitors can be prevented.

(The Method for Fabricating the Semiconductor Device)

Next, the method for fabricating the semiconductor device according to the present embodiment will be explained with reference to FIGS. 27 and 28. FIGS. 27 and 28 are sectional views of the semiconductor device according to the present embodiment in the steps of the method for fabricating the semiconductor device, which explain the method.

Figure 27A:
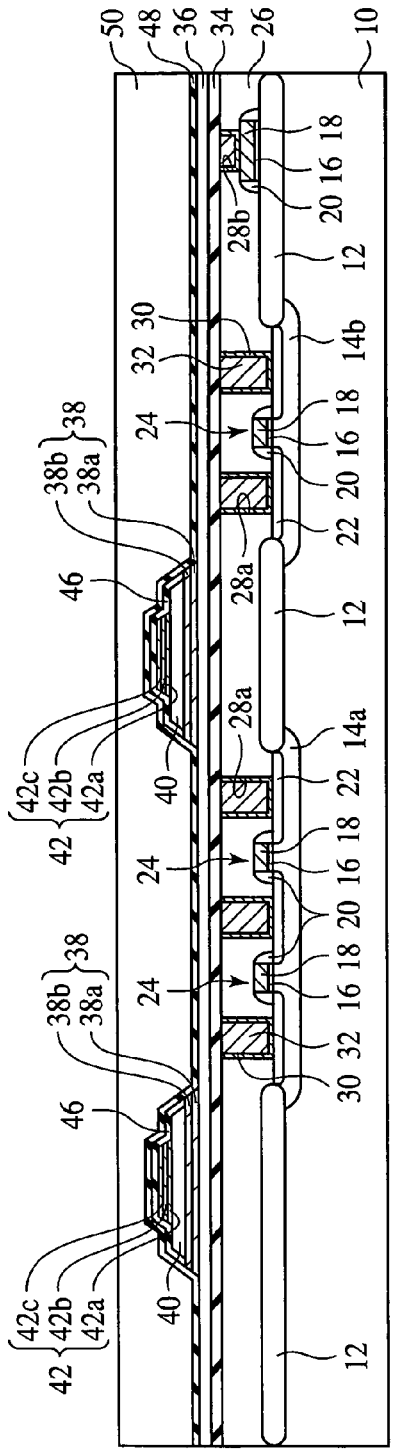
FIGS. 27A and 27B are sectional views of the semiconductor device according to the second embodiment of the present invention in the steps of the method for fabricating the semiconductor device, which illustrate the method (Part 1).

First, the steps up to the step of planarizing the inter-layer insulation film 50 including the inter-layer insulation film 50 planarizing step are the same as the steps of the method for fabricating the semiconductor device, which have been explained with reference to FIGS. 5A to 12A, and their explanation will not be repeated (see FIG. 27A).

Then, thermal processing is made in a nitrogen atmosphere. The nitrogen atmosphere is, e.g., $N_2O$ plasma. The thermal processing temperature is, e.g., about 300-400° C. The thermal processing temperature is 350° C. here. The thermal processing period of time is, e.g., 2-6 minutes. The thermal processing period of time is, e.g., 2 minutes here. This thermal processing is made for the purpose of removing water present in the inter-layer insulation film 50 and nitriding the surface of the inter-layer insulation film 50. The surface of the inter-layer insulation film 50 is nitrided, whereby the intrusion of the water into the inter-layer insulation film 50 from the outside can be prevented, which leads to the prevention of the deterioration of the electrode characteristics of the capacitors 42.

Figure 27B:
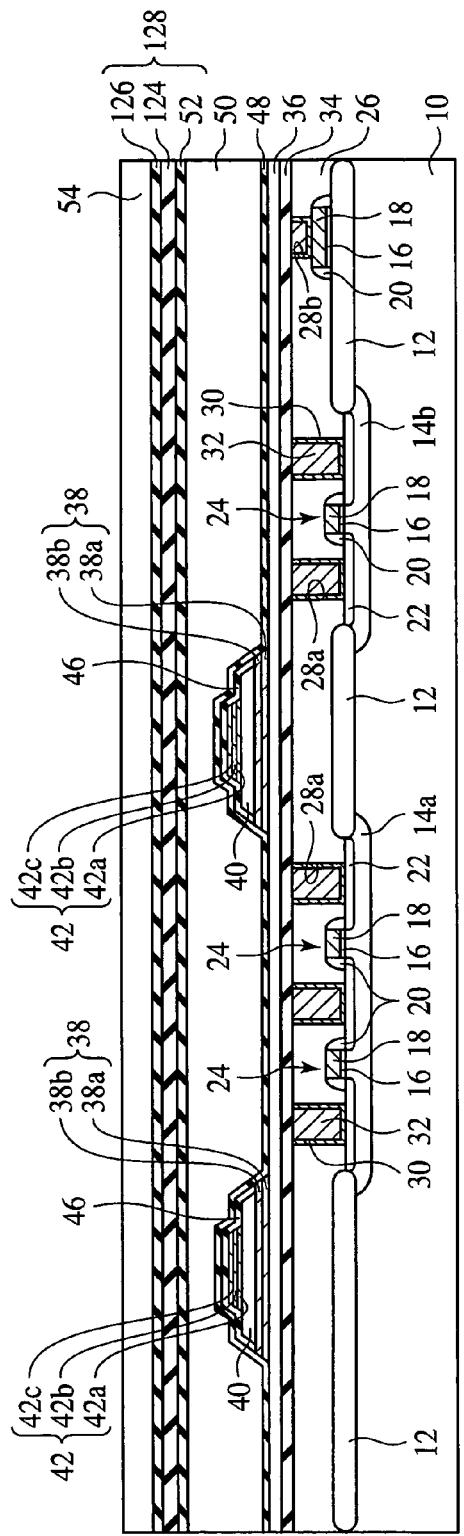

Then, as illustrated in FIG. 27B, the hydrogen/water diffusion preventing film 52 is formed by, e.g., sputtering or CVD. The hydrogen/water diffusion preventing film 52 is, e.g., a 20-30 nm-thickness aluminum oxide.

Conditions for forming the hydrogen/water diffusion preventing film 52 of aluminum oxide film by sputtering are as exemplified below. The target is a target of aluminum oxide. The gas to be supplied into the film forming chamber is, e.g., Ar gas. The flow rate of the Ar gas is 20 sccm. The pressure inside the film forming chamber is, e.g., 1 Pa. The electric power to be applied is, e.g., 2 kW. The substrate temperature is, e.g., 20° C. The film forming period is, e.g., 40-60 seconds. The film forming period of time is suitably set, whereby the film thickness of the hydrogen/water diffusion preventing film 52 can be controlled. Since the hydrogen/water diffusion preventing film 52 is formed on the planarized inter-layer insulation film 50, the hydrogen/water diffusion preventing film 52 is flat.

Next, the stress mitigating film 124 is formed by, e.g., CVD. The stress mitigating film 124 is a silicon nitride oxide film of, e.g., a 50-100 nm-thickness.

Conditions for forming the stress mitigating film 124 of silicon nitride oxide film by CVD are as exemplified below. The gases to be supplied into the film forming chamber are $SiH_4$ gas and $N_2O$ gas. The flow rate of the $SiH_4$ gas is, e.g., 38 sccm. The flow rate of the $N_2O$ gas is, e.g., 90 sccm. The film forming period of time is, e.g., 20 second. The pressure inside the film forming chamber is, e.g., 1.5 Torr. The gap between the opposed electrodes is, e.g., 350 mils. The electric power to be applied is, e.g., 50 W. The substrate temperature is, e.g., 350° C. Since the stress mitigating film 124 is formed on the flat hydrogen/water diffusion preventing film 52, the stress mitigating film 124 is flat.

Then, the hydrogen/water diffusion preventing film 126 is formed by, e.g., sputtering or CVD. The hydrogen/water diffusion preventing film 126 is, e.g., a 20-30 nm-thickness aluminum oxide film. Conditions for forming the hydrogen/water diffusion preventing film 126 are the same as, e.g., those for forming the hydrogen/water diffusion preventing film 52. Since the hydrogen/water diffusion preventing film 126 is formed on the flat stress mitigating film 124, the hydrogen/water diffusion preventing film 126 is flat.

Thus, the hydrogen/water diffusion preventing film 52, the stress mitigating film 124 and the hydrogen/water diffusion preventing film 126 form the barrier film 128. Since the barrier film 128 is formed on the planarized inter-layer insulation film 50, the barrier film 128 is flat.

Next, the insulation film 54 is formed on the barrier film 128.

The following steps of the method for fabricating the semiconductor device according to the present embodiment are the same as those of the method for fabricating the semiconductor device described above with reference to FIGS. 13A to 21, and their explanation will not be repeated.

Figure 28:
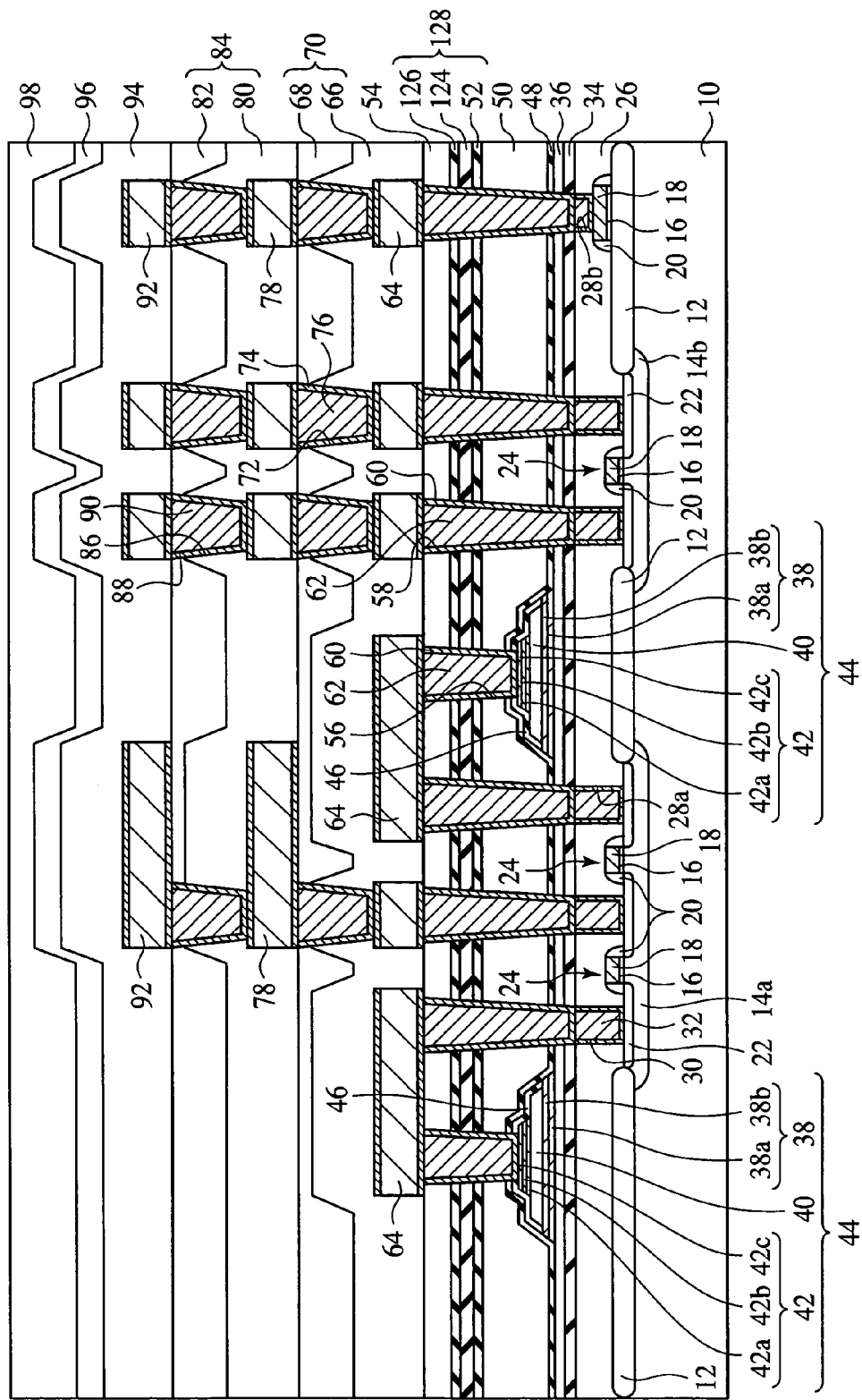
FIG. 28 is a sectional view of the semiconductor device according to the second embodiment of the present invention in the step of the method for fabricating the semiconductor device, which illustrates the method (Part 2).

Thus, the semiconductor device according to the present embodiment is fabricated (see FIG. 28).

(Modification 1)

Figure 29:
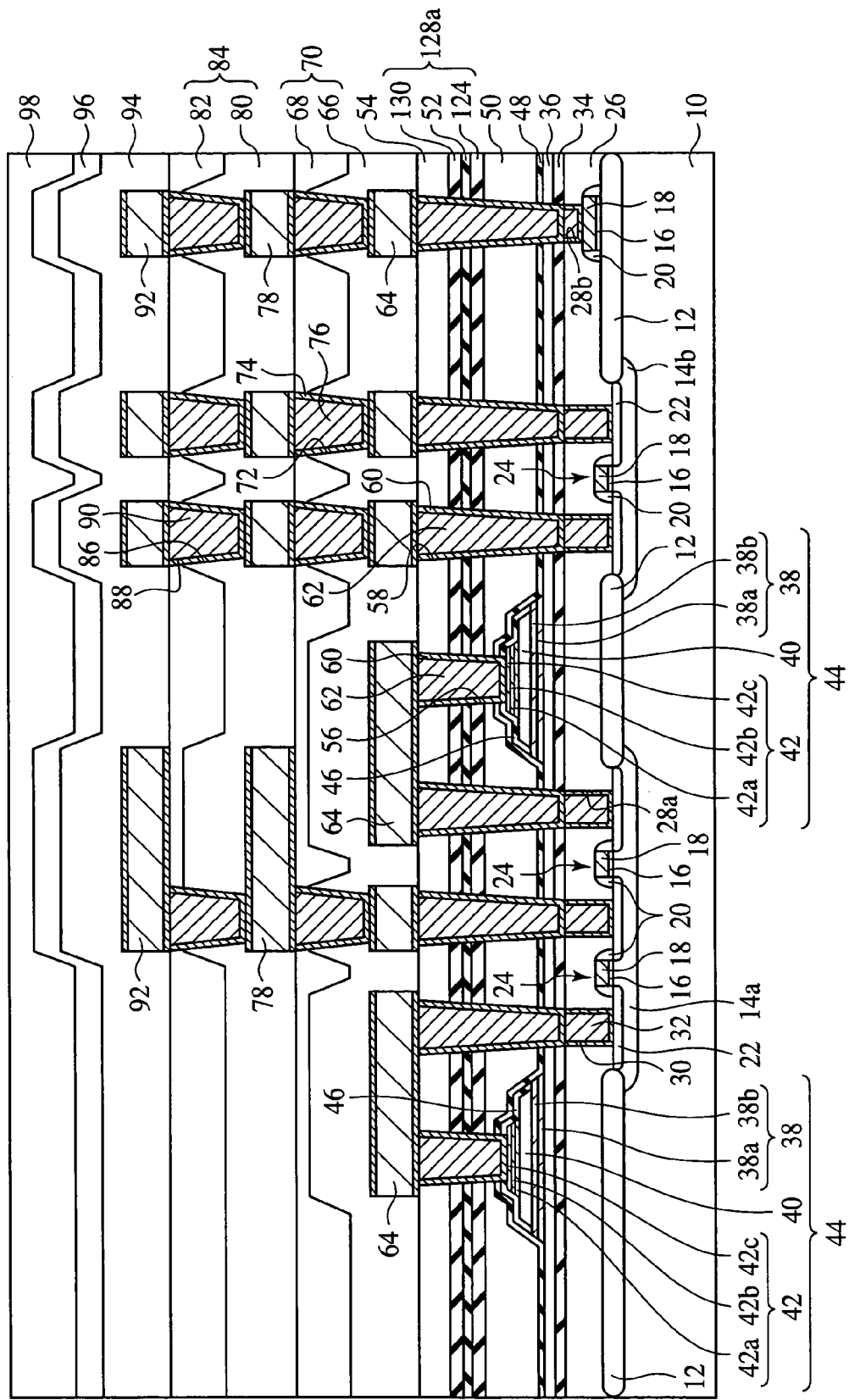
FIG. 29 is a sectional view of the semiconductor device according to Modification 1 of the second embodiment of the present invention.

Then, the semiconductor device according to one modification (Modification 1) of the present embodiment will be explained with reference to FIG. 29. FIG. 29 is a sectional view of the semiconductor device according to the present modification.

The semiconductor device according to the present modification is characterized mainly in that stress mitigating films 124, 130 are formed respectively over and under the hydrogen/water diffusion preventing film 52.

As illustrated in FIG. 29, the stress mitigating film 124 is formed on the planarized inter-layer insulation film 50. The stress mitigating film 124 is, e.g., silicon nitride oxide film. The film thickness of the stress mitigating film 124 is, e.g., about 50-100 nm. Since the stress mitigating film 124 is formed on the planarized inter-layer insulation film 50, the stress mitigating film 124 is flat.

The hydrogen/water diffusion preventing film is formed on the stress mitigating film 124. The hydrogen/water diffusion preventing film 52 is, e.g., an aluminum oxide film. The film thickness of the hydrogen/water diffusion preventing film 52 is, e.g., about 20-30 nm. Since the hydrogen/water diffusion preventing film 52 is formed on the flat stress mitigating film 124, the hydrogen/water diffusion preventing film 52 is flat. The hydrogen/water diffusion preventing film 52 is not essentially aluminum oxide film. For example, the hydrogen/water diffusion preventing film 52 maybe another metal oxide. For example, the hydrogen/water diffusion preventing film 52 may be titanium oxide or others.

A stress mitigating film 130 is formed on the hydrogen/water diffusion preventing film 52. The stress mitigating film 130 is, e.g., silicon nitride oxide film. Since the stress mitigating film 130 is formed on the flat hydrogen/water diffusion preventing film 52, the stress mitigating film 130 is flat. The film thickness of the stress mitigating film 130 is, e.g., about 50-100 nm.

Thus, the stress mitigating film 124, the hydrogen/water diffusion preventing film 52 and the stress mitigating film 130 form a barrier film 128a. Since the barrier film 128a is formed on the planarized inter-layer insulation film 50, the barrier film 128a is flat.

As described above, the stress mitigating films 124, 130 may be formed respectively over and under the hydrogen/water diffusion preventing film 52. According to the present modification, the stress mitigating films 124, 130 for mitigating stresses due to the hydrogen/water diffusion preventing film 52 are formed over and under the hydrogen/water diffusion preventing film 52, whereby the barrier film 128a can make the stresses to be applied to the capacitors 44 very small. Thus, according to the present modification, the arrival of the hydrogen and the water at the capacitors 44 can be prevented while the decrease of the switching charge quantity $Q_{SW}$ of the capacitors 44 can be prevented.

(Modification 2)

Figure 30:
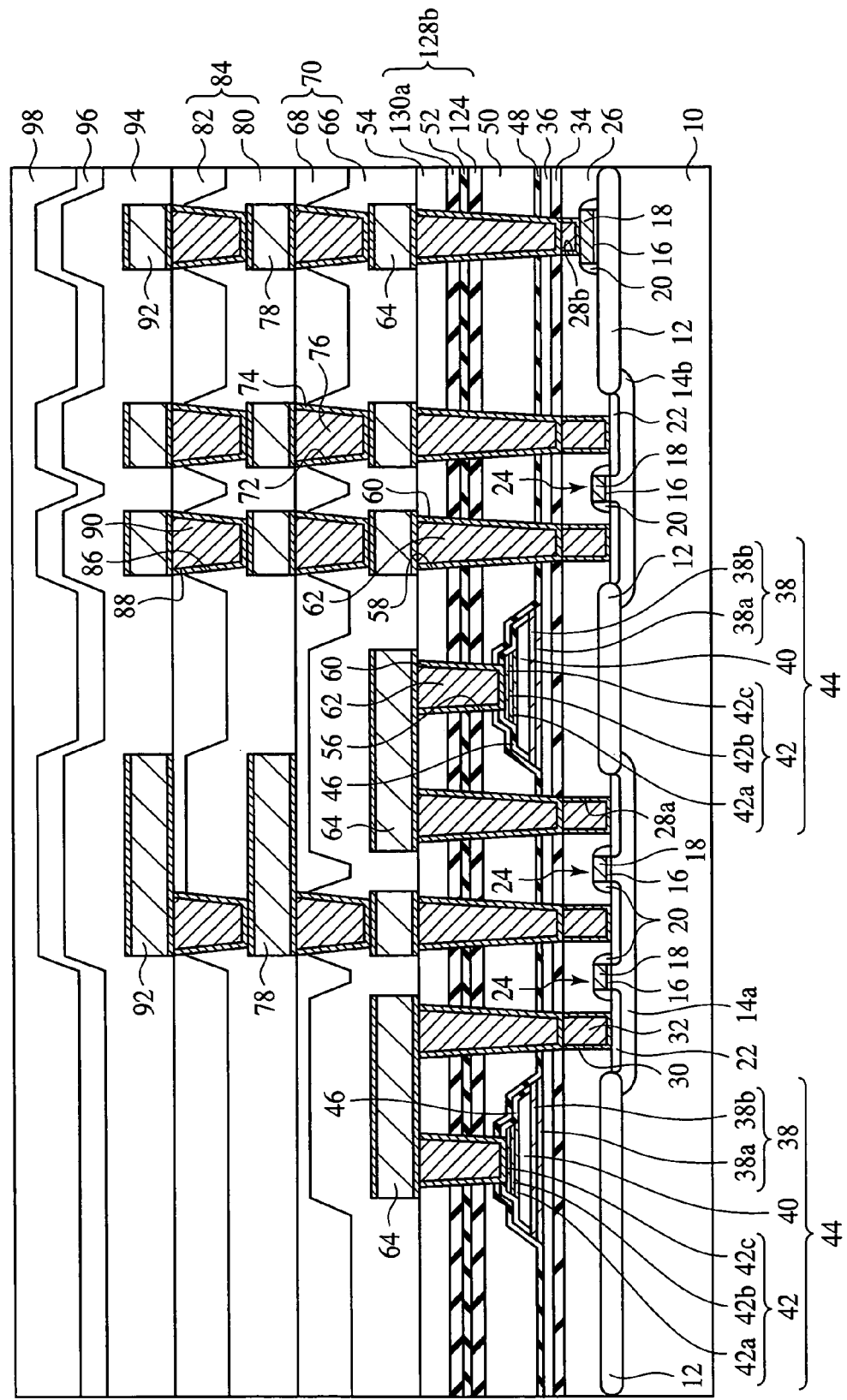
FIG. 30 is a sectional view of the semiconductor device according to Modification 2 of the second embodiment of the present invention.

Next, the semiconductor device according to one modification (Modification 2) of the present embodiment will be explained with reference to FIG. 30. FIG. 30 is a sectional view of the semiconductor device according to the present modification.

The semiconductor device according to the present modification is characterized mainly in that a stress mitigating film 130a formed on the upper side of the hydrogen/water diffusion preventing film 52 is silicon nitride film.

As illustrated in FIG. 30, the stress mitigating film 130a of silicon nitride film is formed on the hydrogen/water diffusion preventing film 52. The film thickness of the stress mitigating film 130a is, e.g., 50-100 nm. Conditions for forming the stress mitigating film 130a of silicon nitride oxide film by CVD are as exemplified below. The gases to be supplied into the film forming chamber are $SiH_4$ gas, $NH_3$ gas, $N_2$ gas and $H_2$ gas. The flow rate of the $SiH_4$ gas is, e.g., 55 sccm. The flow rate of the $NH_3$ gas is, e.g., 500 sccm. The flow rate of the $N_2$ gas is, e.g., 250 sccm. The flow rate of the $H_2$ gas is, e.g., 250 sccm. The pressure inside the film forming chamber is, e.g., 4.0 Torr. The substrate temperature is, e.g., 400° C. The gap between the opposed electrodes is, e.g., 600 mils. The electric power to be applied is, e.g., 100 W. The low-frequency electric power to be applied is, e.g., 55 W. When the film thickness of the stress mitigating film 130a is 100 nm, the film forming period of time is, e.g., 18 seconds. Since the stress mitigating film 130a is formed on the flat hydrogen/water diffusion preventing film 52, the stress mitigating film 130a is flat.

Thus, the stress mitigating film 124, the hydrogen/water diffusion preventing film 52 and the stress mitigating film 130a form a barrier film 128b. Since the barrier film 128b is formed on the planarized inter-layer insulation film 50, the barrier film 128b is flat.

For the following reason, only the stress mitigating film 130a alone formed over the hydrogen/water diffusion preventing film 52 is silicon nitride film, and the stress mitigating film 124 formed under the hydrogen/water diffusion preventing film 52 is silicon nitride oxide film.

That is, when silicon nitride film is formed, generally the film is formed in an atmosphere containing hydrogen. When silicon nitride film is formed directly on the inter-layer insulation film 50, the hydrogen in the film forming atmosphere passes through the inter-layer insulation film 50 and arrives at the capacitors 44. Then, the dielectric film 40 of the capacitors 44 is reduced with the hydrogen, and the electric characteristics of the capacitors 44 are deteriorated. Accordingly, the stress mitigating film 124 formed under the hydrogen/water diffusion preventing film 52 is not silicon nitride film but silicon nitride oxide film. When silicon nitride film is formed over the hydrogen/water diffusion preventing film 52, the inter-layer insulation film 50 has been already covered with the hydrogen/water diffusion preventing film 52, and without any problem, the hydrogen in the film forming atmosphere can be surely prevented from arriving at the inside of the inter-layer insulation film 50.

As described above, the stress mitigating film 130a formed over the hydrogen/water diffusion preventing film 52 may be silicon nitride film.

(Modification 3)

Figure 31:
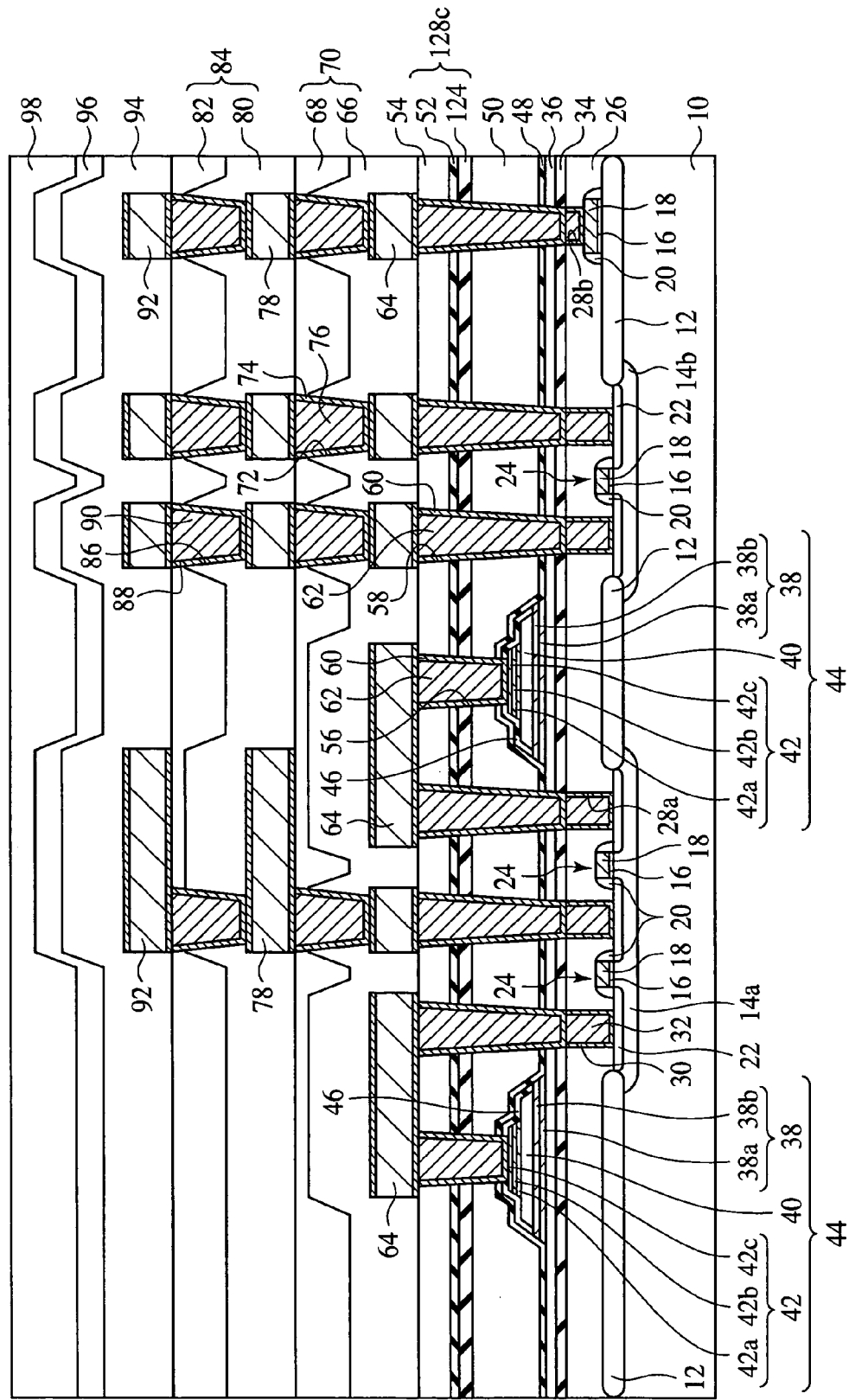
FIG. 31 is a sectional view of the semiconductor device according to Modification 3 of the second embodiment of the present invention.

Next, the semiconductor device according to one modification (Modification 3) of the present embodiment will be explained with reference to FIG. 31. FIG. 31 is a sectional view of the semiconductor device according to the present modification.

The semiconductor device according to the present modification is characterized mainly in that the stress mitigating film 124, and the hydrogen/water diffusion preventing film 52 formed on the stress mitigating film 124 form a barrier film 128c.

As illustrated in FIG. 31, the stress mitigating film 124 is formed on the planarized inter-layer insulation film 50. The stress mitigating film 124 is, e.g., silicon nitride oxide film. The film thickness of the stress mitigating film is, e.g., about 50-100 nm.

The hydrogen/water diffusion preventing film 52 of a metal oxide is formed on the stress mitigating film 124. The film thickness of the hydrogen/water diffusion preventing film 52 is about 20-30 nm.

Thus, the barrier film 128c is formed of the stress mitigating film 124 and the hydrogen/water diffusion preventing film 52. Since the barrier film 128c is formed on the planarized inter-layer insulation film 50, the barrier film 128c is flat.

Thus, the semiconductor device according to the present modification is constituted.

As in the present modification, the barrier film 128c may be formed of the stress mitigating film 124, and the hydrogen/water diffusion preventing film 52 formed on the stress mitigating film 124.

(Modification 4)

Figure 32:
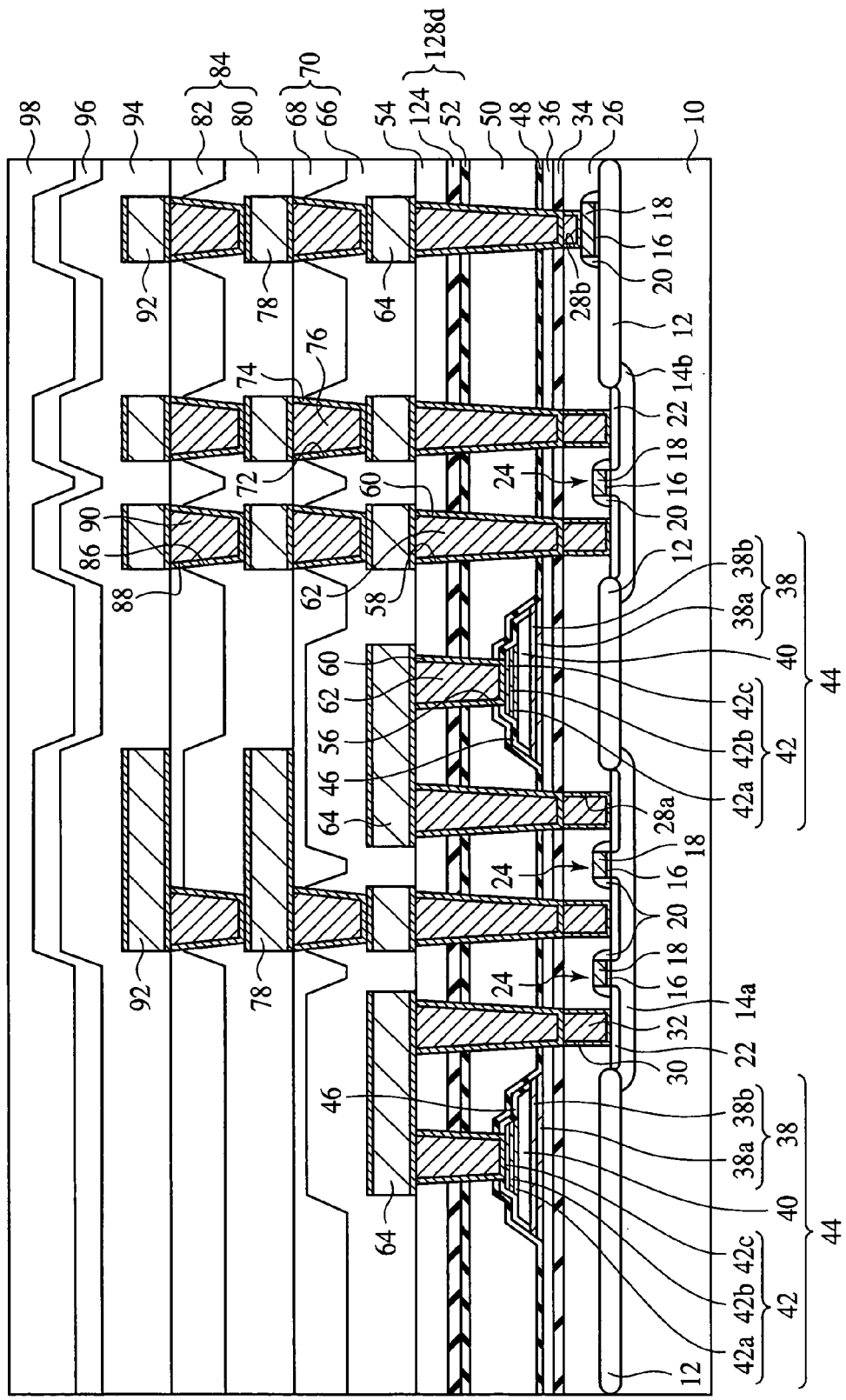
FIG. 32 is a sectional view of the semiconductor device according to Modification 4 of the second embodiment of the present invention.

Next, the semiconductor device according to one modification (Modification 4) of the present embodiment will be explained with reference to FIG. 32. FIG. 32 is a sectional view of the semiconductor device according to the present modification.

The semiconductor device according to the present modification is characterized mainly in that the hydrogen/water diffusion preventing film 52, and the stress mitigating film 124 formed on the hydrogen/water diffusion preventing film 52 form a barrier film 128d.

As illustrated in FIG. 32, the hydrogen/water diffusion preventing film 52 is formed on the planarized inter-layer insulation film 50. The film thickness of the hydrogen/water diffusion preventing film 52 is, e.g., about 20-30 nm.

The stress mitigating film 124 of, e.g., a silicon nitride oxide film is formed on the hydrogen/water diffusion preventing film 52. The film thickness of the stress mitigating film 124 is, e.g., about 50-100 nm.

The stress mitigating film 124 is silicon nitride oxide film here but is not essentially a silicon nitride oxide film. For example, the stress mitigating film 124 may be a silicon nitride film.

A barrier film 128d is formed of the hydrogen/water diffusion preventing film 52 and the stress mitigating film 124. Since the barrier film 128d is formed on the planarized inter-layer insulation film 50, the barrier film 128d is flat.

Thus, the semiconductor device according to the present modification is constituted.

As in the present modification, the barrier film 128d may be formed of the hydrogen/water diffusion preventing film 52, and the stress mitigating film 124 formed on the hydrogen/water diffusion preventing film 52.

(Modification 5)

Figure 33:
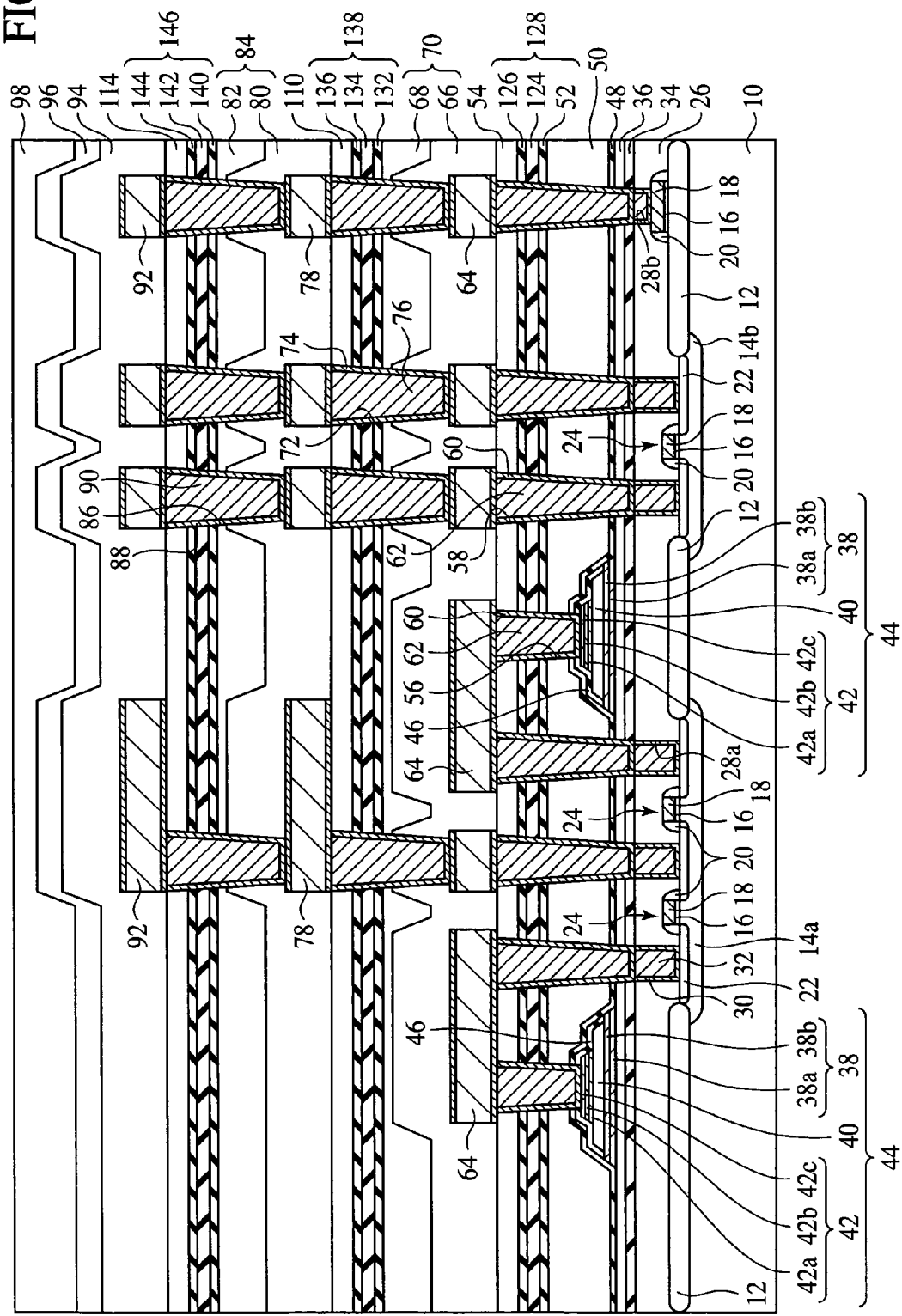
FIG. 33 is a sectional view of the semiconductor device according to Modification 5 of the second embodiment of the present invention.

Next, the semiconductor device according to one modification (Modification 5) of the present embodiment will be explained with reference to FIG. 33. FIG. 33 is a sectional view of the semiconductor device according to the present modification.

The semiconductor device according to the present modification is characterized mainly in that a barrier film 138 is further formed between the first metal interconnection layer 64 and the second metal interconnection layer 78, and a barrier film 146 is further formed between the second metal interconnection layer 78 and the third metal interconnection layer 92.

As illustrated in FIG. 33, the barrier film 138 of a hydrogen/water diffusion preventing film 132, the stress mitigating film 134 and the hydrogen/water diffusion preventing film 136 laid one on another formed on the planarized inter-layer insulation film 70. The hydrogen/water diffusion preventing films 132, 136 are, e.g., 20-30 nm-thickness aluminum oxide films. The stress mitigating film 134 is, e.g., a 50-100 nm-thickness silicon nitride oxide film. Since the barrier film 138 is formed on the inter-layer insulation film 70 having the surface planarized, the barrier film 138 is flat.

The hydrogen/water diffusion preventing films 132, 136 are aluminum oxide films here but is not essentially aluminum oxide films. The hydrogen/water diffusion preventing films 132, 136 may be other metal oxides. For example, the hydrogen/water diffusion preventing films 132, 136 may be titanium oxide films or others.

The stress mitigating film 134 is, e.g., silicon nitride oxide film here but is not essentially silicon nitride oxide film. For example, the stress mitigating film 134 maybe silicon nitride film. As described above, the silicon nitride film can function as the water diffusion preventing film for preventing the diffusion of the water.

An insulation film 110 is formed on the barrier film 138. The insulation film 110 is, e.g., a 100 nm-thickness silicon oxide film.

The second metal interconnection layer 78 is formed on the insulation film 110.

The barrier film 146 of the hydrogen/water diffusion preventing film 130, the stress mitigating film 142 and the hydrogen/water diffusion preventing film 144 is formed on the planarized inter-layer insulation film 84. The hydrogen/water diffusion preventing films 140, 144 are, e.g., 20-30 nm-thickness aluminum oxide films. The stress mitigating film 142 is, e.g., a 50-100 nm-thickness silicon nitride oxide film. Since the barrier film 146 formed on the inter-layer insulation film 84 having the surface planarized, the barrier film 146 is flat.

The hydrogen/water diffusion preventing films 140, 144 are, e.g., aluminum oxide film but are not essentially aluminum oxide film. For example, the hydrogen/water diffusion preventing films 140, 144 maybe, e.g., other metal oxides. For example, the hydrogen/water diffusion preventing films 140, 144 may be titanium oxide or others.

The stress mitigating film 142 is silicon nitride oxide film here but is not essentially silicon nitride oxide film. For example, the stress mitigating film 142 maybe silicon nitride film. As described above, silicon nitride film can function as the water diffusion preventing film for preventing the diffusion of the water.

An insulation film 144 is formed on the barrier film 146. The insulation film 114 is, e.g., a 100 nm-thickness silicon oxide film.

The third metal interconnection layer 92 is formed on the insulation film 114.

Thus, the semiconductor device according to the present modification is constituted.

According to the present modification, in addition to the barrier film 128 formed between the capacitors 44 and the first metal interconnection layer 64, the barrier films 138, 146 are formed respectively between the first metal interconnection layer 64 and the second metal interconnection layer 78 and between the second metal interconnection layer 78 and the third metal interconnection layer 92, whereby the arrival of the hydrogen and the water at the capacitors 44 can be prevented without failure.

(Modification 6)

Figure 34:
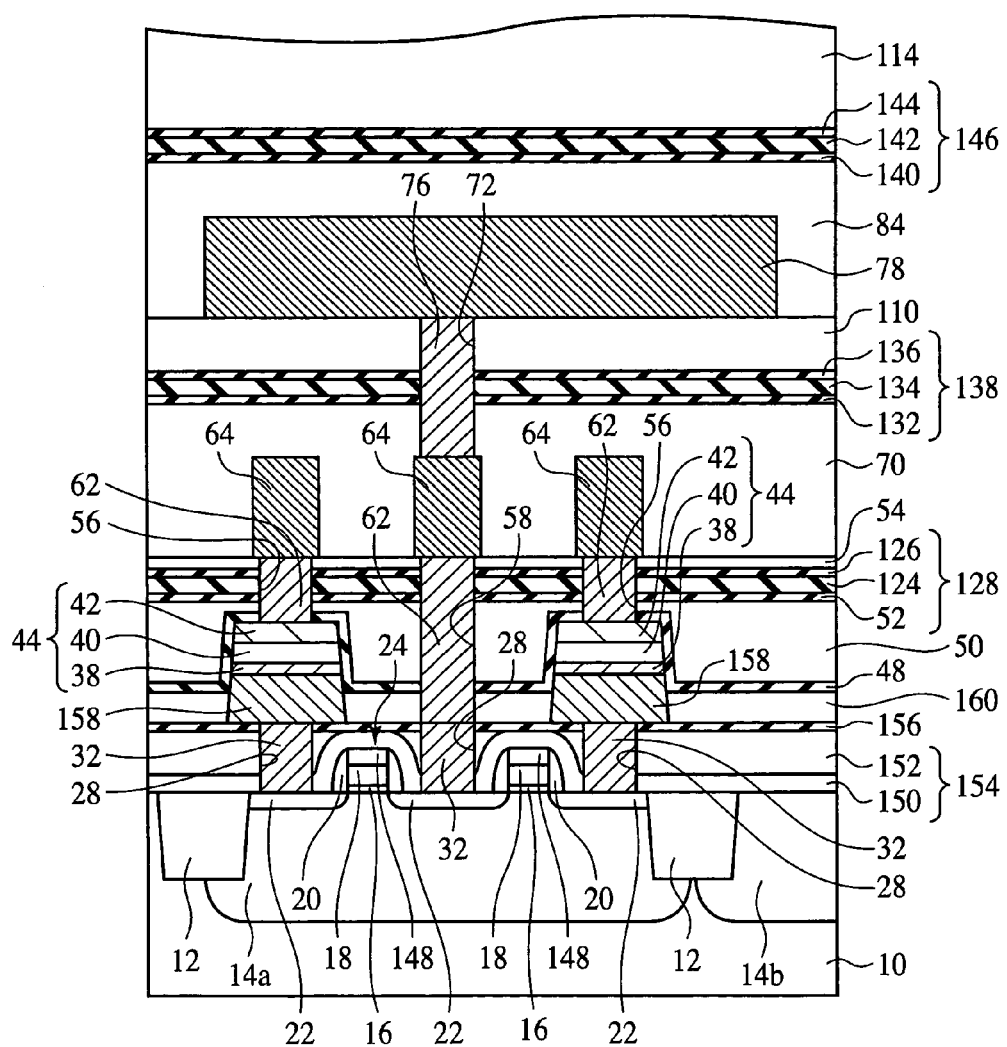
FIG. 34 is a sectional view of the semiconductor device according to Modification 6 of the second embodiment of the present invention.

Next, the semiconductor device according to one modification (Modification 6) of the present embodiment will be explained with reference to FIG. 34. FIG. 34 is a sectional view of the semiconductor device according to the present modification.

The semiconductor device according to the present modification is characterized mainly by the stacked memory cell structure.

As illustrated in FIG. 34, device isolation regions 12 for defining device regions are formed on the semiconductor substrate 10. Wells 14a, 14b are formed in the semiconductor substrate 10 with the device isolation regions 12 formed on.

Gate electrodes 18 are formed, via a gate insulation film 16, over the semiconductor substrate with the wells 14a, 14b formed in. A silicon oxide film 148 is formed on the gate electrodes 18. A sidewall insulation film 20 is formed on the side walls of the gate electrodes 18 and the silicon oxide film 148.

A source/drain diffused layer 22 is formed on both sides of the gate electrodes 18 with the sidewall insulation film 20 formed on. Thus, transistors 24 each including the gate electrode 18 and the source/drain diffused layer 22 are formed. The gate length of the transistor 24 is set at, e.g., 0.18µm.

An inter-layer insulation film 154 of a silicon nitride oxide film 150 and a silicon oxide film 152 laid one on the other is formed on the semiconductor substrate 10 with the transistors 24 formed on. The surface of the inter-layer insulation film 154 is planarized.

A hydrogen/water diffusion preventing film 156 for preventing the diffusion of the hydrogen and the water is formed on the inter-layer insulation film 154. The hydrogen/water diffusion preventing film 156 is, e.g., metal oxide film, such as aluminum oxide film, titanium oxide film or others.

A contact hole 28 is formed in the hydrogen/water diffusion preventing film 156 and the inter-layer insulation film 154 is formed down to the source/drain diffused layer 22.

A barrier metal film (not illustrated) of a Ti film and a TiN film laid one on the other is formed in the contact hole 28.

A conductor plug 32 of tungsten is buried in the contact hole 28 with the barrier metal film formed in.

An Ir (Iridium) film 158 electrically connected to the conductor plug 32 is formed on the hydrogen/water diffusion preventing film 156.

The lower electrodes 38 of the capacitors 44 are formed on the Ir film 158. The dielectric film 40 of the capacitors 44 is formed on the lower electrodes 38. The dielectric film 40 is, e.g., ferro-electric film, such as PZT or others. The upper electrodes 42 of the capacitors 44 are formed on the dielectric film 40. The upper electrodes 42, the dielectric film 40, the lower electrodes 38 and the Ir film 158 are patterned at once by etching and have substantially the same plane shape.

Thus, capacitors 44 each including the lower electrode 38, the dielectric film 40 and the upper electrodes 42 are constituted. The lower electrodes 38 of the capacitors 44 are electrically connected to the conductor plugs 32 via the Ir film 158.

A silicon nitride oxide film 160 is formed on the hydrogen/water diffusion preventing film 156 in the region where the Ir film 158 is not formed.

The barrier film 48 having the function of preventing the diffusion of the hydrogen and the water is formed on the capacitors 44 and the silicon nitride oxide film 160. The barrier film 48 is, e.g., metal oxide film, such as aluminum oxide film, titanium oxide film or others.

The inter-layer insulation film 50 of silicon oxide film is formed on the hydrogen/water diffusion preventing film 48. The surface of the inter-layer insulation film 50 is planarized.

A barrier film 128 of the hydrogen/water diffusion preventing film 52 and a stress mitigating film 124 and the hydrogen/water diffusion preventing film 126 laid one on the other is formed on the planarized inter-layer insulation film 50. Since the barrier film 128 is formed on the inter-layer insulation film 50 having the surface planarized, the barrier film 128 is flat.

A silicon oxide film 54 is formed on the barrier film 128.

Contact holes 56 are formed in the silicon oxide film 54, the barrier film 128, the silicon oxide film 50 and the hydrogen/water diffusion preventing film 48 down to the upper electrodes 42 of the capacitors 44. A contact hole 58 is formed in the silicon oxide film 54, the barrier film 128, the silicon oxide film 50, the hydrogen/water diffusion preventing film 48 and the silicon nitride oxide film 160 down to the conductor plug 32.

A barrier metal film (not illustrated) of a Ti film and a TiN film laid one on the other is formed in the contact holes 56, 58.

Conductor plugs 62 of tungsten are buried respectively in the contact holes 56, 58 with the barrier metal film formed in.

An interconnection (a first metal interconnection layer) 64 is formed on the silicon oxide film 54, electrically connected to the conductor plugs 62.

An inter-layer insulation film 70 of, e.g., a silicon oxide film is formed on the silicon oxide film 54 with the interconnection 64 formed on. The surface of the inter-connection layer 70 is planarized.

A flat barrier film 138 of a hydrogen/water diffusion preventing film 132, a stress mitigating film 134 and a hydrogen/water diffusion preventing film 136 is formed on the planarized inter-layer insulation film 70.

A silicon oxide film 110 is formed on the barrier film 138.

A contact hole 72 is formed in the silicon oxide film 110, the barrier film 138 and the silicon oxide film 70 down to the interconnection 64.

A barrier metal film (not illustrated) of a Ti film and a TiN film laid one on the other is formed in the contact hole 72.

A conductor plug 76 of tungsten is buried in the contact hole 72 with the barrier metal film formed in.

An interconnection 78 is formed on the silicon oxide film 110, electrically connected to the conductor plug 76.

An inter-layer insulation film 84 of a silicon oxide film is formed on the silicon oxide film 110 with the interconnection 78 formed on. The surface of the inter-layer insulation film 84 is planarized.

A flat barrier film 146 of a hydrogen/water diffusion preventing film 140, a stress mitigating film 142 and a hydrogen/water diffusion preventing film 144 is formed on the planarized inter-layer insulation film 84.

A silicon oxide film 114 is formed on the barrier film 146.

An interconnection (a third metal interconnection layer) not illustrated is formed on the silicon oxide film 114.

As in the present modification, the memory cell structure may be of the stacked type.

A Third Embodiment

Figure 35:
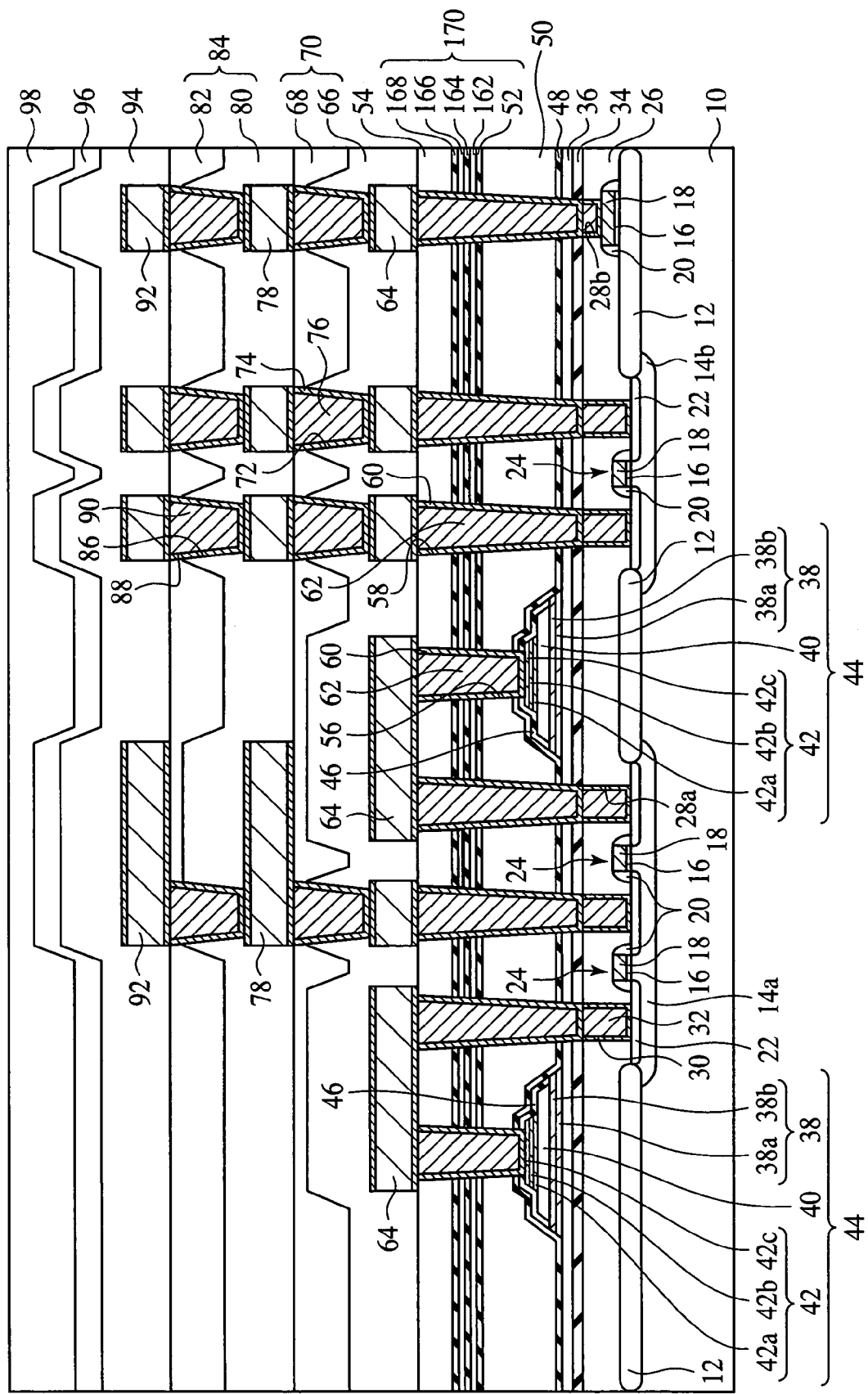
FIG. 35 is a sectional view of the semiconductor device according to a third embodiment of the present invention.

The semiconductor device according to a third embodiment of the present invention and the method for fabricating the semiconductor device will be explained with reference to FIGS. 35 to 37. FIG. 35 is a sectional view of the semiconductor device according to the present embodiment. The same members of the semiconductor device according to the first or the second embodiments and the method for fabricating the semiconductor device illustrated in FIGS. 1 to 34 are represented by the same reference numbers not to repeat or to simplify their explanation.

The semiconductor device according to the present embodiment is characterized mainly in that a plurality of hydrogen/water diffusion preventing films are laid one on another with intermediate layers formed therebetween, whereby a barrier film is formed.

As illustrated in FIG. 35, a hydrogen/water diffusion preventing film 52 having the function of preventing the diffusion of the hydrogen and the water is formed on an inter-layer insulation film 50. The hydrogen/water diffusion preventing film 52 is,e.g., metal oxide film. The hydrogen/water diffusion preventing film 52 of a metal oxide film is, e.g., an aluminum oxide film. The film thickness of the hydrogen/water diffusion preventing film 52 is, e.g., 20-30 nm. The film thickness of the hydrogen/water diffusion preventing film 52 is set so small so as to make the stress due to the hydrogen/water diffusion preventing film 52.

The hydrogen/water diffusion preventing film 52 is, e.g., aluminum oxide film here but is not essentially aluminum oxide film. For example, the hydrogen/water diffusion preventing film 52 may be another metal oxide. For example, the hydrogen/water diffusion preventing film 52 maybe titanium oxide film or others.

An intermediate layer 162 of a dielectric substance is formed on the hydrogen/water diffusion preventing film 52. The intermediate layer 162 is, e.g., silicon oxide film. The thickness of the intermediate layer 162 is, e.g., about 20-30 nm.

The intermediate layer 162 is e.g., silicon oxide film here but is not essentially silicon oxide film. For example, the intermediate layer 162 is, e.g., silicon nitride oxide film, silicon nitride film or others. Silicon nitride oxide film and silicon nitride film can function as the stress mitigating film as described above, the intermediate layer 162 formed of silicon nitride oxide film or silicon nitride film can mitigate the stress due to the hydrogen/water diffusion preventing films 52, 164. Silicon nitride oxide film and silicon nitride film can function as the water diffusion preventing film for preventing the diffusion of water, and the intermediate layer 162 of silicon nitride oxide film or silicon nitride film can prevent the arrival of the water at the capacitors 44 without failure.

A hydrogen/water diffusion preventing film 164 having the function of preventing the diffusion of the hydrogen and the water is formed on the intermediate layer 162. The hydrogen/water diffusion preventing film 164 is, e.g., aluminum oxide film, as described above. The film thickness of the hydrogen/water diffusion preventing film 164 is, e.g., about 20-30 nm. The film thickness of the hydrogen/water diffusion preventing film 164 is set so small so that the stress due to the hydrogen/water diffusion preventing film 164 is made small.

The hydrogen/water diffusion preventing film 164 is aluminum oxide film here but is not essentially aluminum oxide film. For example, the hydrogen-water diffusion preventing film 164 may be another metal oxide. For example, the hydrogen/water diffusion preventing film 164 may be titanium oxide film or others.

An intermediate layer 166 of a dielectric substance is formed on the hydrogen/water diffusion preventing film 164. The intermediate layer 166 is, e.g., silicon oxide film. The thickness of the intermediate layer 166 is, e.g., about 50-100 nm.

The intermediate layer 166 is silicon oxide film here but is not essentially silicon oxide film. For example, the intermediate layer 166 may be silicon nitride oxide film or silicon nitride film.

A hydrogen/water diffusion preventing film 168 having the function of preventing the diffusion of the hydrogen and the water is formed on the intermediate layer 166. The hydrogen/water diffusion preventing film 168 is, e.g., aluminum oxide film, as described above. The film thickness of the hydrogen/water diffusion preventing film 168 is, e.g., about 20-30 nm. The film thickness of the hydrogen/water diffusion preventing film 168 is set so relatively thin so that the stress due to the hydrogen/water diffusion preventing film 168 is made small.

The hydrogen/water diffusion preventing film 168 is, e.g., aluminum oxide film here but is not essentially aluminum oxide film. For example, the hydrogen/water diffusion preventing film 168 may be another metal oxide. For example, the hydrogen/water diffusion preventing film 168 may be titanium oxide film or others.

Thus, the hydrogen/water diffusion preventing film 52, the intermediate layer 162, the hydrogen/water diffusion preventing film 164, the intermediate layer 166 and the hydrogen/water diffusion preventing film 168 form a barrier film 170. Since the barrier film 170 is formed on the inter-layer insulation film 50 having the surface planarized, the barrier film 170 is flat.

In the present embodiment, for the following reason, a plurality of hydrogen/water diffusion preventing film 52, 164, 168 are laid one on another with the intermediate layers 162, 166 formed therebetween.

That is, often scratches are formed in the surface of the inter-layer insulation film 50, the surface of which is planarized by CMP or others. When the hydrogen/water diffusion preventing film 52 is formed on the inter-layer insulation film 50 with scratches formed in, often cracks are formed partially in the hydrogen/water diffusion preventing film 52 due to the steps formed by the scratches. With the cracks formed in the hydrogen/water diffusion preventing film 52, the hydrogen and the water often arrive at the capacitors 44 through the cracks in the hydrogen/water diffusion preventing film 52, resultantly causing the deterioration of the electric characteristics of the capacitors 44. Even when no cracks due to the scratches in the inter-layer insulation film 50 are formed in the hydrogen/water diffusion preventing film 52, often pin holes are formed in the hydrogen/water diffusion preventing film 52, and the hydrogen and the water arrive at the capacitors 44 through the pin holes formed in the hydrogen/water diffusion preventing film 52.

In the present embodiment, the hydrogen/water diffusion preventing film 164 is laid above the hydrogen/water diffusion preventing film 52, and the hydrogen/water diffusion preventing film 164 is formed above the hydrogen/water diffusion preventing film 52 with the intermediate layer 162 formed therebetween, whereby even when cracks are formed in the hydrogen/water diffusion preventing film 52, the possibility that cracks are formed even in the other hydrogen/water diffusion preventing film 164 is very low. Pin holes may be formed also in the hydrogen/water diffusion preventing film 164, but the possibility that pinholes formed in the hydrogen/water diffusion preventing film 52 and pin holes formed in the hydrogen/water diffusion preventing film 164 are located near each other is very low. Thus, according to the present embodiment, the prevention of the diffusion of the hydrogen and the water can be more ensured in comparison with that with one hydrogen/water diffusion preventing film formed.

Furthermore, according to the present embodiment, above the hydrogen/water diffusion preventing film 164, the hydrogen/water diffusion preventing film 168 is formed, whereby the arrival of the hydrogen and the water at the capacitors 44 can be more surely prevented.

With one hydrogen/water diffusion preventing film above the capacitors 44, for the sure prevention of the diffusion of the hydrogen and the water, the film thickness of the hydrogen/water diffusion preventing film must be set at 50 nm or above. The stress due to the hydrogen/water diffusion preventing film of such relatively large film thickness is relatively large, and the relative large stress is exerted to the capacitors, which causes a risk that the switching charge quantity $Q_{SW}$ of the capacitors may be decreased.

In contrast to this, in the present embodiment, the hydrogen/water diffusion preventing films 52, 164, 168, which are as relatively thin as about 20 nm are laid one on another with the intermediate layers 162, 166 formed therebetween. The stress due to such relatively thin hydrogen/water diffusion preventing films 52, 162, 168 is very small in comparison with the stress due to the relatively thick hydrogen/water diffusion preventing film. The stress due to the barrier film 170 of the relatively thin hydrogen/water diffusion preventing films 52, 164, 168 laid one on another with the intermediate layers 162, 166 formed therebetween is smaller than the stress due to one relatively thick hydrogen/water diffusion preventing film. Moreover, the total film thickness of the hydrogen/water diffusion preventing films 52, 164, 168 is relatively thick. Thus, according to the present embodiment, the total film thickness of the hydrogen/water diffusion preventing film 52, 164, 168 can be made relatively thick while the stress due to the barrier film 170 can be made small. Accordingly, in the present embodiment, the arrival of the hydrogen and the water at the capacitors 44 can be surely prevented while the decrease of the switching charge quantity $Q_{SW}$ of the capacitors 44 can be prevented.

A silicon oxide film 54 is formed on the barrier film 170. The film thickness of the silicon oxide film 54 is, e.g., about 50-100 nm.

Thus, the semiconductor device according to the present embodiment is constituted.

As described above, the semiconductor device according to the present embodiment is characterized mainly in that a plurality of hydrogen/water diffusion preventing films 52, 164, 168 are laid one on another with the intermediate layers 162, 166 formed therebetween.

According to the present invention, the hydrogen/water diffusion preventing film 164 is formed above the hydrogen/water diffusion preventing film 52 with the intermediate layer 162 formed therebetween, whereby eve when cracks are formed in the hydrogen/water diffusion preventing film 52, the possibility that cracks may be formed even in the hydrogen/water diffusion preventing film 164 is very low. The possibility that pinholes formed in the hydrogen/water diffusion preventing film 52 and the pin holes formed in the hydrogen/water diffusion preventing film 164 may locate near each other is very low. Thus, according to the present embodiment, the prevention of the diffusion of the hydrogen and the water can be more ensured in comparison with that with one hydrogen/water diffusion preventing film formed above the capacitors 44. Furthermore, according to the present embodiment, the hydrogen/water diffusion preventing film 168 is formed above the hydrogen/water diffusion preventing film 164, whereby the prevention of the diffusion of the hydrogen and the water can be more ensured.

According to the present embodiment, the barrier film 170 is formed of the relatively thin hydrogen/water diffusion preventing film 52, 164, 168 are laid one on another with the intermediate layers 162, 166 formed therebetween, whereby the total film thickness of the hydrogen/water diffusion preventing films 52, 164, 168 is made relatively thick while the stress due to the barrier film 170 can be made relatively small. Thus, according to the present embodiment, the arrival of the hydrogen and the water at the capacitors 44 can be prevented without failure while the decrease of the switching charge quantity $Q_{SW}$ of the capacitors 44 can be prevented.

(The Method for Fabricating the Semiconductor Device)

Next, the method for fabricating the semiconductor device according to the present embodiment will be explained with reference to FIGS. 36 and 37. FIGS. 36 and 37 are sectional views of the semiconductor device in the steps of the method for fabricating the semiconductor device, which illustrate the method.

First, the steps up to the step of planarizing the inter-layer insulation film 50 including the interlayer insulation film 50 planarizing step are the same as those of the method for fabricating the semiconductor device explained with reference to FIGS. 5A to 12A, and their explanation will not be repeated (see FIG. 36A).

Next, thermal processing is made in a nitrogen atmosphere. The nitrogen atmosphere is, e.g., $N_2O$ plasma. The thermal processing temperature is, e.g., 300-400° C. The thermal processing temperature is, e.g., 350° C. here. The thermal processing period of time is, e.g., 2-6 minutes. The thermal processing period of time is 2 minutes here. This thermal processing is for removing water present in the inter-layer insulation film 50 while nitriding the surface of the inter-layer insulation film 50. The surface of the inter-layer insulation film 50 is nitrided, whereby the intrusion of water into the inter-layer insulation film 50 from the outside can be prevented, which leads to the prevention of the deterioration of the electrode characteristics of the capacitors 42.

Then, as illustrated in FIG. 36B, the hydrogen/water diffusion preventing film 52 is formed by, e.g., sputtering or CVD. The hydrogen/water diffusion preventing film 52 is, e.g., a 20-30 nm-thickness metal oxide film. The hydrogen/water diffusion preventing film 52 of the metal oxide film is, e.g., aluminum oxide film.

Conditions for forming the hydrogen/water diffusion preventing film 52 of aluminum oxide film by sputtering are the same as, e.g., those described above. Since the hydrogen/water diffusion preventing film 52 is formed on the planarized inter-layer insulation film 50, the hydrogen/water diffusion preventing film 52 is flat.

Then, the intermediate layer 162 is formed by, e.g., CVD. The intermediate layer 162, e.g., a 20-30 nm-thickness silicon oxide film. Conditions for forming the intermediate layer 162 are, e.g., as follows. The gas to be supplied into the film forming chamber is TEOS gas and $O_2$ gas. The flow rate of the TEOS gas is, e.g., 1.8 ml/minute. The flow rate of the $O_2$ gas is, e.g., 8 liters/minute. The pressure inside the film forming chamber is, e.g., 2.2 Torr. The film forming temperature is, e.g., 350° C. The radio-frequency electric power to be applied is, e.g., 350 W. The low-frequency electric power to be applied is, e.g., 650 W. The film forming period of time is, e.g., 3.6 seconds when the film thickness of the intermediate layer 162 is 20 nm. Since the intermediate layer 162 is formed on the planarized hydrogen/water diffusion preventing film 52, the intermediate layer 162 is flat.

Then, the hydrogen/water diffusion preventing film 164 is formed by, e.g., sputtering or CVD. The hydrogen/water diffusion preventing film 164 is, e.g., a 20-30 nm-thickness metal oxide film. The hydrogen/water diffusion preventing film 164 of a metal oxide film is, e.g., aluminum oxide film. Conditions for forming the hydrogen/water diffusion preventing film 164 are the same as, e.g., those for forming the hydrogen/water diffusion preventing film 52. Since the hydrogen/water diffusion preventing film 164 is formed on the flat intermediate layer 162, the hydrogen/water diffusion preventing film 164 is flat.

Next, the intermediate layer 166 is formed by, e.g., CVD. The intermediate layer 166, e.g., a 20-30 nm-thickness silicon oxide film. Conditions for forming the intermediate layer 166 are the same as, e.g., those for forming the intermediate layer 162. Since the intermediate layer 166 is formed on the flat hydrogen/water diffusion preventing film 164, the intermediate layer 166 is flat.

Next, the hydrogen/water diffusion preventing film 168 is formed by, e.g., sputtering or CVD. The hydrogen/water diffusion preventing film 168 is, e.g., a 20-30 nm-thickness aluminum oxide film. Conditions for forming the hydrogen/water diffusion preventing film 168 are the same as, e.g., those for forming the hydrogen/water diffusion preventing film 52. Conditions for forming the hydrogen/water diffusion preventing film 168 of aluminum oxide film by sputtering are the same as, e.g., described above.

Thus, the barrier film 170 is formed of the hydrogen/water diffusion preventing film 52, the intermediate layer 162, the hydrogen/water diffusion preventing film 164, the intermediate layer 166 and the hydrogen/water diffusion preventing film 168. Since the barrier film 170 is formed on the planarized inter-layer insulation film 50, the barrier film 170 is formed flatty.

Next, the insulation film 54 is formed on the barrier film 170.

The following steps of the method for fabricating the semiconductor device according to the present embodiment are the same as those of the method for fabricating the semiconductor device described above with reference to FIGS. 13A to 21, and their explanation will not be repeated.

Figure 37:
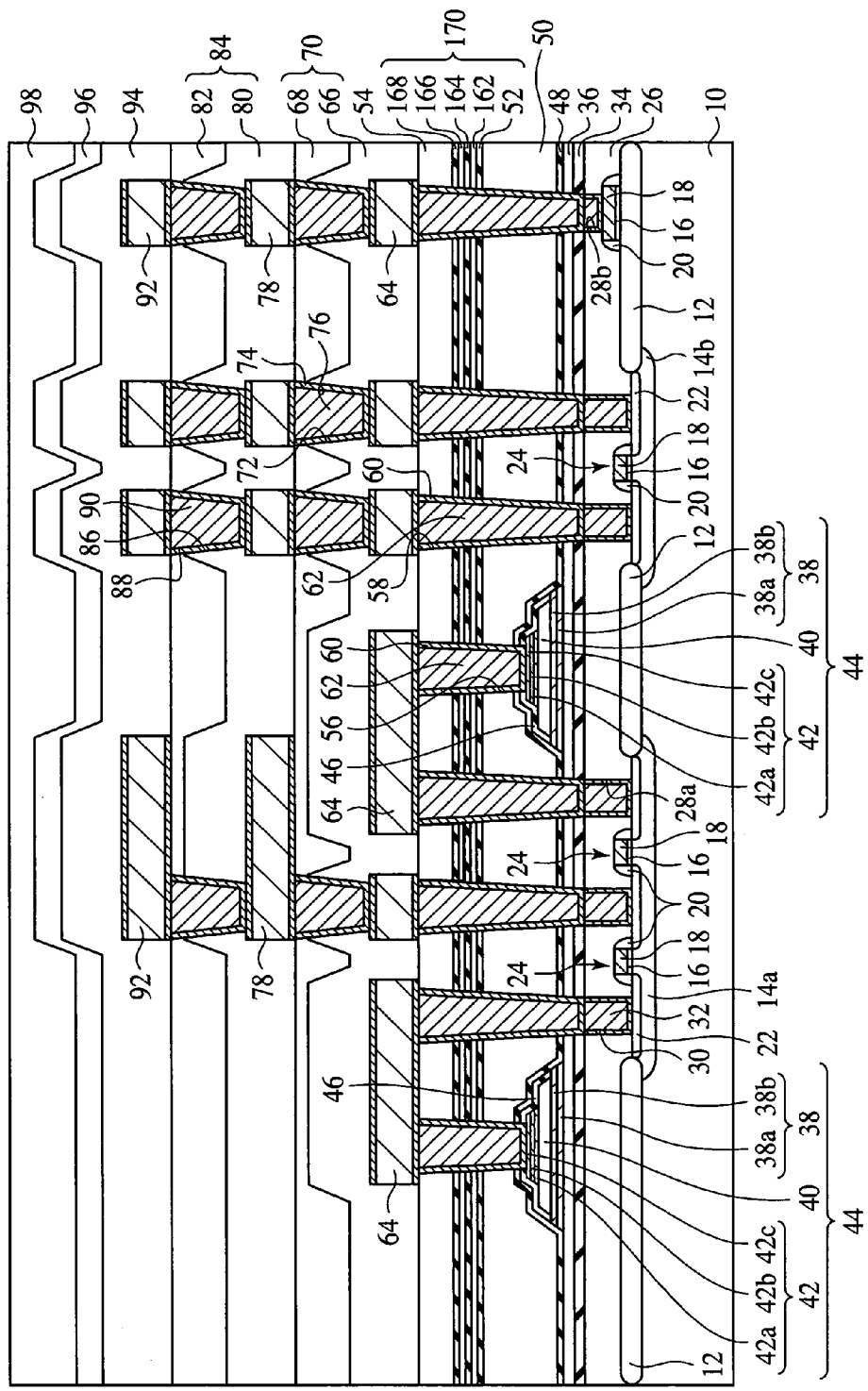
FIG. 37 is a sectional view of the semiconductor device according to the third embodiment of the present invention in the step of the method for fabricating the semiconductor device, which illustrates the method (Part 2).

Thus, the semiconductor device according to the present embodiment is fabricated (see FIG. 37).

(Modification 1)

Figure 38:
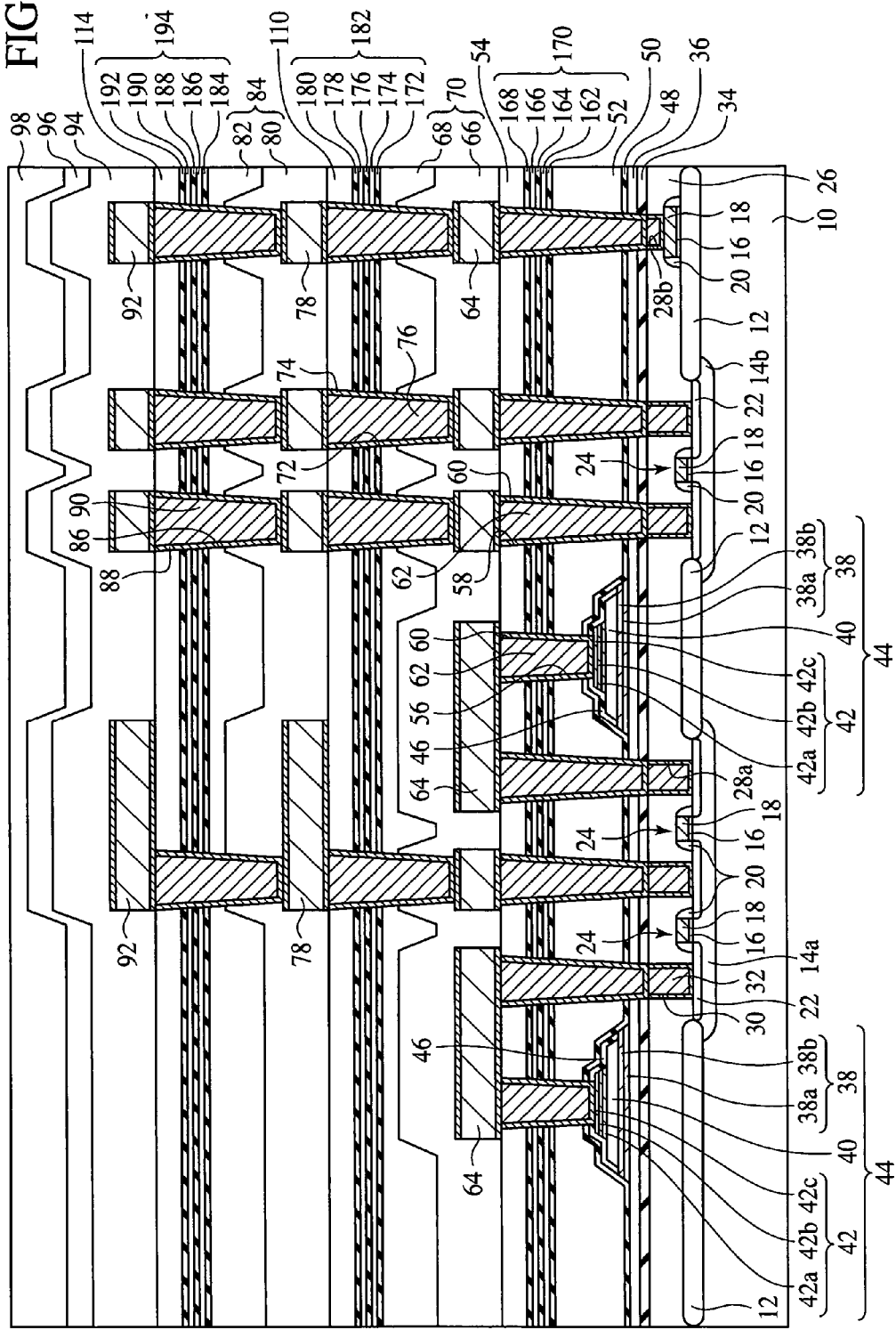
FIG. 38 is a sectional view of the semiconductor device according to Modification 1 of the third embodiment of the present invention.

Next, the semiconductor device according to one modification (Modification 1) of the present embodiment will be explained with reference to FIG. 38. FIG. 38 is a sectional view of the semiconductor device according to the present modification.

The semiconductor device according to the present modification is characterized mainly in that a barrier film 182 is further formed between a first metal interconnection layer 64 and a second metal interconnection layer 78, and a barrier film 194 is further formed between the second metal interconnection layer 78 and a third metal interconnection layer 92.

As illustrated in FIG. 38, the barrier film 182 formed of a hydrogen/water diffusion preventing film 172, an intermediate layer 174, a hydrogen/water diffusion preventing film 176, an intermediate layer 178 and a hydrogen/water diffusion preventing film 180 laid one on another is formed on the planarized inter-layer insulation film 70. The hydrogen/water diffusion preventing films 172, 176, 189 are, e.g., 20-30 nm-thickness aluminum oxide films. The intermediate layers 174, 178 are, e.g., 20-30 nm-thickness silicon oxide films. Since the barrier layer 182 is formed on the inter-layer insulation film 70 having the surface planarized, the barrier layer 182 is flat.

The hydrogen/water diffusion preventing films 172, 176, 180 are, e.g., aluminum oxide here but are not essentially formed of aluminum oxide film. The hydrogen/water diffusion preventing films 172, 176, 180 may be, e.g., other metal oxides. For example, the hydrogen/water diffusion preventing films 172, 176, 180 may be titanium oxide film or others.

The intermediate layers 174, 178 are, e.g., silicon oxide films but are not essentially silicon oxide films. For examples, the intermediate layers 174, 178 may be, e.g., silicon nitride oxide film or silicon nitride film. As described above, silicon nitride oxide film and silicon nitride film can function as the stress mitigating film and the water diffusion preventing film.

An insulation film 110 is formed on the barrier film 182. The insulation film 110 is, e.g., a 100 nm-thickness silicon oxide film.

A second metal interconnection layer 78 is formed on the insulation film 110.

The barrier film 194 of a hydrogen/water diffusion preventing film 184, an intermediate layer 186, a hydrogen/water diffusion preventing film 188, an intermediate layer 180 and a hydrogen/water diffusion preventing film 192 laid one on another is formed on the planarized inter-layer insulation film 84. The hydrogen/water diffusion preventing films 184, 188, 192 function to prevent the diffusion of the hydrogen and the water. The hydrogen/water diffusion preventing films 184, 188, 192 are, e.g., 20-30 nm-thickness aluminum oxide films. The intermediate layers 186, 190 are, e.g., 20-30 nm-thickness silicon oxide films. Since the barrier film 194 is formed on the inter-layer insulation film 84 having the surface planarized, the barrier film 194 is flat.

The hydrogen/water diffusion preventing films 184, 188, 192 are aluminum oxide films here but are not essentially aluminum oxide films. The hydrogen/water diffusion preventing films 184, 188, 192 may be, e.g., other metal oxides. For example, the hydrogen/water diffusion preventing films 184, 188, 192 may be titanium oxide film, etc.

The intermediate layers 186, 190 are silicon oxide films here but are not essentially silicon oxide films. The intermediate layers 186, 190 maybe, e.g., silicon nitride oxide film and silicon nitride film. As described above, silicon nitride oxide film and silicon nitride film can function as the stress mitigating film and the water diffusion preventing film.

An insulation film 114 is formed on the barrier film 194. The insulation film 114 is, e.g., a 100 nm-thickness silicon oxide film.

A third metal interconnection layer 92 is formed on the insulation film 114.

Thus, the semiconductor device according to the present modification is constituted.

According to the present modification, the barrier film 170 is formed between the capacitors 44 and the first metal interconnection layer 64, and further the barrier films 182, 194 are formed respectively between the first metal interconnection layer 64 and the second metal interconnection layer 78 and between the second metal interconnection layer 78 and the third metal interconnection layer 92, whereby the decrease of the switching charge quantity $Q_{SW}$ of the capacitors 44 is prevented while the arrival of the hydrogen and the water at the capacitors 44 can be surely prevented.

(Modification 2)

Figure 39:
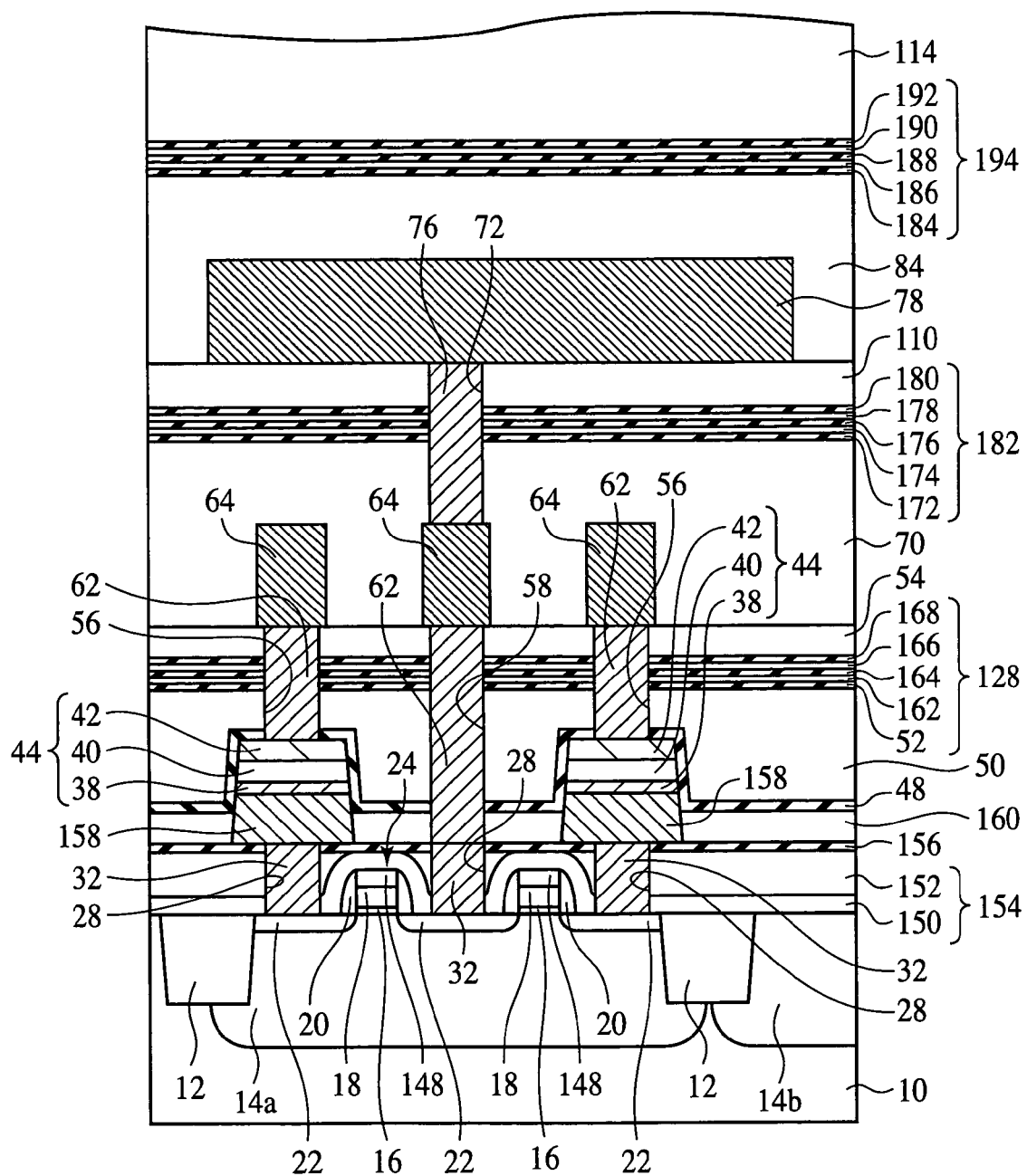
FIG. 39 is a sectional view of the semiconductor device according to Modification 2 of the third embodiment of the present invention.

Next, the semiconductor device according to one modification of the present embodiment will be explained with reference to FIG. 39. FIG. 39 is a sectional view of the semiconductor device according to the present modification.

The semiconductor device according to the present modification is characterized mainly by the stacked memory cell structure.

As illustrated in FIG. 39, the barrier film 170 of the hydrogen/water diffusion preventing film 52, the intermediate layer 162, the hydrogen/water diffusion preventing film 164, the intermediate layer 166 and the hydrogen/water diffusion preventing film 168 is formed on the planarized silicon oxide film 50.

The silicon oxide film 54 is formed on the barrier film 170.

The interconnection (the first metal interconnection layer) 64 is formed on the silicon oxide film 54.

The barrier film 182 of the hydrogen/water diffusion preventing film 172, the intermediate layer 174, the hydrogen/water diffusion preventing film 176, the intermediate layer 178 and the hydrogen/water diffusion preventing film 180 laid one on another is formed on the planarized inter-layer insulation film 70.

The silicon oxide film 110 is formed on the barrier film 182.

The interconnection (the second metal interconnection layer) 78 is formed on the silicon oxide film 110.

The barrier film 194 of the hydrogen/water diffusion preventing film 184, the intermediate layer 186, the hydrogen/water diffusion preventing film 188, the intermediate layer 190 and the hydrogen/water diffusion preventing film 192 laid one on another is formed on the planarized inter-layer insulation film 84.

The silicon oxide film 114 is formed on the barrier film 194.

The interconnection (the third interconnection layer) not illustrated is formed on the silicon oxide film 114.

As in the present modification, the memory cell structure may be of the stacked typed.

Modified Embodiments

The present invention is not limited to the above-described embodiments and can cover other various modifications.

For example, in the above-described embodiments, the ferro-electric film forming the dielectric film 40 is PZT film. However, the ferro-electric film forming the dielectric film 40 is not essentially PZT film and can be any other ferro-electric film. For example, the ferro-electric film forming the dielectric film 40 can be $Pb_{1-X}$—$La_XZr_{1-Y}Ti_YO_3$ film (PLZT film), $SrBi_2(Ta_XNb_{1-X})_2O_9$ film, $Bi_4Ti_2O_{12}$ film or others.

In the above-described embodiments, the dielectric film 40 is, e.g., ferro-electric film but is not essentially ferro-electric film. For example, when DRAM, etc. are formed, the dielectric film 40 can be a high-dielectric constant film. The high-dielectric constant film forming the dielectric film 40 can be, e.g., $(BaSr)TiO_3$ film (BST film), $SrTiO_3$ film (STO film), $Ta_2O_5$ film or others. The high-dielectric constant film is a dielectric film whose specific dielectric constant is higher than that of silicon dioxide.

In the above-described embodiments, the upper electrodes 42 are formed of the layer film of an $IrO_X$ film, an $IrO_Y$ film and a Pt film but are not formed essentially of these materials. For example, the upper electrodes 42 may be formed of SrRuO film (SRO film).

In the first embodiment, the hydrogen diffusion preventing film is aluminum oxide film but is not essentially aluminum oxide film. A film having the function of preventing the diffusion of hydrogen can be suitably used as the hydrogen diffusion preventing film. For example, a film of a metal oxide can be suitably used as the hydrogen diffusion preventing film. The hydrogen diffusion preventing film of a metal oxide can be, e.g., tantalum oxide, titanium oxide, or others. The hydrogen diffusion preventing film is not essentially a metal oxide. For example, silicon nitride film ($Si_3N_4$ film), silicon nitride oxide film (SiON film) or others can be used as the hydrogen diffusion preventing film. Films of metal oxide are so dense that even when they are formed relatively thin, they can prevent the diffusion of hydrogen without failure. From the viewpoint of the micronization, it is advantageous to use a metal oxide as the hydrogen diffusion preventing film.

In the second and the third embodiments, the hydrogen/water diffusion preventing films are aluminum oxide films but are not essentially aluminum oxide films. Films having the function of preventing the diffusion of hydrogen and water can be used as the hydrogen/water diffusion preventing films. As a film having the function of preventing the diffusion of hydrogen and water, a film of a metal oxide, for example, can be suitably used. The hydrogen/water diffusion preventing film of a metal oxide can be, e.g., titanium oxide, tantalum oxide or others. The hydrogen/water diffusion preventing film is not essentially a metal oxide and can be a film of any other material which can prevent the diffusion of hydrogen and water. However, films of metal oxide are so dense that even when they are formed relatively thin, they can prevent the diffusion of hydrogen and water without failure. From the viewpoint of the micronization, it is advantageous to use a metal oxide as the hydrogen diffusion preventing film.

What is claimed is:

1. A semiconductor device comprising:

a transistor including a gate electrode formed over a semiconductor substrate with a gate insulation film formed therebetween, and a source/drain diffused layer formed in the semiconductor substrate on both sides of the gate electrode;

a first insulation film formed over the semiconductor substrate and the transistor;

a first conductor plug buried in first contact hole formed down to the source/drain diffused layer;

a capacitor formed over the first insulation film and including a lower electrode, a dielectric film formed over the lower electrode and an upper electrode formed over the dielectric film;

a first hydrogen diffusion preventing film formed over the first insulation film, covering the capacitor, for preventing the diffusion of hydrogen;

a second insulation film formed over the first hydrogen diffusion preventing film, a surface of the second insulation film being planarized, the second insulation film being contacted with the first hydrogen diffusion preventing film;

a second hydrogen diffusion preventing film formed over an entire top surface of the second insulation film, for preventing the diffusion of hydrogen, the second hydrogen diffusion preventing film being contacted with the second insulation film;

a second conductor plug buried in a second contact hole formed down to the lower electrode or the upper electrode;

a third conductor plug buried in a third contact hole formed down to the first conductor plug; and an interconnection formed over the second hydrogen diffusion preventing film and connected to the second conductor plug or the third conductor plug.

2. A semiconductor device according to claim 1, wherein the second hydrogen diffusion preventing film is a layer film.

3. A semiconductor device according to claim 1, further comprising
a third insulation film formed over the second hydrogen diffusion preventing film and under the interconnection.

4. A semiconductor device according to claim 1, wherein the second insulation film is an inorganic film.

5. A semiconductor device according to claim 4, wherein the inorganic film is silicon oxide film.

6. A semiconductor device according to claim 1, further comprising
a third insulation film formed over the first insulation film and under the first hydrogen diffusion preventing film.

7. A semiconductor device according to claim 1, which further comprises
a TiN film formed directly on the upper electrode or the lower electrode in the second contact holes, and in which the second conductor plug is buried in the second contact hole with the TiN film formed in.

8. A semiconductor device according to claim 7, wherein the second conductor plug is formed of tungsten.

9. A semiconductor device according to claim 1, further comprising:
a third insulation film formed over the second insulation film and the interconnection, a surface of the third insulation film being planarized;
a third hydrogen diffusion preventing film formed over the third insulation film, for preventing the diffusion of hydrogen; and
another interconnection formed over the third hydrogen diffusion preventing film.

10. A semiconductor device according to claim 1, wherein the second hydrogen diffusion preventing film includes a metal oxide film.

11. A semiconductor device according to claim 10, wherein the metal oxide film is aluminum oxide film, titanium oxide film or tantalum oxide film.

12. A semiconductor device according to claim 1, wherein the second hydrogen diffusion preventing film includes a silicon nitride film or silicon nitride oxide film.

13. A semiconductor device according to claim 1, wherein the dielectric film is a ferro-electric film or a high-dielectric constant film.

14. A semiconductor device according to claim 13, wherein the ferro-electric dielectric is $PbZr_{1-x}Ti_xO_3$ film, $Pb_{1-x}La_xZr_{1-y}Ti_yO_3$ film, $SrBi_2(Ta_xNb_{1-x})_2O_9$ film or $Bi_4Ti_2O_{12}$ film.

15. A semiconductor device according to claim 13, wherein the high-dielectric constant film is $(BaSr)TiO_3$ film, $SrTiO_3$ film or $Ta_2O_5$ film.

16. A semiconductor device according to claim 1, wherein a film stress of the second hydrogen diffusion preventing film is $5\times10^8$ dyn/cm$^2$ or below.

17. A method for fabricating a semiconductor device comprising the steps of:

forming a gate electrode over a semiconductor device with a gate insulation film therebetween;

forming a source/drain diffused layer in the semiconductor substrate on both sides of the gate electrode;

forming a first insulation film over the semiconductor substrate, the gate electrode and the source/drain diffused layer;

forming first contact hole in the first insulation film down to the source/drain diffused layer;

burying first conductor plug in the first contact hole;

forming over the first insulation film a capacitor including a lower electrode, a dielectric film formed over the lower electrode and an upper electrode formed over the dielectric film;

forming a first hydrogen diffusion preventing film for preventing the diffusion of hydrogen over the first insulation film and the capacitor;

forming a second insulation film over the first hydrogen diffusion preventing film, the second insulation film being contacted with the first hydrogen diffusion preventing film;

polishing a surface of the second insulation film to planarize the surface of the second insulation film;

forming a second hydrogen diffusion preventing film for preventing the diffusion of hydrogen over an entire top surface of the second insulation film, the second hydrogen diffusion preventing film being contacted with the second insulation film;

forming second contact hole in the first hydrogen diffusion preventing film, the second insulation film and the second hydrogen diffusion preventing film down to the lower electrode or the upper electrode;

forming third contact hole in the first hydrogen diffusion preventing film, the second insulation film and the second hydrogen diffusion preventing film down to the first conductor plug;

burying second conductor plug in the second contact hole and third conductor plug in the third contact hole;

forming an interconnection over the second hydrogen diffusion preventing film in contact with the second conductor plug or the third conductor plug, without etching the second hydrogen diffusion preventing film; and forming a third insulation film over the second hydrogen diffusion preventing film and the interconnection.

18. A method for fabricating a semiconductor device according to claim 17, further comprising, after the step of forming the second insulation film and before the step of forming the second hydrogen diffusion preventing film,
a step of performing thermal processing.

19. A method for fabricating a semiconductor device according to claim 18, wherein in the step of performing thermal processing, the thermal processing is performed in a plasma atmosphere generated by using at least N$_2$O gas.

20. A method for fabricating a semiconductor device according to claim 18, further comprising, after the step of performing thermal processing and before the step of forming the second hydrogen diffusion preventing film, a step of exposing the second insulation film to the plasma atmosphere generated by using at least N$_2$O gas.

21. A method for fabricating a semiconductor device according to claim 17, further comprising, after the step of burying first conductor plug and before the step of forming the capacitor, a step of forming a third insulation film over the first insulation film and the first conductor plug.

22. A method for fabricating a semiconductor device according to claim 21, wherein the third insulation film is a silicon nitride film or a silicon nitride oxide film.

23. A method for fabricating a semiconductor device according to claim 17, further comprising, after the step of forming the second hydrogen diffusion preventing film and before the step of forming the interconnection, a step of forming a third insulation film on the second hydrogen diffusion preventing film.

24. A method for fabricating a semiconductor device according to claim 17, further comprising, after the step of forming second contact holes and before the step of forming third contact holes, a step of thermally processing the capacitor in an atmosphere containing oxygen or ozone.

* * * * *

UNITED STATES PATENT AND TRADEMARK OFFICE
CERTIFICATE OF CORRECTION

| | | |
|---|---|---|
| PATENT NO. | : 7,598,557 B2 | Page 1 of 1 |
| APPLICATION NO. | : 11/051643 | |
| DATED | : October 6, 2009 | |
| INVENTOR(S) | : Nagai et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 340 days.

Signed and Sealed this
Third Day of May, 2011

David J. Kappos
*Director of the United States Patent and Trademark Office*